US006689257B2

(12) United States Patent
Mishima et al.

(10) Patent No.: US 6,689,257 B2
(45) Date of Patent: Feb. 10, 2004

(54) SUBSTRATE PROCESSING APPARATUS AND SUBSTRATE PLATING APPARATUS

(75) Inventors: Koji Mishima, Fujisawa (JP); Junji Kunisawa, Yamato (JP); Natsuki Makino, Fujisawa (JP); Norio Kimura, Fujisawa (JP); Hiroaki Inoue, Machida (JP); Kenji Nakamura, Fujisawa (JP); Moriji Matsumoto, Fujisawa (JP); Takahiro Nanjo, Yokohama (JP); Mitsuko Odagaki, Yokohama (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/864,210

(22) Filed: May 25, 2001

(65) Prior Publication Data
US 2002/0000371 A1 Jan. 3, 2002

(30) Foreign Application Priority Data

May 26, 2000 (JP) .................................... 2000-156691
Jun. 2, 2000 (JP) .................................... 2000-166577
Jun. 7, 2000 (JP) .................................... 2000-170076

(51) Int. Cl.[7] ............................ C25D 17/00; B05C 3/00
(52) U.S. Cl. .................................. 204/224 R; 118/400
(58) Field of Search ............................ 204/224 R, 198, 204/269; 118/400

(56) References Cited

U.S. PATENT DOCUMENTS

| 5,425,611 | A | * | 6/1995 | Hughes et al. ............... 414/217 |
| 6,176,992 | B1 | | 1/2001 | Talieh .......................... 205/87 |
| 6,179,982 | B1 | | 1/2001 | Ting et al. ..................... 205/80 |
| 6,187,152 | B1 | * | 2/2001 | Ting et al. ............. 204/224 R |
| 6,267,853 | B1 | * | 7/2001 | Dordi et al. ................. 204/232 |
| 6,294,059 | B1 | * | 9/2001 | Hongo et al. ............... 204/198 |
| 6,303,010 | B1 | * | 10/2001 | Woodruff et al. ...... 204/297.01 |
| 6,416,647 | B1 | | 7/2002 | Dordi et al. ................. 205/137 |
| 6,495,004 | B1 | * | 12/2002 | Kuriyama et al. .......... 204/198 |

* cited by examiner

Primary Examiner—Patrick Ryan
Assistant Examiner—Thomas H. Parsons
(74) Attorney, Agent, or Firm—Wenderoth, Lind & Ponack L.L.P.

(57) ABSTRACT

A substrate processing apparatus fills a metal such as copper or the like in fine interconnection patterns or trenches defined in a semiconductor substrate. The substrate processing apparatus has a loading/unloading unit for placing a substrate cassette to allow a substrate to be loaded and unloaded, a substrate treating unit for treating a substrate, and a transfer robot for transferring a substrate between the loading/unloading unit and the substrate treating unit. The loading/unloading unit, the substrate treating unit, and the transfer robot are installed in a single facility. The loading/unloading unit has a rotary table which is horizontally rotatable for positioning the substrate cassette in a position to detect the substrate cassette placed in the loading/unloading unit and to remove the substrate from the substrate cassette with the transfer robot.

12 Claims, 41 Drawing Sheets

F/G.6

F I G. 7
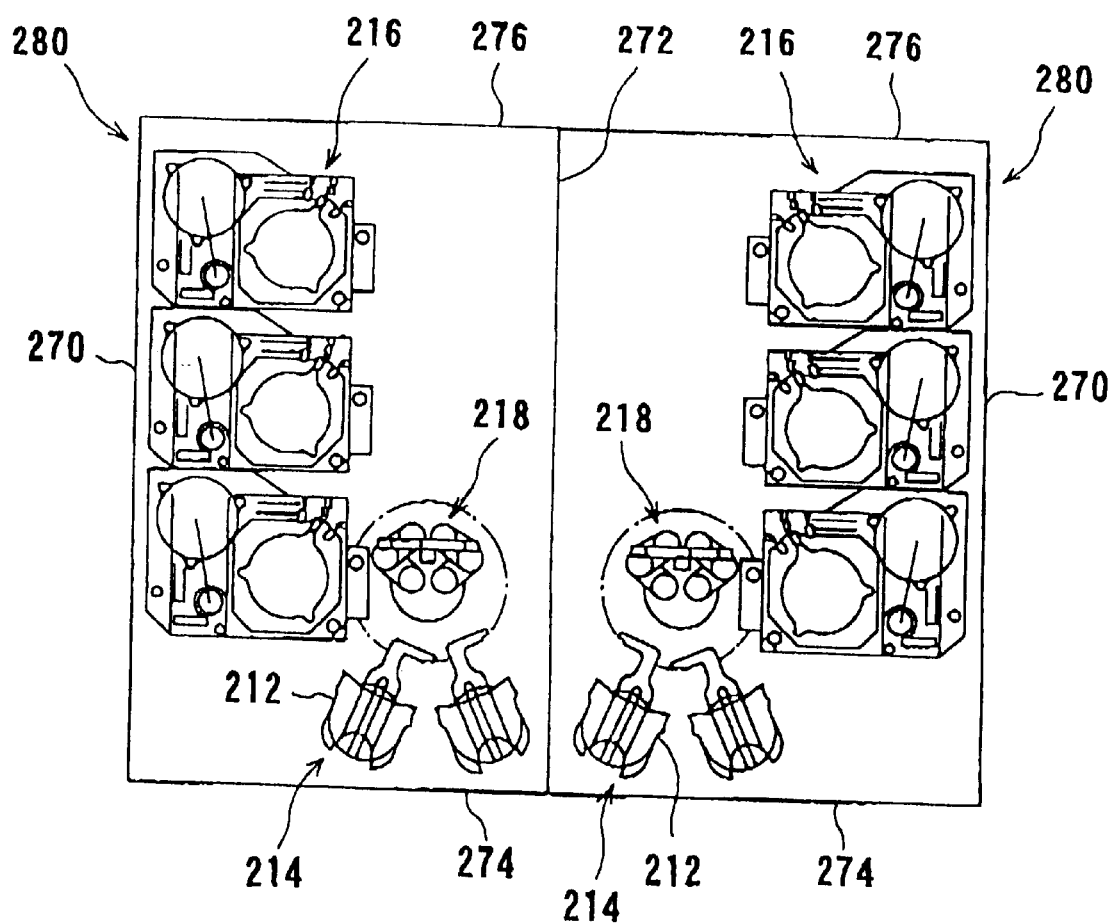

F I G. 14
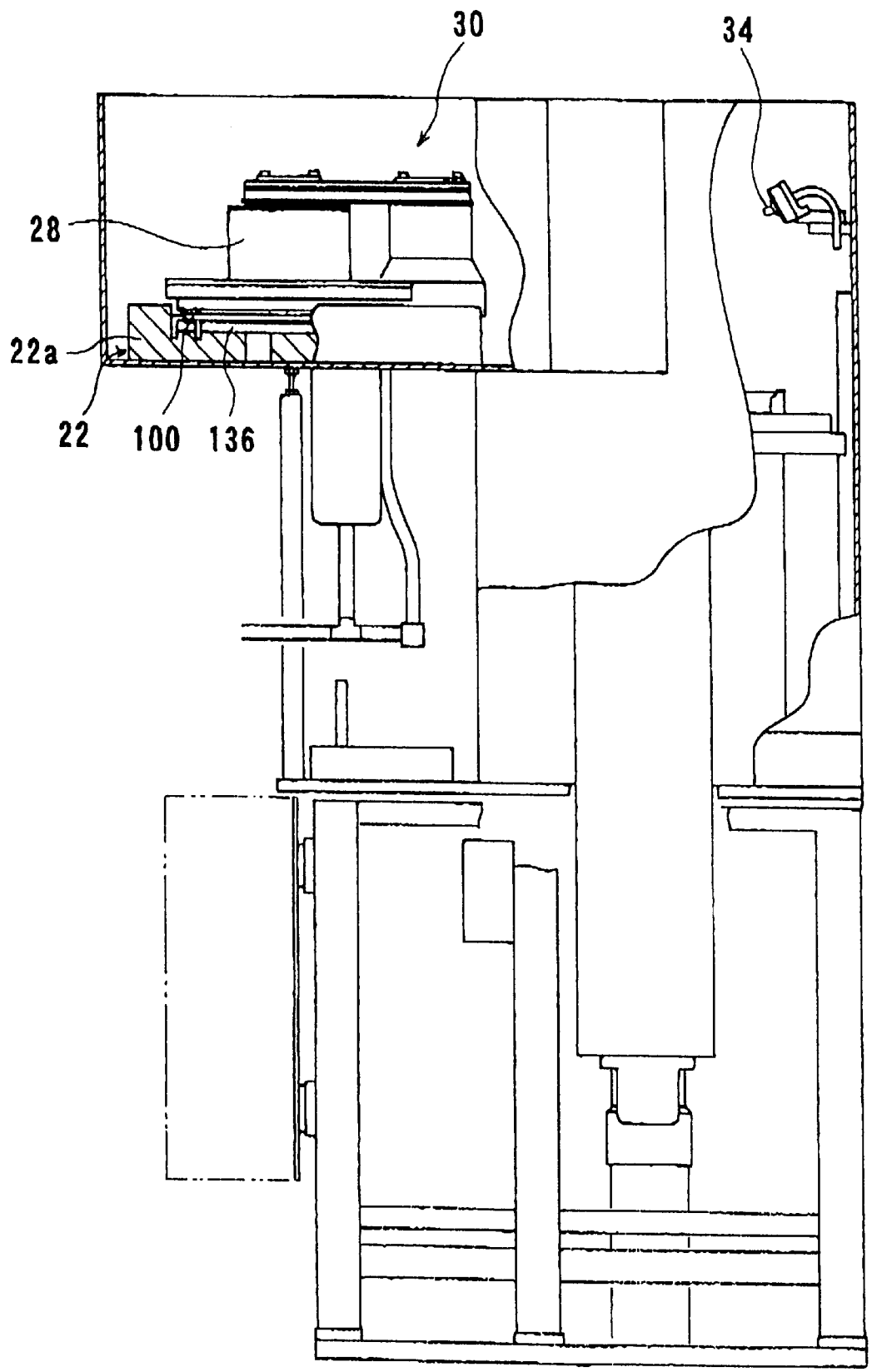

F I G. 17
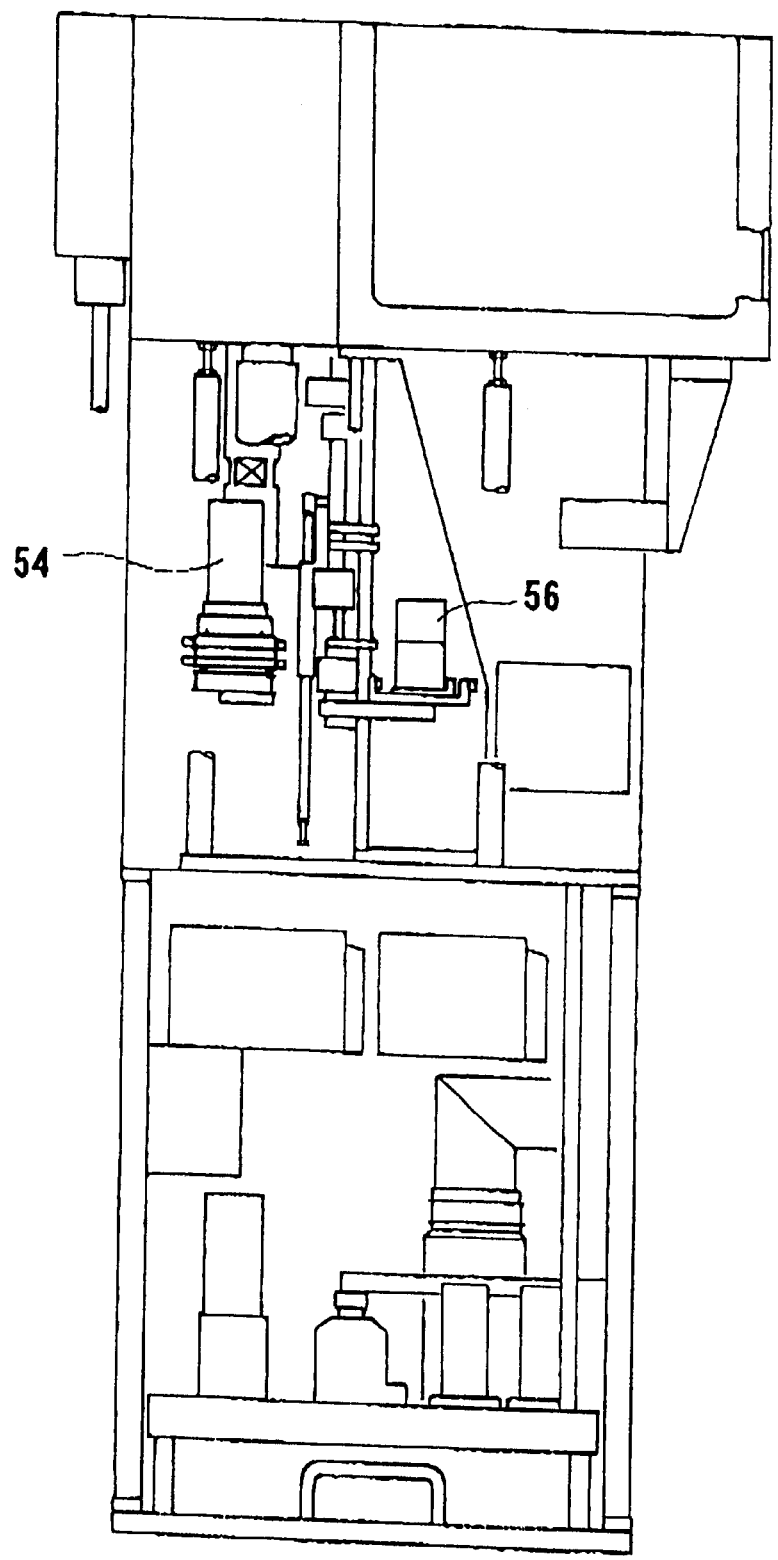

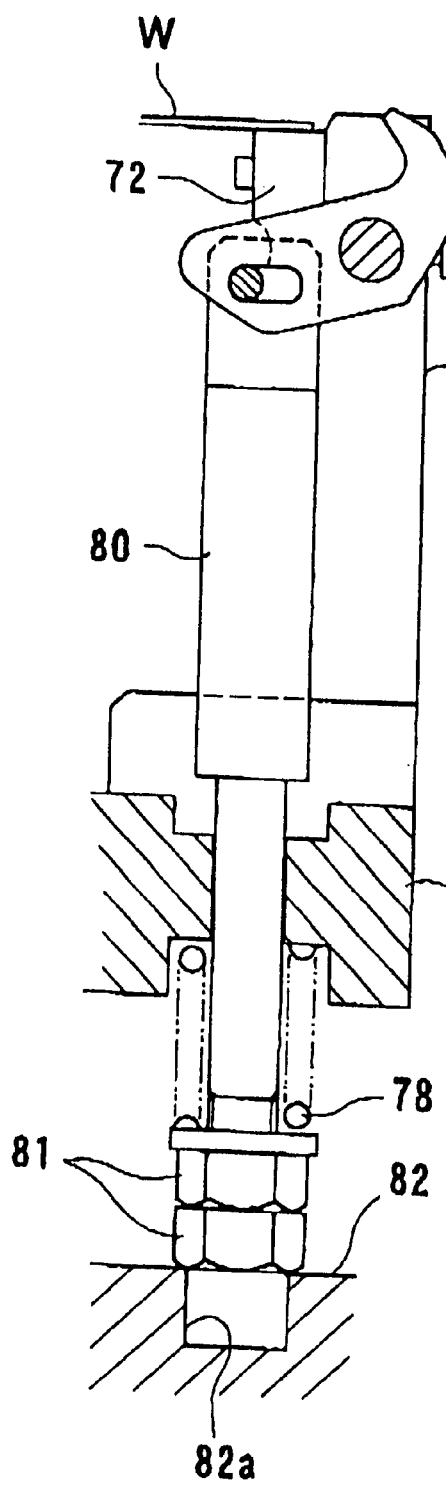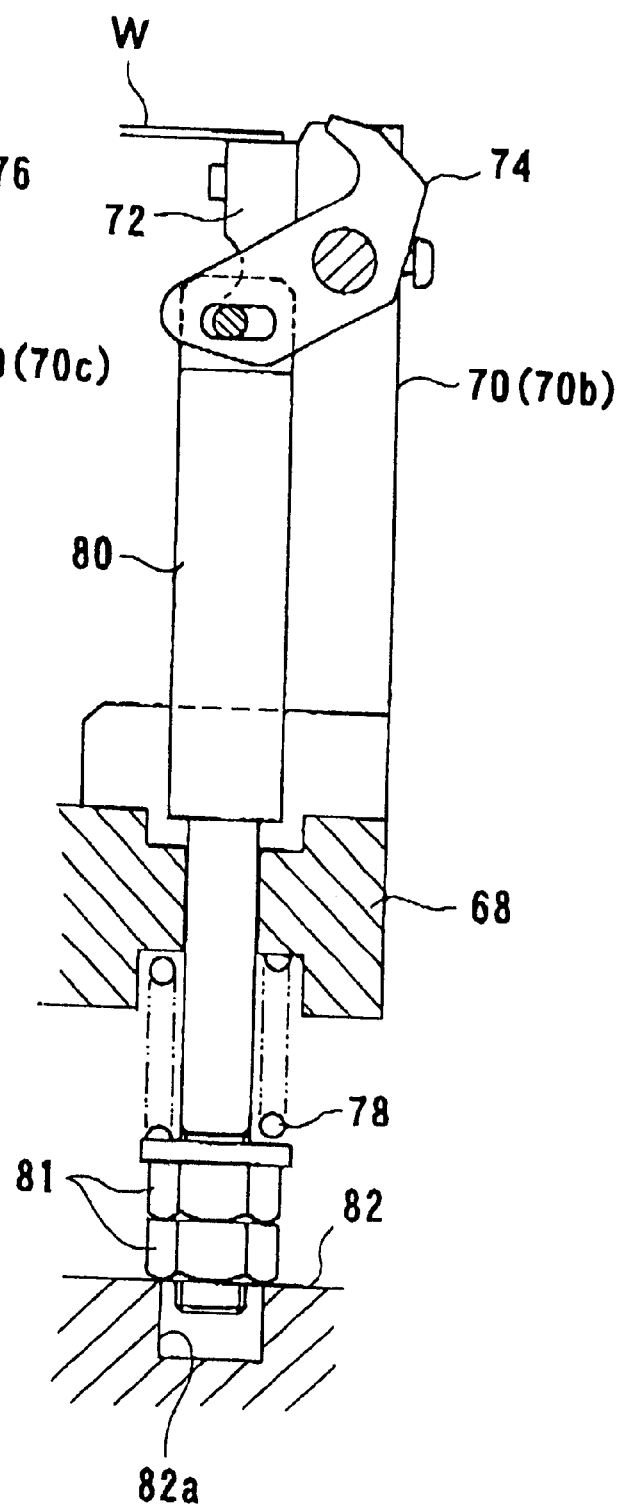

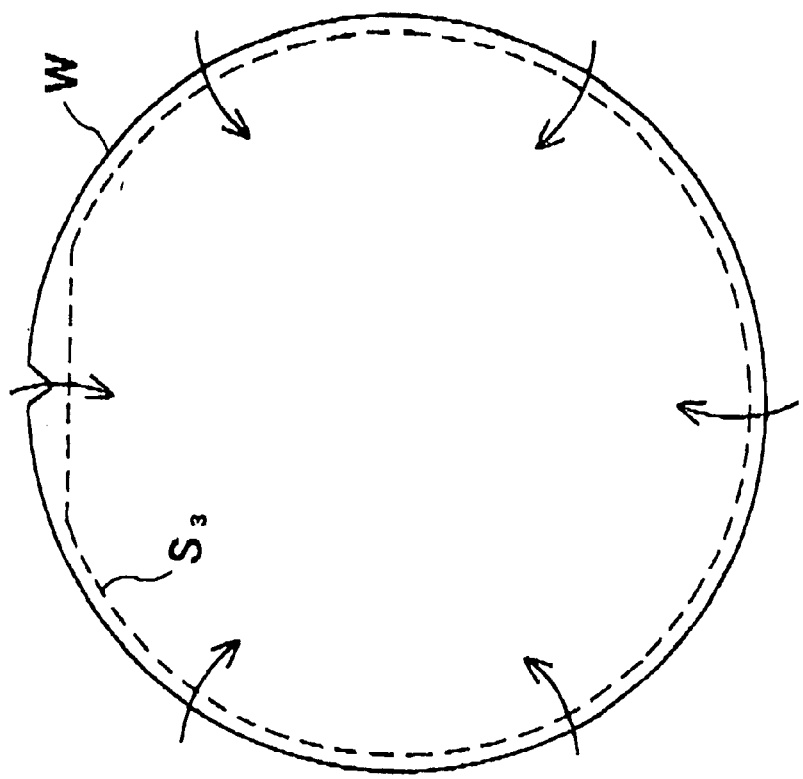
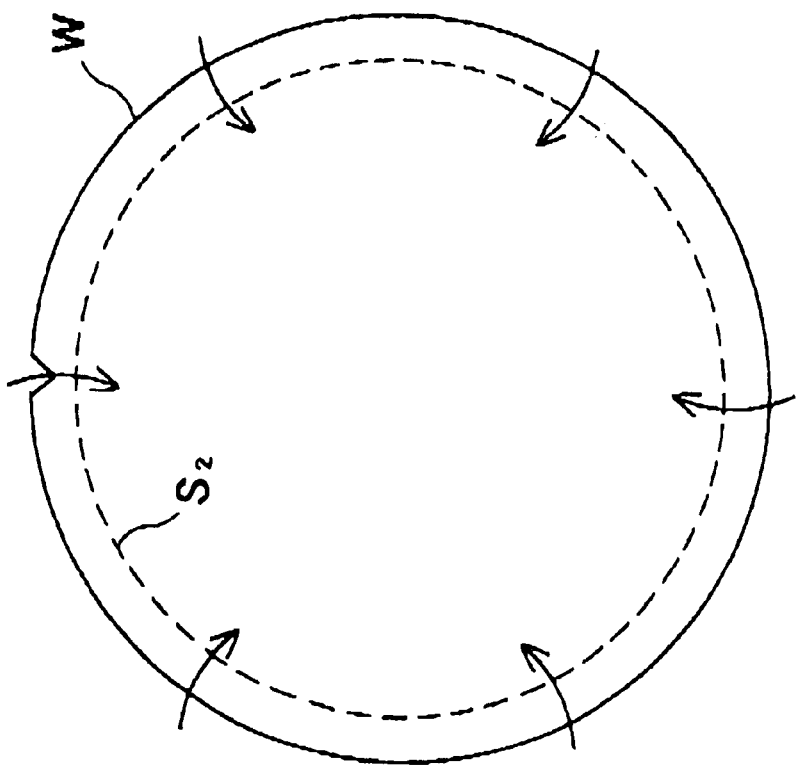

F I G. 3 8

SETTING EXAMPLES OF STEPS

| PROCESS STEPS | USING ALL STEPS | USING STEPS FOR ONE PLATING | FUNCTION AS CLEANING MACHINE |
|---|---|---|---|
| PRECOAT | USE | USE | NON-USE |
| PRECOAT DRY | USE | USE | NON-USE |
| LIQUID SUPPLY | USE | USE | NON-USE |
| PLATING | USE | USE | NON-USE |
| LIQUID RETRIEVE | USE | USE | NON-USE |
| RINSE | USE | USE | NON-USE |
| WATER CLEANING | USE | USE | USE |
| DRY | USE | USE | USE |
| CARRIER COAT | USE | NON-USE | NON-USE |
| CARRIER COAT DRY | USE | NON-USE | NON-USE |
| PRECOAT | USE | NON-USE | NON-USE |
| PRECOAT DRY | USE | NON-USE | NON-USE |
| LIQUID SUPPLY | USE | NON-USE | NON-USE |
| PLATING | USE | NON-USE | NON-USE |
| LIQUID RETRIEVE | USE | NON-USE | NON-USE |
| RINSE | USE | NON-USE | NON-USE |
| WATER CLEANING | USE | NON-USE | NON-USE |
| DRY | USE | NON-USE | NON-USE |

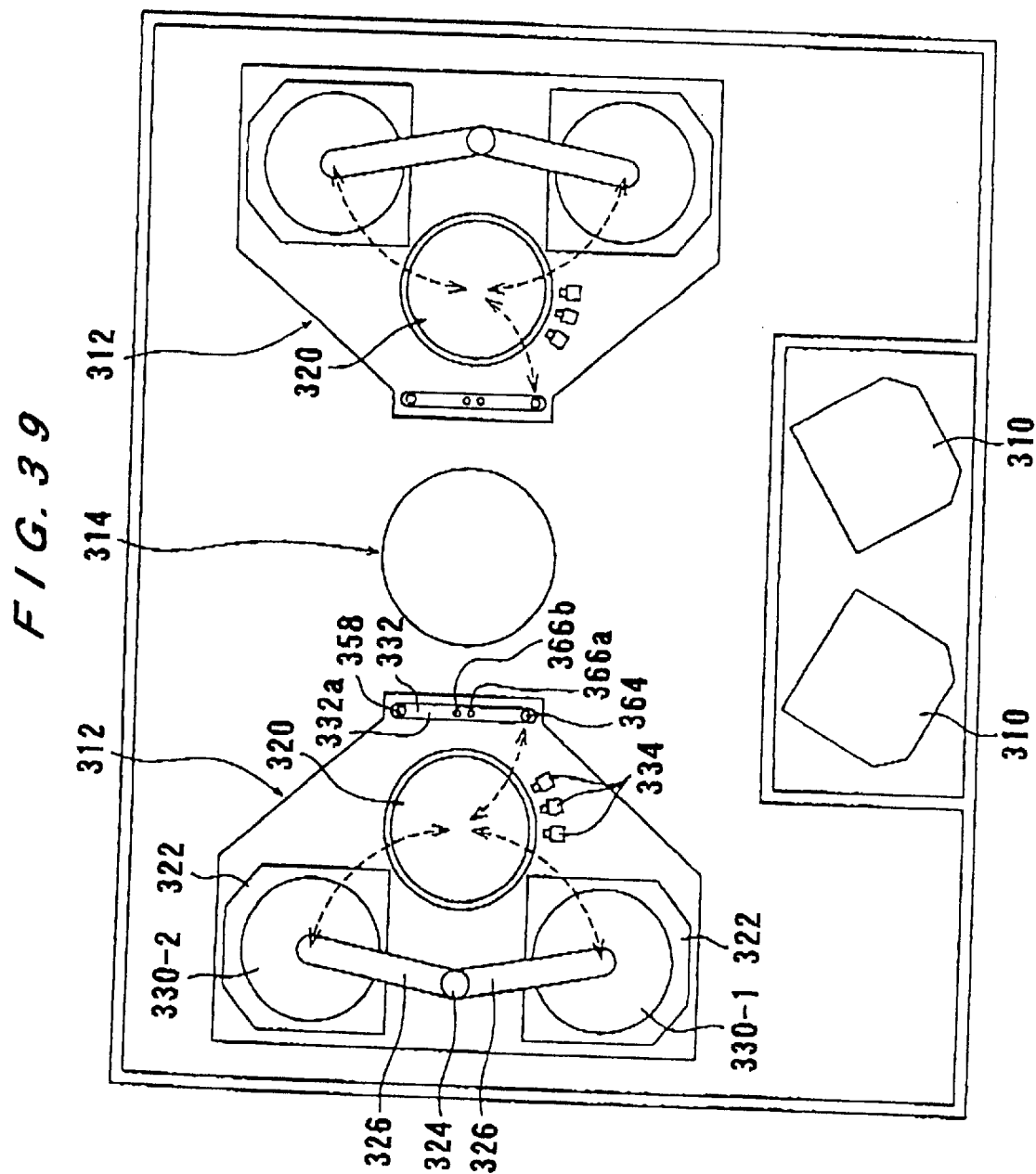

SUBSTRATE PROCESSING APPARATUS AND SUBSTRATE PLATING APPARATUS

BACKGROUND OF THE INVENTION

1. Field of the Invention

The present invention relates to a substrate processing apparatus and a substrate plating apparatus, and more particularly to a substrate processing apparatus and a substrate plating apparatus for filling a metal such as copper (Cu) or the like in fine interconnection patterns (trenches) on a semiconductor substrate, and a substrate processing apparatus for electrolyzing a surface of a substrate in a plurality of stages.

2. Description of the Related Art

Aluminum or aluminum alloy has generally been used as a material for forming interconnection circuits on semiconductor substrates. As the integrated density has increased in recent years, there is a demand for the usage of a material having a higher conductivity as an interconnection material. It has been proposed to plate a substrate having interconnection pattern trenches thereon to fill the trenches with copper or its alloy.

Various processes are known, including CVD (chemical vapor deposition), sputtering, etc. for filling interconnection pattern trenches with copper or its alloy. However, the CVD process is costly for forming copper interconnections, and the sputtering process fails to embed copper or its alloy in interconnection pattern trenches when the interconnection pattern trenches have a high aspect ratio, i.e., a high ratio of depth to width. The plating process is most effective to deposit a metal layer of copper or its alloy on a substrate to form copper interconnections thereon.

Various processes are available for plating semiconductor substrates with copper. They include a process of immersing a substrate in a plating liquid held at all times in a plating tank, referred to as a cup-type or dipping-type process, a process of holding a plating liquid in a plating tank only when a substrate to be plated is supplied to the plating tank, an electrolytic plating process of plating a substrate with a potential difference, and an electroless plating process for plating a substrate with no potential difference.

Conventional plating apparatuses for plating substrates with copper have a loading/unloading unit for placing a substrate cassette to load and unload substrates, various units for plating, for performing its supplementary process, and for cleaning and drying a plated substrate, and a transfer robot for delivering substrates between the loading/unloading unit and the various units. The loading/unloading unit, the various units, and the transfer robot are disposed in a horizontal plane. A substrate is taken out of a substrate cassette placed in the loading/unloading unit, delivered between the units, processed by the units, and thereafter returned to the substrate cassette in the loading/unloading unit.

With the conventional plating apparatus, however, various structural limitations imposed by paths to transfer substrates and paths of the transfer robot make it difficult to achieve an efficient layout of the loading/unloading unit, the transfer robot, and the various units within one facility. Another problem is that the conventional plating apparatuses suffer some maintenance problems. These drawbacks are also found in other substrate processing apparatuses, such as a polishing apparatus for chemically and mechanically polishing (CMP) substrate surfaces and the like.

Furthermore, the conventional plating apparatuses have separate units for plating, pretreating, and otherwise treating substrates, and substrates are delivered to and processed by these separate units. Therefore, the plating apparatus is considerably complex in structure and difficult to control, takes up a large installation area, and is manufactured at a high cost.

When LSI circuit interconnections are formed by an electrolytic plating process, they have a microscopic structure having interconnection widths and contact hole diameters in a range smaller than 0.15 $\mu$m and an aspect ratio (ratio of depth to width) of 6 or more. For embedding interconnection trenches according to copper sulfate plating alone to form such a microscopic structure, it is necessary to finely control additives and energizing conditions in the plating process. Due to variations in formed seed layers, voids tend to be formed in bottoms and side walls of interconnections and seams are liable to be formed in central regions of interconnections, making those interconnections defective.

For embedding fine interconnections fully in corresponding trenches, it is necessary to meet both requirements for improved bottom coverage and side coverage by increasing the uniform electrodeposition capability of a plating process, and for an increased bottom-up filling capability to preferential embedding from interconnection bottoms.

One proposal for achieving both a uniform electrodeposition capability and a bottom-up filling capability is an electrolytic plating process that is carried out in two stages. According to such an electrolytic plating process, for example, a substrate is plated in a first stage according to a process of a high uniform electrodeposition capability using a complex bath for increased coverage, and then interconnection trenches in the substrate are embedded using a copper sulfate bath to which an additive to increase the bottom-up filling capability is added. The plating apparatus that is used in this process comprises two cup-type or dipping-type plating cells connected in series with each other.

As another process of embedding fine interconnections fully in corresponding trenches, there has been proposed a plating process that is performed in two stages, i.e., an electroless plating stage and an electrolytic plating stage. According to such a proposed plating process, an auxiliary reinforcing seed layer is formed on a seed layer that has been formed by sputtering, for example, according to an electroless plating process, thus well preparing the overall seed layer including the auxiliary seed layer for a subsequent process. Then the seed layer is plated according to an electrolytic plating process to embed fine interconnections reliably in corresponding trenches.

The two-stage electrolytic plating process or the plating process performed in an electroless plating stage and an electrolytic plating stage, as described above, needs to have a plurality of plating apparatuses, each having a loading/unloading unit, a plating unit, processing units, and a transfer robot, which are arranged in juxtaposed relation to each other. Since these plating apparatuses occupy a large installation space in a clean room, the clean room needs to be large in size. Those plating apparatuses are responsible for an increase in the cost of the overall system. In addition, it is complex and time-consuming to deliver substrates between the plating apparatus.

Furthermore, when an electrolytic plating process is carried out on a substrate while a surface to be plated of the substrate is facing downwardly, and an electroless plating process is carried out on a substrate while a surface to be plated of the substrate is facing upwardly, a substrate reversing machine is required between the two plating apparatuses. The required substrate reversing machine poses an obstacle to attempts to make the overall system more compact and less costly.

After a substrate has been processed by one of the plating apparatuses, the substrate is dried and placed in a wafer cassette, and then delivered to the other plating apparatus. During these subsequent steps, the plated surface of the substrate may possibly be contaminated, tending to cause a plating failure such as an embedding failure or an abnormal precipitation of plated metal in the next plating process. In the drying step, the plated surface of the substrate may possibly be oxidized.

SUMMARY OF THE INVENTION

It is a first object of the present invention to provide a substrate processing apparatus which has a loading/unloading unit, a transfer robot, and various units that can efficiently be placed in one facility, and which has an excellent maintenance capability.

A second object of the present invention is to provide a substrate plating apparatus which has a single unit of reduced size and improved controllability for plating and performing its supplementary process, and which has an excellent maintenance capability.

A third object of the present invention is to provide a substrate processing apparatus which is compact and low in cost, allows a smooth transition from one substrate processing process to another substrate processing process to be performed in a short period of time, and can provide a stable substrate processing process.

To achieve the first object of the present invention, there is provided an apparatus for processing a substrate, comprising a loading/unloading unit for placing a substrate cassette to load and unload a substrate, a substrate treating unit for treating a substrate, and a transfer robot for transferring a substrate between the loading/unloading unit and the substrate treating unit, the loading/unloading unit, the substrate treating unit. The transfer robot is installed in a single facility, and the loading/unloading unit has a rotary table which is horizontally rotatable for positioning the substrate cassette in a position to detect the substrate cassette placed in the loading/unloading unit and to remove the substrate from the substrate cassette easily with the transfer robot.

The above arrangement reduces limitations on the supply of a substrate cassette to the loading/unloading unit and the removal of substrates from the substrate cassette in the loading/unloading unit with the transfer robot, allowing the loading/unloading unit and the transfer robot to be positioned for efficient operation.

The loading/unloading unit may include two loading/unloading units positioned parallel to each other, each of the loading/unloading units having a rotary table horizontally rotatable for removing the substrate from the substrate cassette in either one of the two loading/unloading units with the transfer robot. The single transfer robot is capable of efficiently removing a substrate from a desired one of the substrate cassettes easily in the two loading/unloading units.

According to the present invention, there is also provided an apparatus for processing a substrate, comprising a loading/unloading unit for placing a substrate cassette to load and unload a substrate, a substrate treating unit for treating a substrate, and a transfer robot for transferring a substrate between the loading/unloading unit and the substrate treating unit. The loading/unloading unit, the substrate treating unit, and the transfer robot are installed in a single facility, and the substrate treating unit includes a plurality of substrate treating units disposed parallel to each other in facing relation to a side wall of the facility. When the side wall of the facility facing the substrate treating units is opened, the maintenance of the substrate treating units can easily be performed.

According to the present invention, there is also provided an apparatus for processing a substrate, comprising two substrate processing facilities each having a loading/unloading unit for placing a substrate cassette to load and unload a substrate, a substrate treating unit for treating a substrate, and a transfer robot for transferring a substrate between the loading/unloading unit and the substrate treating unit. Each of the substrate processing facilities includes a plurality of substrate treating units disposed parallel to each other in facing relation to a side wall of the substrate processing facility, and the substrate processing facilities are disposed back to back at side walls opposite to the side wall. Therefore, with the substrate treating units having good maintainability, the two substrate processing facilities can be placed closely together with no space therebetween so as to save, space. In addition, a single plating process managing device can be shared by the two substrate processing facilities.

Each of the substrate treating units may comprise a unit having a substrate treating device and a plating liquid tray, for plating the substrate.

To achieve the second object of the present invention, there is provided an apparatus for plating a substrate, comprising a substrate holder for holding a substrate with a surface to be plated thereof being oriented upwardly, an anode disposed upwardly of and closely facing the substrate held by the substrate holder, and a sealing member for sealing a space defined between the substrate and the anode and filled with a plating liquid to electrolytically plate the substrate. The substrate holder has a rotatable substrate stage and a plurality of support arms vertically disposed on a peripheral edge of the substrate stage. The support arms include a support arm positioned opposite to a support arm which faces a notch or an orientation flat of the substrate when the substrate is supported by the support arms, and a pressing finger presses the substrate inwardly.

With the above arrangement, with the substrate being gripped and held by the fixing fingers while the notched portion of the substrate is being pressed against one of the support arms, the substrate is shifted from the center of the substrate holder to an off-center position toward the notch or orientation flat in the substrate by a distance corresponding to the clearance (normally about 0.4 mm with respect to the outside diameter of the substrate) between the substrate and the substrate holder. Thus, the plating area (effective area) of the substrate that can be plated can be increased without the need for complex sealing shapes and mechanisms.

The support arms may include support arms other than the support arm having the pressing finger. Each of the other arms has a fixing finger rotatably mounted for gripping a peripheral edge of the substrate.

Each of the pressing finger and the fixing fingers may have an urging member for urging the finger in a closing direction and a vertically movable opening pin for turning the finger in an 25 opening direction against the bias of the urging member, and the opening pins are vertically movable in response to vertical movement of an opening member.

The apparatus further comprises an adjusting mechanism disposed between the opening pins and the opening member, for adjusting the timing of the operation of the opening pins. When the substrate is to be held, the timing of the operation of the pressing finger may be made earlier than the timing of the operation of the fixing fingers, so that the substrate is gripped by the fixing fingers after it has been displaced to an off-center position. The substrate is thus prevented from being subjected to undue rubbing engagement.

The adjusting mechanism may comprise a larger-diameter member positionally adjustably mounted on a lower end of the opening pin, and a recess may be defined in the opening member at a position confronting the opening pin. The recess has an inside diameter greater than the outside diameter of the opening pin and smaller than the outside diameter of the larger-diameter member. The opening pin may have an externally threaded lower end with a nut threaded thereover as the larger-diameter member, and the tightened position of the nut may be adjusted to adjust the timing of the operation. With two nuts used, they remain firmly tightened against loosening.

According to the present invention, there is also provided an apparatus for plating a substrate, comprising a substrate holder for holding a substrate with a surface to be plated thereof oriented upwardly, an anode disposed above and closely facing the substrate held by the substrate holder, and a ring-shaped sealing member for sealing a space defined between the substrate and the anode and filled with a plating liquid to electrolytically plate the substrate. The sealing member includes an inward extension extending radially inwardly and having a thickness decreasing gradually in a radially inward direction, and a downwardly depending member contiguous to the inward extension and bent downwardly therefrom.

Since the sealing member may be capable of withstanding a head pressure of several mm $H_2O$, the sealing member may be of a reduced thickness of about 0.5 mm. The sealing member thus shaped allows the substrate to have an increased plating area (effective area) without impairing its sealing capability.

A plurality of divided cathode electrodes having a plurality of protrusions projecting inwardly may be mounted on a lower surface of the sealing member. Each of the protrusions are positioned outwardly of the downwardly depending member, bent downwardly at a substantially right angle along the downwardly depending member, and have a round lower end. When the lower ends of the protrusions of the cathode electrodes are brought vertically into contact with the surface of the substrate, particles are prevented from being produced by rubbing contact. The round lower ends of the protrusions reduce the contact resistance between them and the substrate if the sealing member and the cathode electrodes are integrally mounted on a support member, then they can easily be replaced when deteriorated.

According to the present invention, there is also provided an apparatus for plating a substrate, comprising a substrate holder for holding a substrate with a surface to be plated thereof oriented upwardly, an anode disposed above and closely facing the substrate held by the substrate holder, a sealing member for sealing a space defined between the substrate and the anode and filled with a plating liquid to electrolytically plate the substrate, a movable electrode head for holding the anode, and a positionally adjustable stopper having a stopper surface for abutment against a peripheral edge of the substrate for positioning the anode and the substrate relative to each other.

When teaching the substrate plating apparatus, a fixing stopper is vertically adjusted in order to make the anode parallel to the substrate when the electrode head abuts against the stopper surface of the fixing stopper. In this manner, the accuracy with which to position the electrode head repeatedly is increased, and a different electrode head used to replace the old electrode head can quickly be adjusted in position for making the current density on the substrate uniform.

The apparatus may further comprise a plurality of stopper rods extending vertically and disposed around the substrate holder. The stopper has a plurality of bolts threaded in respective nuts fixed to the stopper rods, and the bolts have upper surfaces serving as the stopper surface.

According to the present invention, there is also provided an apparatus for plating a substrate, comprising a substrate holder for holding a substrate with a surface to be plated thereof oriented upwardly, an anode disposed above and closely facing the substrate held by the substrate holder, a sealing member for sealing a space defined between the substrate and the anode and filled with a plating liquid to electrolytically plate the substrate, a movable electrode head for holding the anode, and a plating liquid tray disposed in a range which can be reached by the electrode head. At least a portion of the electrode head and the plating liquid tray for contact with the plating liquid is made of a material of poor wettability. Therefore, the plating liquid in the plating liquid tray which has a large area of contact with the atmosphere is prevented from precipitating copper sulfate on liquid-contact portions of the plating liquid tray and the electrode head, and from allowing nuclei to grow into larger solid crystals.

A dummy cathode may be detachably disposed in the plating liquid tray. When the plating liquid is supplied to the plating liquid tray and the dummy cathode is plated by an electric current passing through the anode in the plating liquid, conditioning of the anode can be performed. The dummy cathode may be made of oxygen-free copper.

According to the present invention, there is also provided an apparatus for plating a substrate, comprising a substrate holder for holding a substrate with a surface to be plated thereof oriented upwardly, an anode disposed above and closely facing the substrate held by the substrate holder, and a sealing member for sealing a space defined between the substrate and the anode and filled with a plating liquid to electrolytically plate the substrate. The plating liquid remaining in a region of an upper surface of the substrate held by the substrate holder, which is surrounded by the sealing member, is drawn and retrieved at a position on a peripheral edge of the substrate close to the sealing member while the substrate is rotating.

The plating liquid remaining on the upper surface of the substrate after it is plated is forced toward the sealing member on the peripheral edge of the substrate under centrifugal forces produced when the substrate is rotated, and hence can efficiently be retrieved at a high rate from the peripheral edge of the substrate. Therefore, the plating liquid which is expensive may be replenished less frequently, and the burden on the draining of the plating liquid may be reduced.

According to the present invention, there is also provided an apparatus for plating a substrate, comprising a substrate holder for holding a substrate with a surface to be plated thereof being oriented upwardly, an anode disposed upwardly of and closely facing the substrate held by the substrate holder, and a sealing member for sealing a space defined between the substrate and the anode and filled with a plating liquid to electrolytically plate the substrate. Rinsing pure water is supplied to a region of an upper surface of the substrate held by the substrate holder, which is surrounded by the sealing member, to clean the sealing member, and cleaning pure water is supplied to further clean the sealing member after the sealing member is separated from the upper surface of the substrate held by the substrate holder. Each time a plating process is performed, the sealing member and the cathode electrodes disposed near the sealing member are cleaned. Thus, the components that are consumed can have an increased service life.

According to the present invention, there is also provided an apparatus for plating a substrate, comprising a substrate holder for holding a substrate with a surface to be plated thereof oriented upwardly, an anode disposed above and closely facing the substrate held by the substrate holder, and a sealing member for sealing a space defined between the substrate and the anode and filled with a plating liquid to electrolytically plate the substrate. A predetermined amount of plating liquid is supplied in a single shot to the sealed space. The amount of plating liquid required for plating the substrate is small, and can be supplied quickly and reliably in one shot.

According to the present invention, there is also provided an apparatus for plating a substrate, comprising a substrate holder for holding a substrate with a surface to be plated thereof oriented upwardly, an anode disposed above and closely facing the substrate held by the substrate holder, and a sealing member for sealing a space defined between the substrate 10 and the anode and filled with a plating liquid to electrolytically plate the substrate. A plurality of treating steps are prepared, each of which can be set to use or non-use.

With the above arrangement, only one apparatus may be arranged to perform a pretreating step, a plating step, a coarse cleaning step, a main cleaning step, and a drying step, and any of these steps may be skipped. The apparatus can thus be used as a cleaning machine or a spin drying machine.

To achieve the third object of the present invention, there is further provided an apparatus for processing a substrate, comprising a substrate holder for holding a substrate, a first substrate treating head for treating a surface of the substrate held by the substrate holder according to a first-stage substrate treating process, and a second substrate treating head for treating the surface of the substrate held by the substrate holder according to a second-stage substrate treating process. Since the two substrate treating heads for performing the first-stage substrate treating process and the second-stage substrate treating process are provided, two different substrate treating processes can be performed on a single cell.

Each of the first-stage substrate treating process and the second-stage substrate treating process may comprise a substrate plating process one of the first-stage substrate treating process and the second-stage substrate treating process may comprise an electrolytic plating process, and the other comprises an electroless plating process. Alternatively, the first-stage substrate treating process and the second-stage substrate treating process may comprise respective processes for electrolytically plating the substrate with different plating liquids.

If each of the substrate treating processes is an electrolytic plating process, then an electrolytic plating liquid used in the first-stage substrate treating process may be, but should not be limited to, a copper pyrophosphate bath or a complex bath with EDTA added. Those baths with a high overvoltage are effective. An electrolytic plating liquid used in the second-stage substrate treating process may be a copper sulfate bath.

According to the present invention, there is also provided an apparatus for processing a substrate, comprising a substrate holder for holding a substrate, a first substrate treating apparatus having a first substrate treating head for treating a surface of the substrate held by the substrate holder according to a first-stage substrate treating process, and a second substrate treating apparatus having a second substrate treating head for treating the surface of the substrate held by the substrate holder according to a second-stage substrate treating process. The first substrate treating apparatus and the second substrate treating apparatus are disposed in a single facility.

The above and other objects, features, and advantages of the present invention will become apparent from the following description when, taken in conjunction with the accompanying drawings which illustrate preferred embodiments of the present invention by way of example.

BRIEF DESCRIPTION OF THE DRAWINGS

FIG. 7 is a plan view of a substrate processing apparatus according to another embodiment of the present invention, which is applied to a substrate plating apparatus;

FIG. 14 is a front elevational view of the plating unit shown in FIG. 11;

FIG. 17 is a left-hand side elevational view of the plating unit shown in FIG. 11;

FIG. 23A is a view of a support arm with a fixing finger before the support arm holds a substrate;

FIG. 23B is a view of a support arm with a pressing finger before the support arm holds the substrate;

FIGS. 25A and 25B are views illustrative of a problem arising when a substrate is not moved to an off-center position;

FIG. 38 is a diagram showing available processing steps and settings for using or not using those processing steps;

FIG. 39 is a plan view of a substrate processing apparatus according to still another embodiment of the present invention;

DETAILED DESCRIPTION OF THE INVENTION

Figure 1:
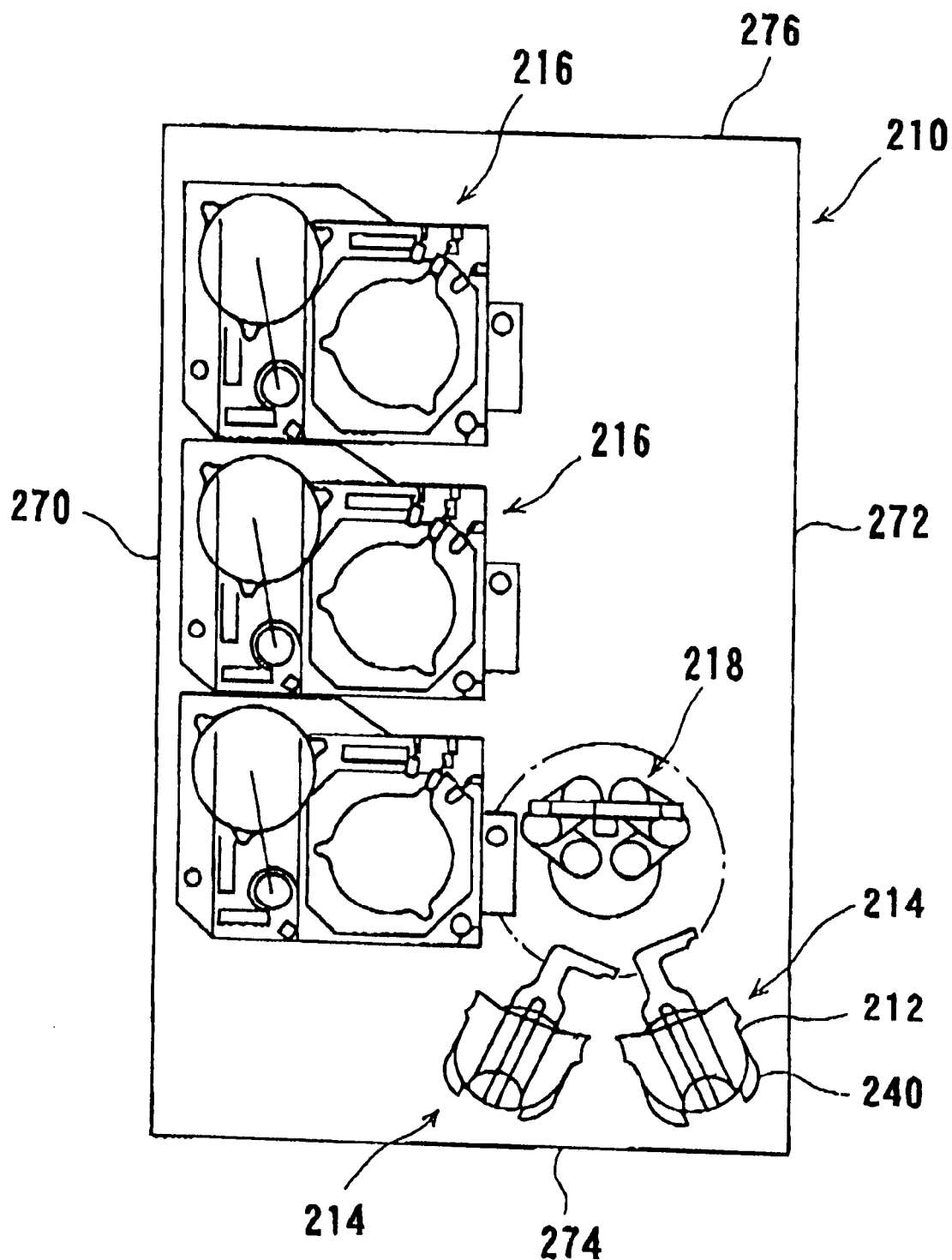
FIG. 1 is a plan view of a substrate processing apparatus according to an embodiment of the present invention, which is applied to a substrate plating apparatus.

FIG. 1 shows a plan view of a substrate processing apparatus according to an embodiment of the present invention, which is applied to a substrate plating apparatus. As shown in FIG. 1, the substrate plating apparatus (substrate processing apparatus) has a rectangular facility 210 which houses therein two loading/unloading units 214 for placing therein substrate cassettes 212 each accommodating a plurality of substrates W, a plurality of plating units 216 for plating substrate W and performing its supplementary process, and a transfer robot 218 for transferring substrates W between the loading/unloading units 214 and the plating units 216.

These units and transfer robot are disposed on a second floor in the facility 210 so as to be prevented from contacting the air directly. A plating process managing device 282 (see FIG. 8) is disposed on a first floor in the facility 210.

Figure 2:
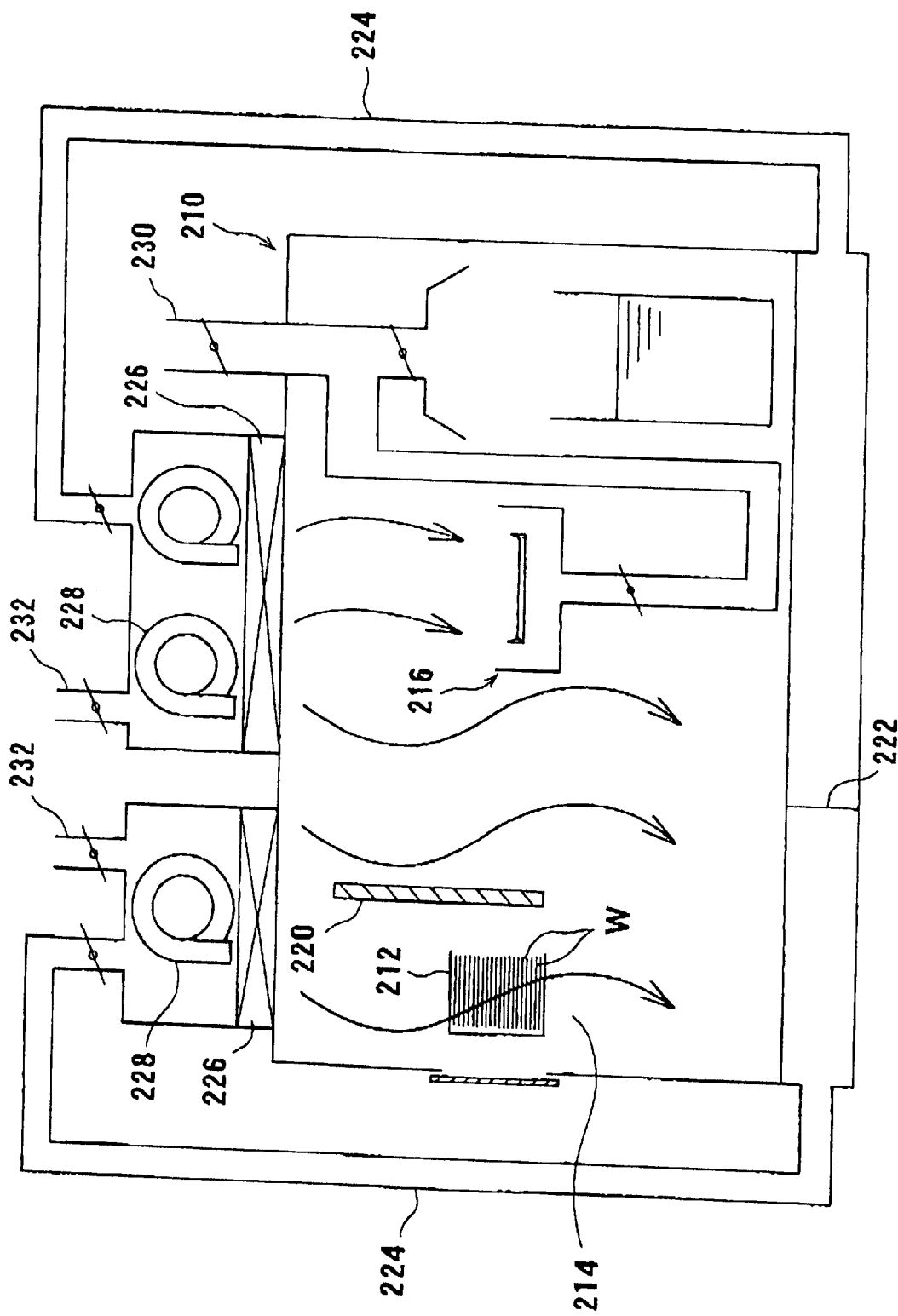
FIG. 2 is a view illustrating air flows in the facility of the substrate processing apparatus shown in FIG. 1.

FIG. 2 shows air flows in the facility 210, which has a structure for circulating clean air through spaces in the facility 210 that are separated by a partition 220, via pipes. Specifically, a downward flow of clean air is supplied from the ceiling of the facility 210 into the facility 210. Most of the supplied clean air then flows from the floor of the facility 210 into circulating pipes 224 divided by a partition 222, then flows back via the circulating pipes 224 to the ceiling, where it is forced through high-performance filters 226 into the facility 210 for circulation by fans 228. Part of the clean air is discharged out of the facility 210 through a discharge pipe 230. The high performance filters 226 are disposed in the ceiling above the plating units 216 and the loading/unloading units 214. The clean air is used to circulate in the facility 210, and when an amount of the clean air is in shortage, fresh air is introduced from external air inlets 232 and forced through the high-performance filters 226 into the facility 220 for circulation by the fans 228. The air pressure in the facility 210 is set to a value lower than the atmospheric pressure.

Since clean air flows downwardly from the ceiling in the facility 210, the various units and transfer robot which need to be cleaned to a higher level are disposed on the second floor in the facility 210, and the plating process managing device 282 which requires a lower level of cleanliness is disposed on the first floor in the facility 210.

Figure 3:
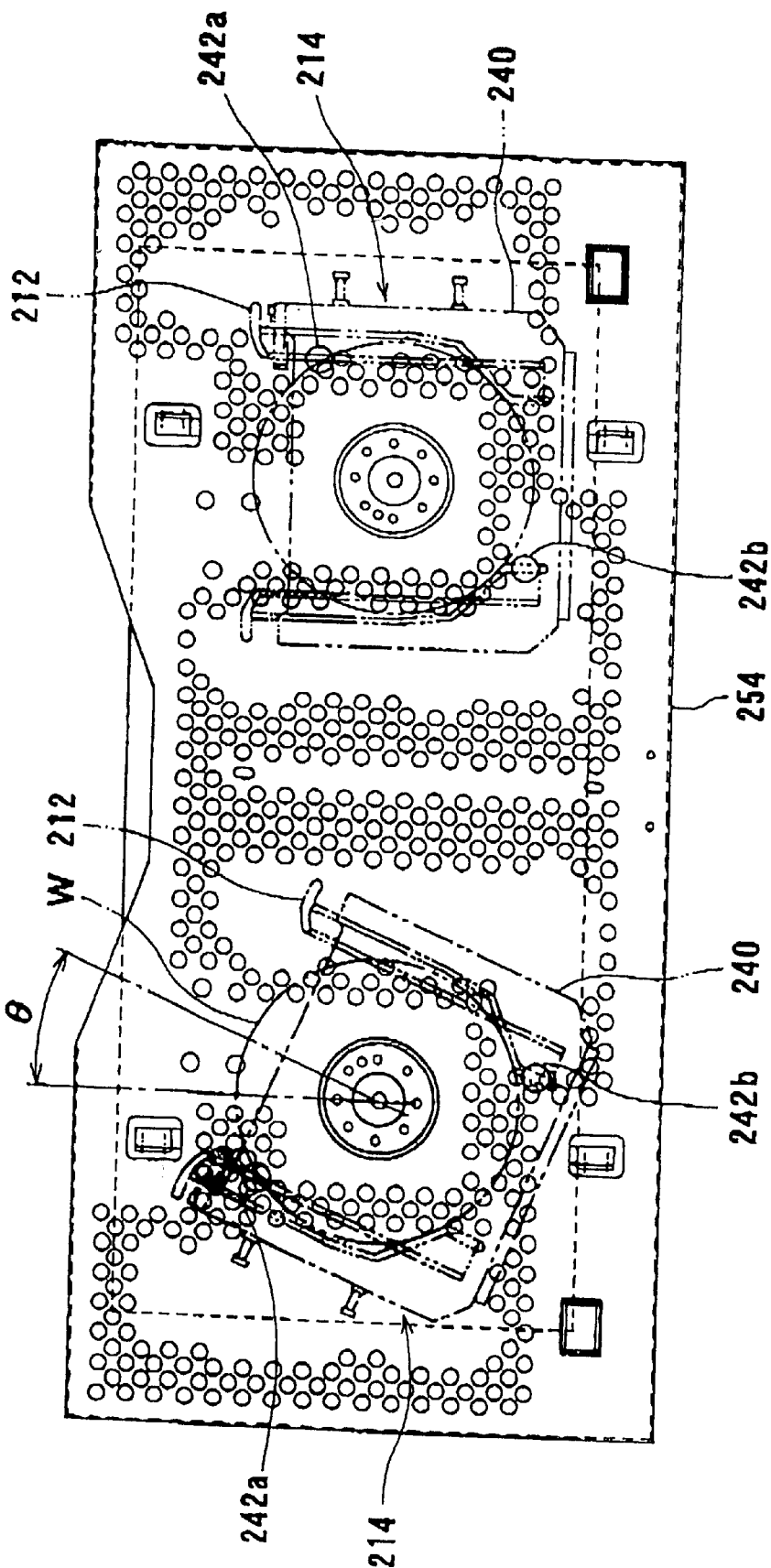
FIG. 3 is a plan view of a loading/unloading unit.
Figure 4:
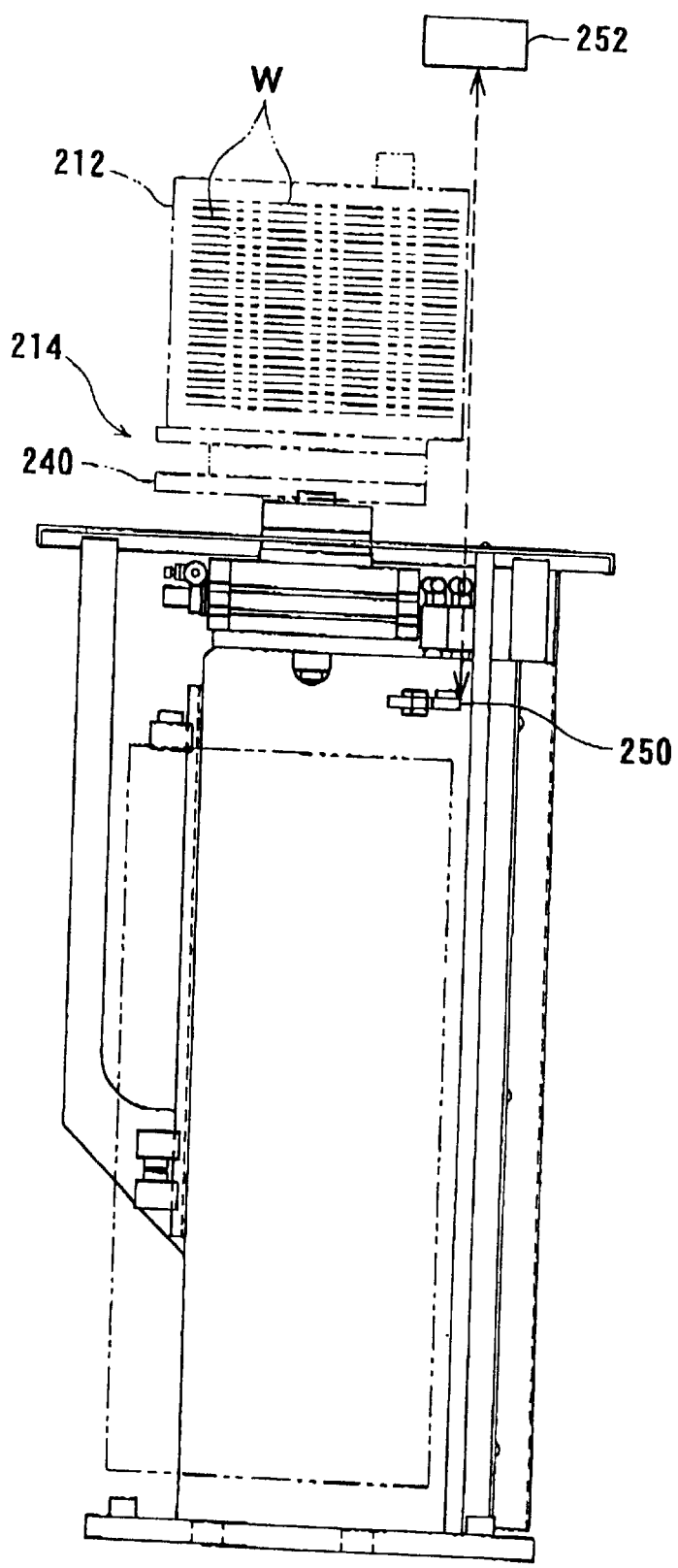
FIG. 4 is a side elevational view of the loading/unloading unit.
Figure 5:
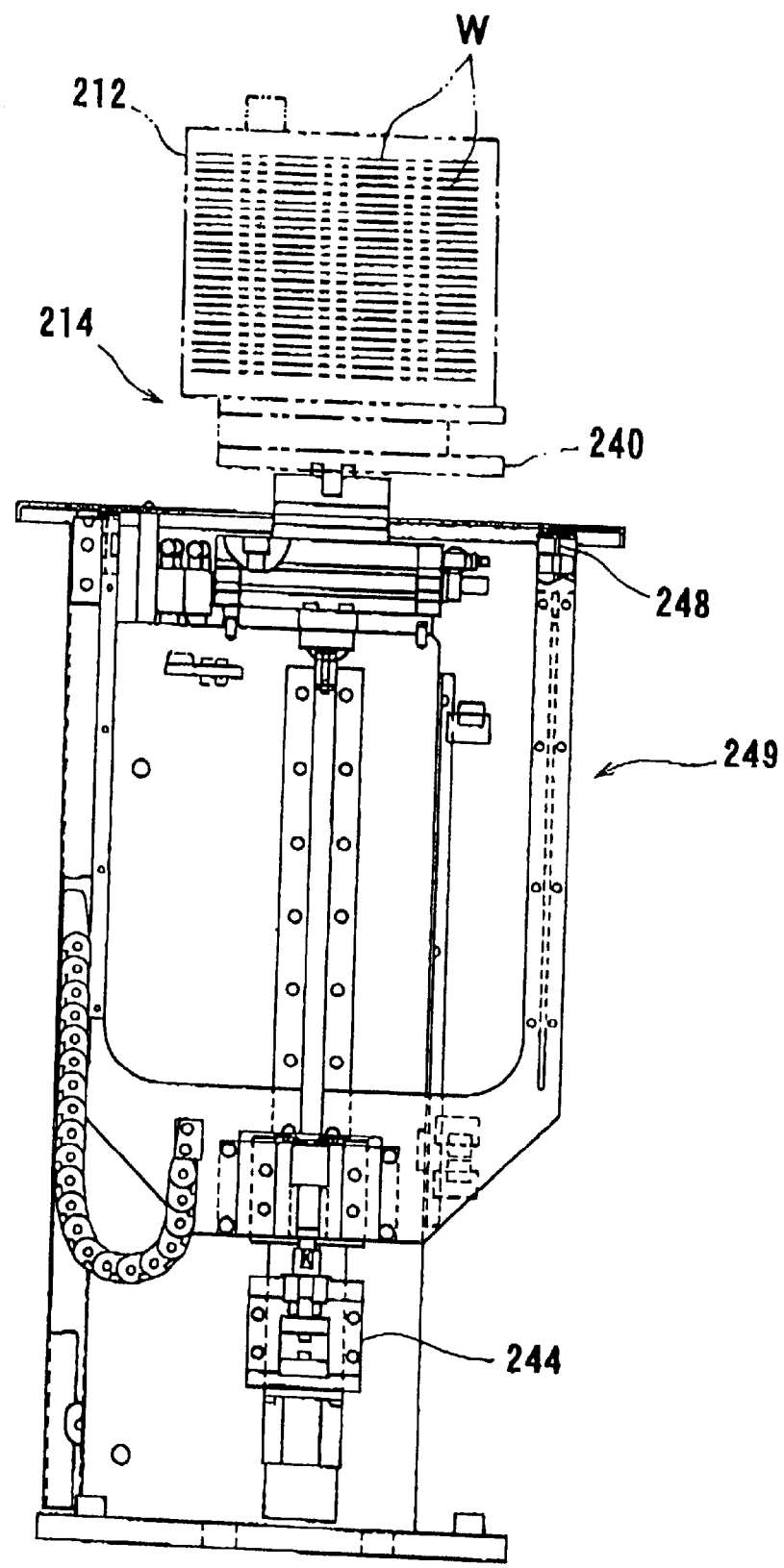
FIG. 5 is a sectional side elevational view of the loading/unloading unit.

FIGS. 3 through 5 show the loading/unloading unit 214. The loading/unloading unit 214 has a pair of flat rotary tables 240 for holding substrate cassettes 212, and each of the rotary tables 240 is rotatable in a horizontal plane. Each of the rotary tables 240 has two cassette sensors 242a, 242b disposed in a diagonal position for detecting when a substrate cassette 212 is placed on the rotary table 240.

A wafer search mechanism 249 is disposed near each of the rotary tables 240. The wafer search mechanism 249 has a microphotosensor 248 for detecting substrates, and the microphotosensor is vertically movable by a stepping motor 244. A light-emitting and -detecting device 250 as a projecting substrate sensor is disposed in a laterally shifted position below each of the rotary tables 240. The light-emitting and -detecting device 250 is associated with a reflecting device 252 that is positioned in the ceiling of the facility 210 in vertical alignment with the light-emitting and -detecting device 250.

The substrate cassette 212 is supplied from a cassette supply surface 254 into the facility 210, and placed onto the rotary table 240 in a direction substantially perpendicular to the cassette supply surface 254, as shown in a right area of FIG. 3. When the cassette sensors 242a, 242b detect the placement of the substrate cassette 212 on the rotary table 240, the stepping motor 244 is energized to lift the wafer search mechanism 249. While the wafer search mechanism 249 is ascending, the microphotosensor 248 detects substrates W housed in the substrate cassette 212 one by one, thus detecting the number of substrates W. Then, the light-emitting and -detecting device 250 emits a light beam upwardly toward the reflecting device 252, which reflects the light beam back toward the light-emitting and -detecting device 250. The light-emitting and -detecting device 250 determines whether any substrate W projecting laterally from the substrate cassette 212, based on whether the light-emitting and -detecting device 250 detects the reflecting light beam or not. Specifically, if a substrate W projects laterally from the substrate cassette 212, then it blocks the path of the light beam, and prevents the 15 light-emitting and -detecting device 250 from detecting the reflecting light beam. If no substrate W projects laterally from the substrate cassette 212, then, as shown in a left area of FIG. 3, the rotary table 240 is rotated to orient the substrate cassette 212 to allow the transfer robot 218 to easily take substrates W out of the substrate cassette 212. In FIG. 3, the left rotary table 240 has been rotated an angle 0 of about 23° clockwise. In FIG. 1, both the left and right rotary tables 240 are shown as having been rotated.

Thus, the rotary table 240 is rotated to adjust the direction of the substrate cassette 212. Hence, it is easy to supply the substrate cassette 212 into the loading/unloading unit 214, and to pick up the substrate W from the substrate cassette 212 placed on the loading/unloading unit 214 with the transfer robot 218. Accordingly, the loading/unloading unit 214 and the transfer robot 218 can be disposed efficiently.

Figure 6:
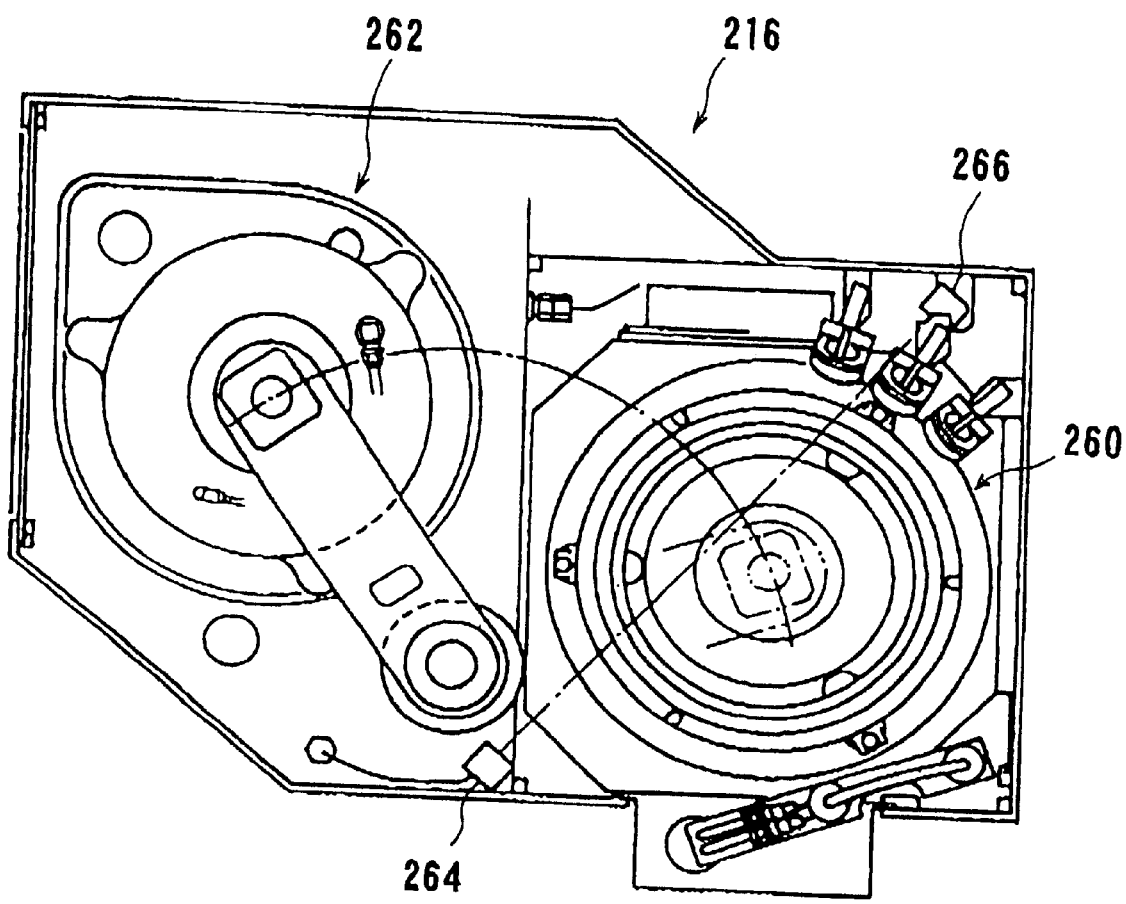
FIG. 6 is a plan view of a plating unit.

FIG. 6 shows a plating unit 216. As shown in FIG. 6, each of the plating units 216 has a substrate treating device 260 for plating substrates W and for performing a supplementary process. A plating liquid tray 262 for storing a plating liquid is disposed adjacent to the substrate treating device 260. A substrate W delivered by the transfer robot 218 and placed in the substrate treating device 260 is plated on its surface by the substrate treating device 260. The substrate W, if necessary, is also pretreated, e.g., precoated, by the substrate treating device 260 before it is plated, and cleaned and dried by the substrate treating device 260 after it is plated. The plating unit 216 also has a substrate sensor for detecting whether there is a substrate W in the substrate treating device 260 or not, and the substrate sensor comprises a light-emitting element 264 and a light-detecting element 266 that are positioned across the surface of the substrate treating device 260 on which the substrate W is placed.

The transfer robot 218 comprises a robot which can rotate about its own axis and can move along a straight path. The transfer robot 218 takes out a substrate W from either one of the two substrate cassettes 212, delivers the substrate W to one of the plating units 216, and places the substrate W in the substrate treating device 260 of the plating unit 216.

As shown in FIG. 1, a plurality of (e.g., three in FIG. 1) plating units 216 are disposed parallel to each other in facing relation to a side wall 270 of the facility 210. Specifically, the substrate treating devices 260 of the plating units 216 are positioned closer to the transfer robot 218, and the plating liquid trays 262 thereof are positioned closer to the side wall 270 and have side surfaces extending parallel to an inner surface of the side wall 270.

The plating units 216 can be repaired, replaced, or otherwise serviced when the side wall 270 is opened, with an opposite side wall 272 remaining closed. Therefore, the maintenance of the plating units 216 can easily be performed. The maintenance of the loading/unloading units 214 can be performed when a side wall 274 of the facility 210 near the loading/unloading units 214 is opened. The maintenance of the transfer robot 218 can be performed when a side wall 276 opposite to the side wall 274 is opened.

Operation of the substrate plating apparatus, i.e., the substrate processing apparatus, will be described below.

First, a substrate cassette 212 is placed on the rotary table 240 of one of the loading/unloading units 214. The number of substrates W in the substrate cassette 212 and whether any substrate W projects laterally from the substrate cassette 212 are then detected. If there is no problem with the substrate cassette 212, then the rotary table 240 is rotated to orient the substrate cassette 212 for easy removal of substrates W therefrom by the transfer robot 218.

The transfer robot 218 then removes a substrate W from the substrate cassette 212, and delivers the substrate W to the substrate treating device 260 of one of the plating units 216 and places the substrate W in the substrate treating device 260. The substrate W is plated, and cleaned and dried, if necessary, in the substrate treating device 260. Thereafter, the transfer robot 218 receives the substrate W from the substrate treating device 260, and returns the substrate W to the substrate cassette 212.

When the plating of all the substrates W in the substrate cassette 212 is completed, the rotary table 240 is rotated in the opposite direction to return the substrate cassette 212 to its original angular position. Thereafter, the substrate cassette 212 is unloaded from the facility 210.

In this embodiment, the substrate plating apparatus has three plating units 216. However, depending on the number of substrates to be treated per unit time (i.e., the throughput of the substrate plating apparatus) the substrate plating apparatus may have one or more plating units 216.

Figure 8:
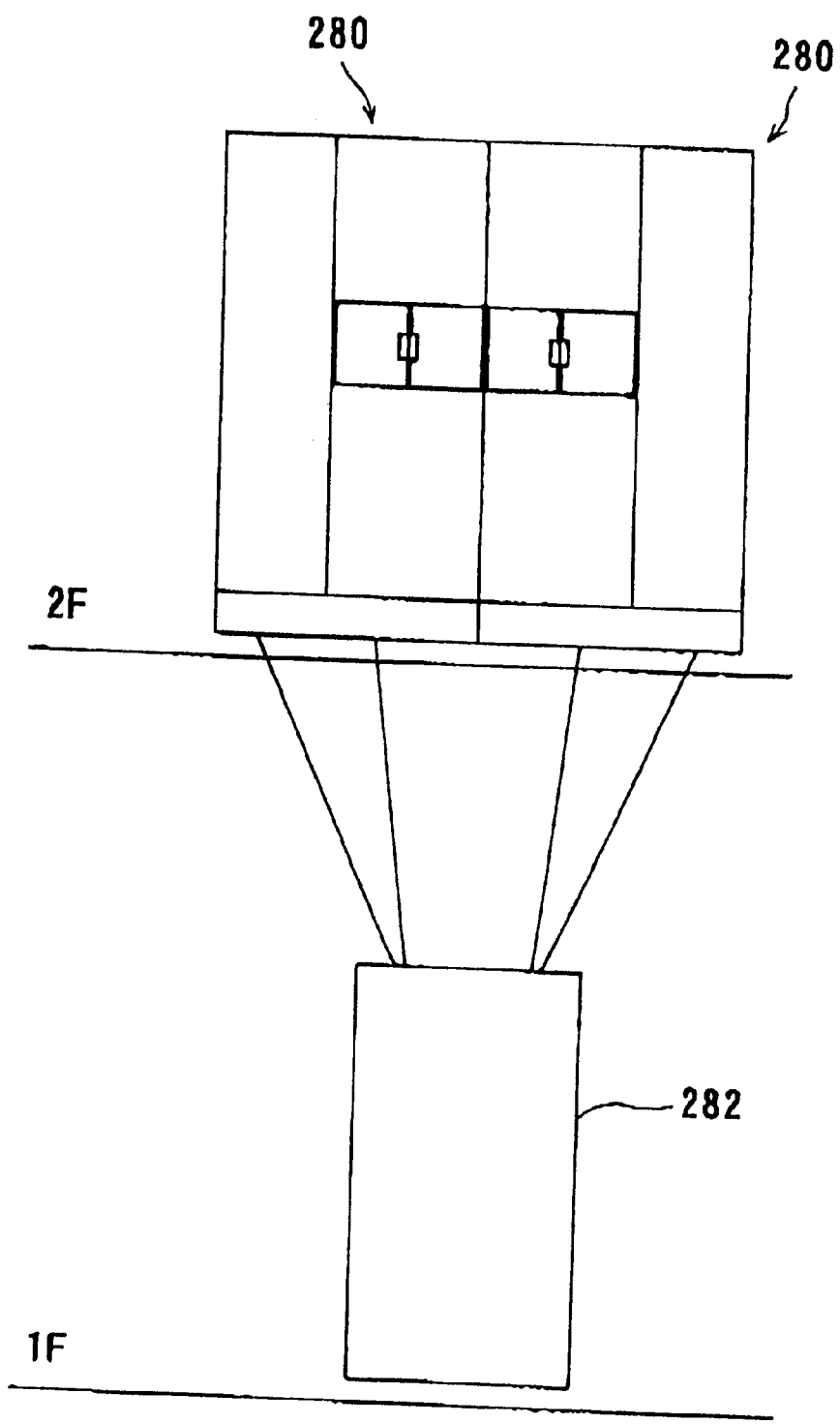
FIG. 8 is a plan view of the substrate processing apparatus shown in FIG. 7.

FIGS. 7 and 8 show a substrate processing apparatus according to another embodiment of the present invention, which is applied to a substrate plating apparatus. The substrate processing apparatus shown in FIGS. 7 and 8 has two facilities 280 each accommodating therein two loading/unloading units 214, a plurality of plating units 216 aligned and juxtaposed along a side wall 270, and a transfer robot 218. The facilities 280 have side walls 272, opposite to the side walls 270 and disposed back-to-back, and share a single plating process managing device 282.

In this embodiment, the maintenance of the plating units 216 can be performed by opening the side walls 270 near the plating units 216. With the plating units 216 having good maintainability, the two facilities 280 can be placed closely together with no space therebetween, and hence save space. In addition, the single plating process managing device 282 can be shared by the two facilities 280.

In the present embodiment, the substrate cassette 212 can be supplied to the loading/unloading unit 214, and the transfer robot 218 can remove substrates W from the substrate cassette 212 placed in the loading/unloading unit 214 without undue limitations. The loading/unloading units 214 and transfer robot 218 are positioned efficiently in a reduced installation space.

With the plating units (substrate treating units) 216 aligned and juxtaposed along the side wall 270 of the substrate processing facility 280, the maintainability of the plating units 216 is increased. The substrate processing facilities 280, each having a plurality of plating units 216 aligned and juxtaposed along one side wall 270, are disposed back to back at their side walls 272 opposite to the side walls 270. Therefore, with the plating units 216 having good maintainability, the two substrate processing facilities 280 can be placed closely together with no space therebetween, and hence save space. In addition, the single plating process managing device 282 can be shared by the two facilities 280.

The substrate plating apparatus according to the present invention is used to electrolytically plate the surface of a semiconductor substrate with copper to produce a semiconductor device having interconnections made of a copper layer. Such a plating process will be described below with reference to FIGS. 9A through 9C.

Figure 9A:
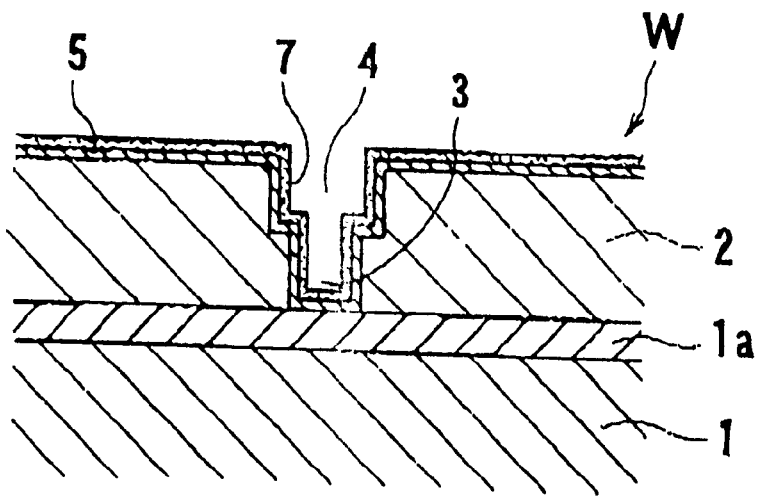
FIGS. 9A through 9C are cross-sectional views showing successive steps of a plating process carried out by the substrate plating process of the present invention.

As shown in FIG. 9A, an insulating film 2 of $SiO_2$ is deposited on an electrically conductive layer 1a of a semiconductor substrate W with a semiconductor element formed thereon, and a contact hole 3 and an interconnection trench 4 are formed in the insulating film 2 by lithography and etching. A barrier layer 5 of TaN or the like is deposited on the surface formed so far, and then a seed layer 7 as a layer for supplying electric energy for electrolytic plating is deposited on the barrier layer 5.

Figure 9B:
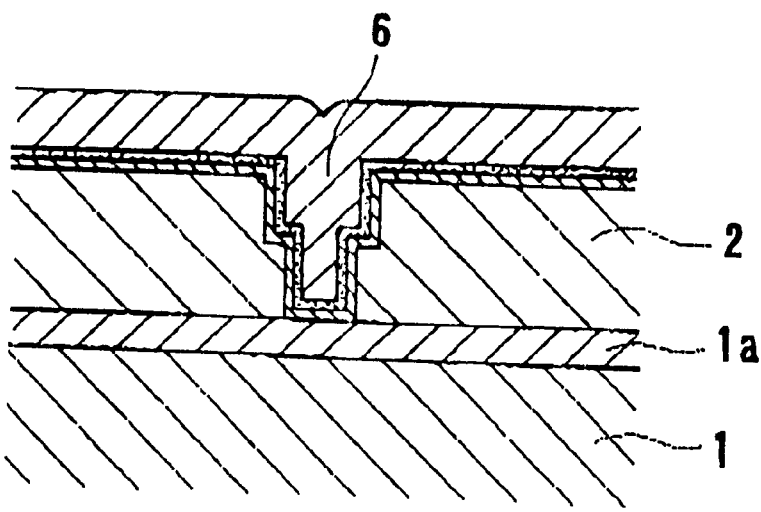
Figure 9C:
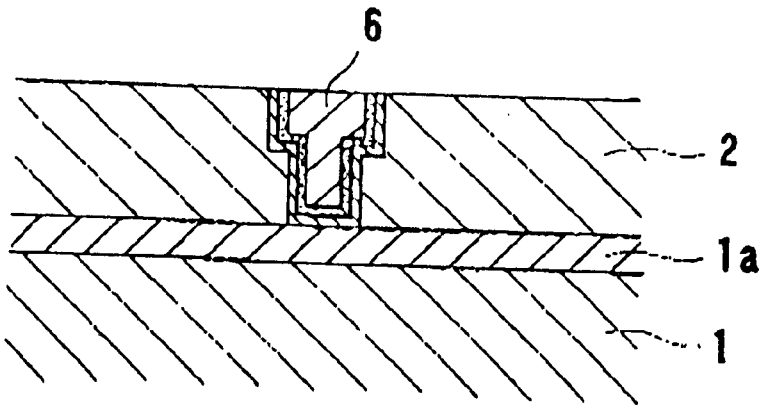

As shown in FIG. 9B, the surface of the semiconductor substrate W is covered with copper to embed the contact hole 3 and the interconnection trench 4 with copper and deposit a copper layer 6 on the insulating film 2. Thereafter, the assembly is polished by chemical mechanical polishing (CMP) to remove the copper layer 6 from the insulating film 2, thereby making the surface of the copper layer 6 embedded in the contact hole 3 and the interconnection trench 4 lie substantially flush with the surface of the insulating film 2. An interconnection made of the copper layer 6 is now produced as shown in FIG. 9C.

Figure 10:
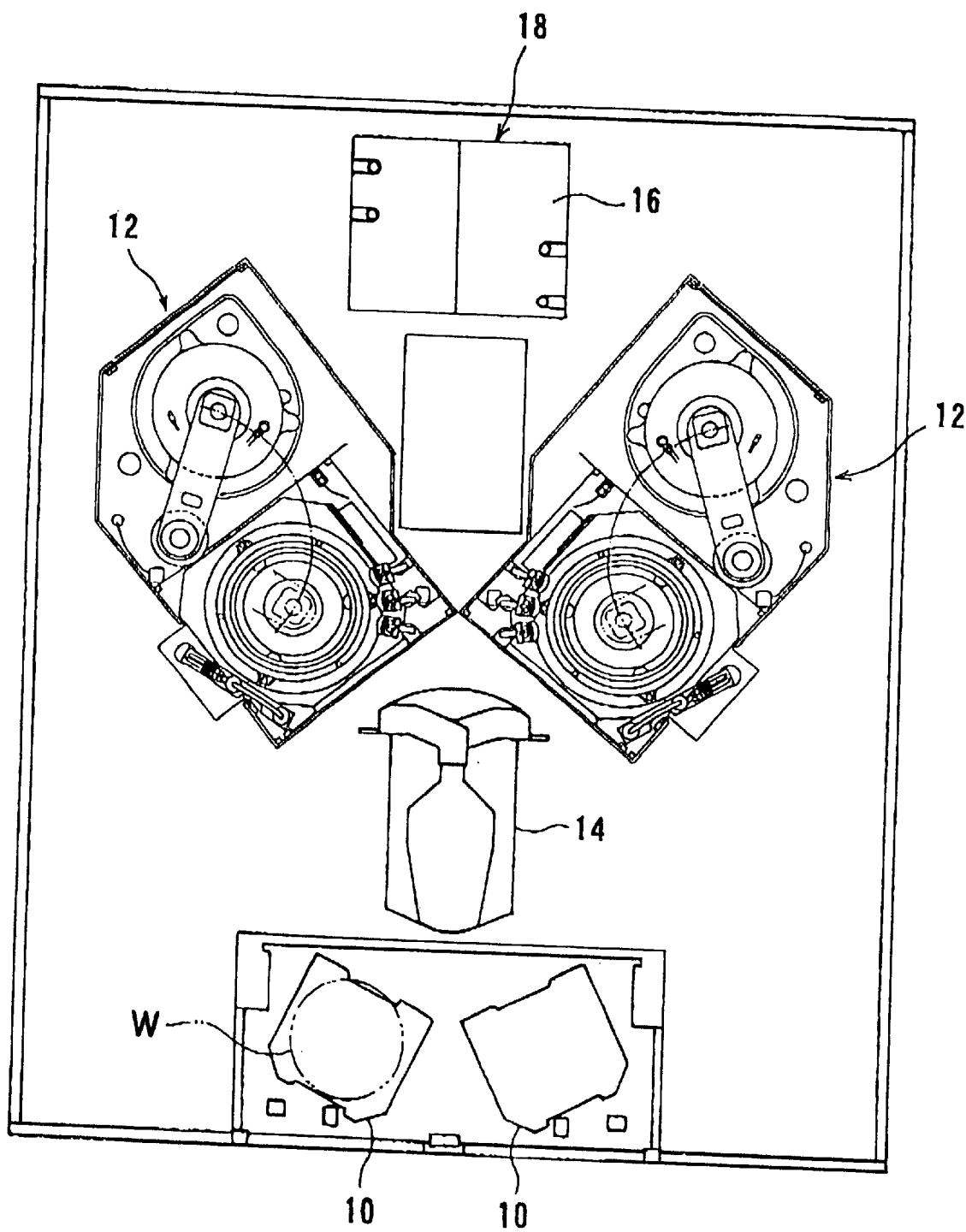
FIG. 10 is a plan view of a substrate plating apparatus according to an embodiment of the present invention.

FIG. 10 shows a plan view of a substrate plating apparatus according to an embodiment of the present invention. As shown in FIG. 10, the substrate plating apparatus has, located in one facility, two loading/unloading units 10 each for accommodating a plurality of substrates W, two plating units 12 for plating substrates W and for performing a supplementary process, a transfer robot 14 for transferring substrates W between the loading/unloading units 10 and the plating units 12, and a plating liquid supply unit 18 having a plating liquid tank 16.

Figure 11:
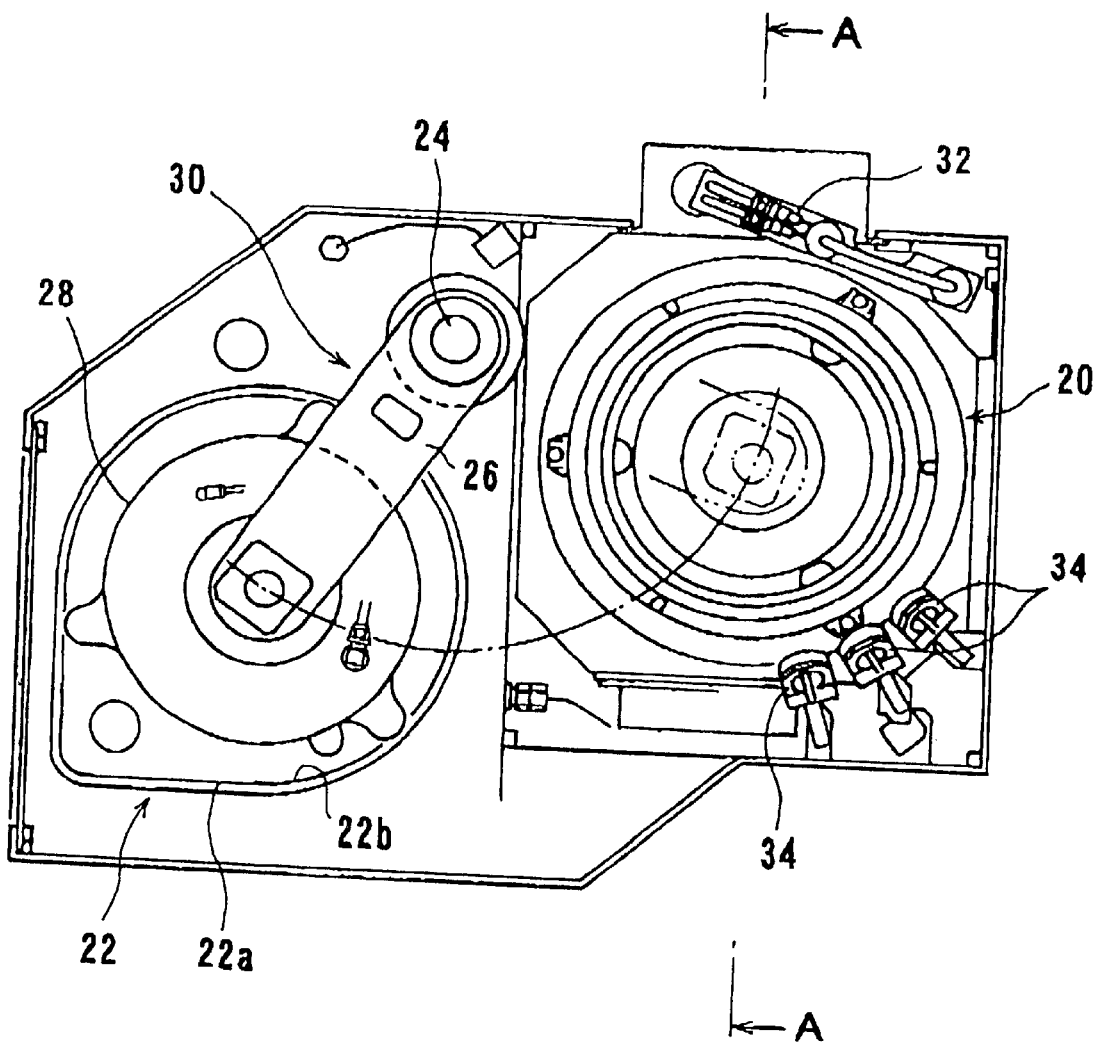
FIG. 11 is a plan view of a plating unit.

As shown in FIG. 11, each of the plating units 12 has a substrate treating device 20 for plating substrates W and for performing a supplementary process. A plating liquid tray 22 for storing a plating liquid is disposed adjacent to the substrate treating device 20. An electrode arm assembly 30 has an electrode head 28 mounted on a tip end of a swing arm 26 which is swingable about a rotatable shaft 24 to swing between the substrate treating device 20 and the plating liquid tray 22. Alongside of the substrate treating device 20, there are a precoating/retrieving arm 32 and a plurality of fixed nozzles 34 for ejecting pure water, a chemical liquid such as ion water or the like, or a gas toward the substrate in the substrate treating device 20. In the present embodiment, three fixed nozzles 34 are employed to allow the substrate treating device 20 to operate as a cleaning machine, with one of the fixed nozzles 34 being used to supply pure water.

Figure 12:
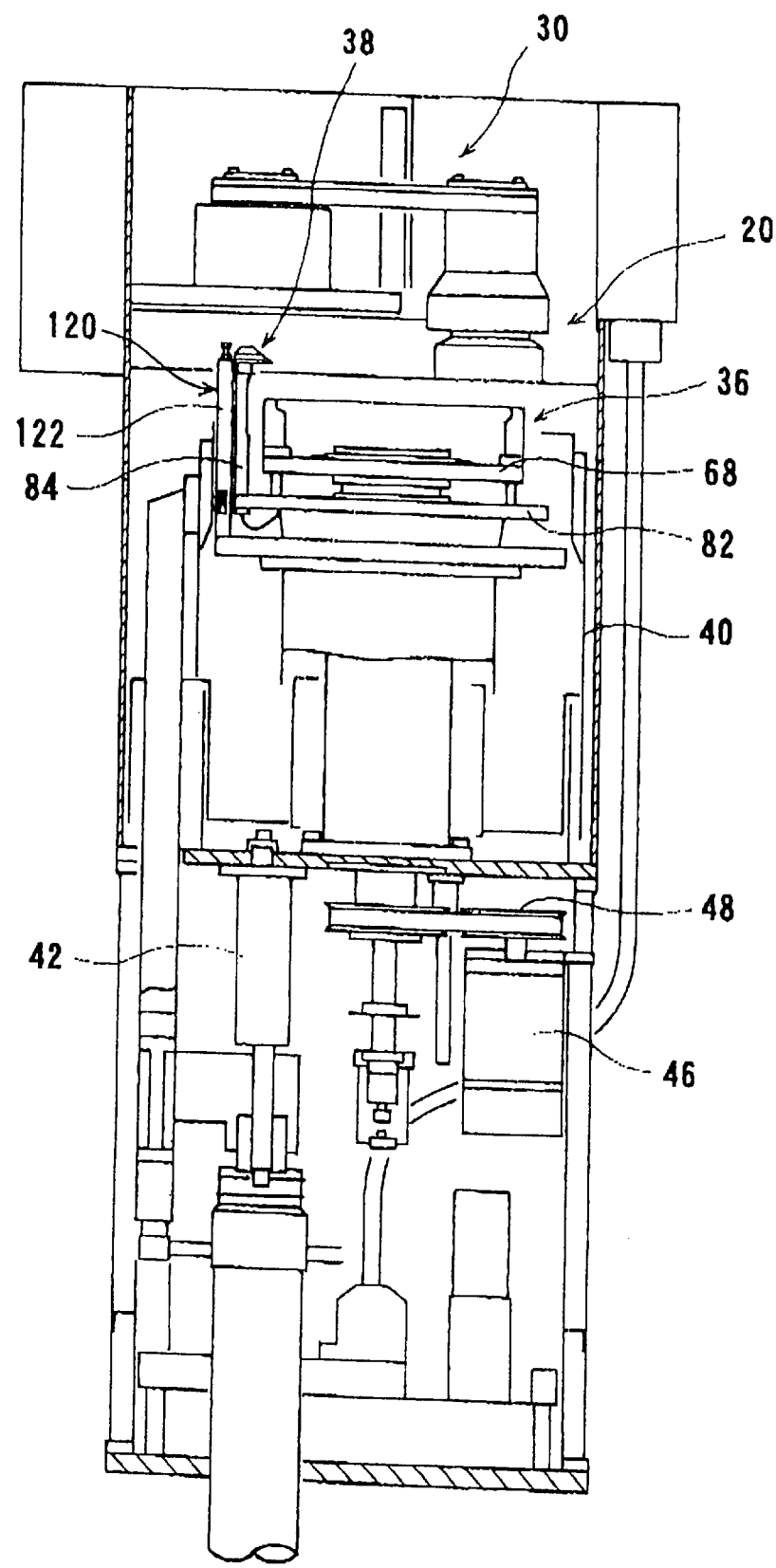
FIG. 12 is a cross-sectional view taken along line A—A of FIG. 11.
Figure 13:
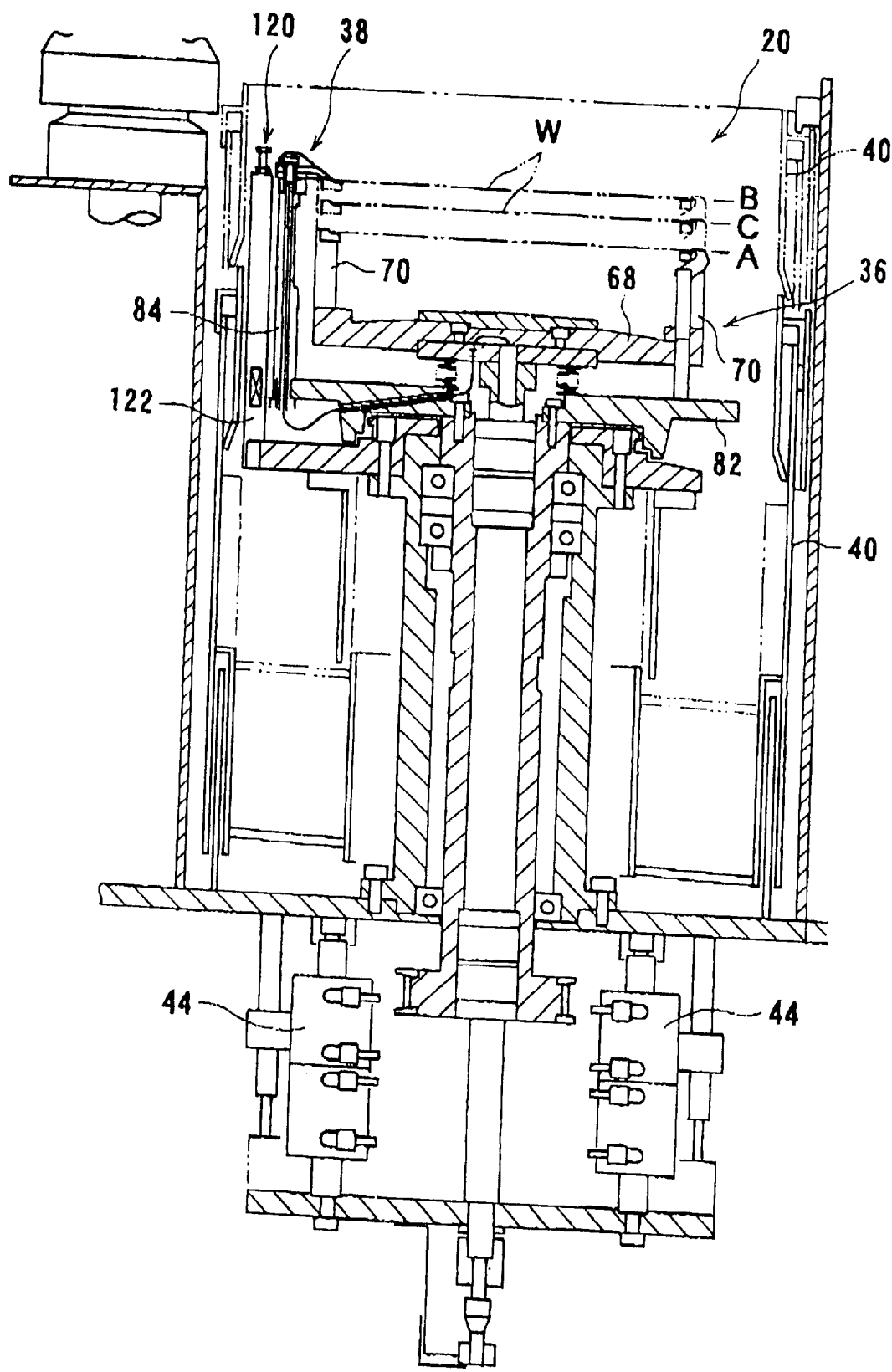
FIG. 13 is an enlarged cross-sectional view of a substrate holder and a cathode assembly.

As shown in FIGS. 12 and 13, the substrate treating device 20 comprises a substrate holder 36 for holding a substrate W with its surface to be plated being oriented upwardly, and a cathode assembly 38 disposed above the substrate holder 36 so as to surround the periphery of the substrate holder 36. A substantially cylindrical bottomed cup 40 is disposed around the substrate holder 36 for preventing various chemical liquids used for substrate treatment from being scattered around. The substantially cylindrical bottomed cup 40 is vertically movable by an air cylinder 42.

The substrate holder 36 is vertically movable by an air cylinder 44 between a lower substrate transfer position A, an upper plating position B, and an pretreating/cleaning position C between the lower substrate transfer position A and the upper plating position B. The substrate holder 36 can be rotated in unison with the cathode assembly 38 at a desired acceleration or deceleration and rotational speed by a motor 46 and a belt 48. The acceleration or deceleration is in the range from 0 to 180000 $min^{-2}$, for example, and the rotational speed is in the range from 0 to 2500 $miri^{-1}$, for example. In each of the treating steps in the substrate treating device 20, a rotational speed, an acceleration or deceleration, and a time for rotating the substrate holder 36 after a preset speed has been reached can be set and controlled.

Figure 15:
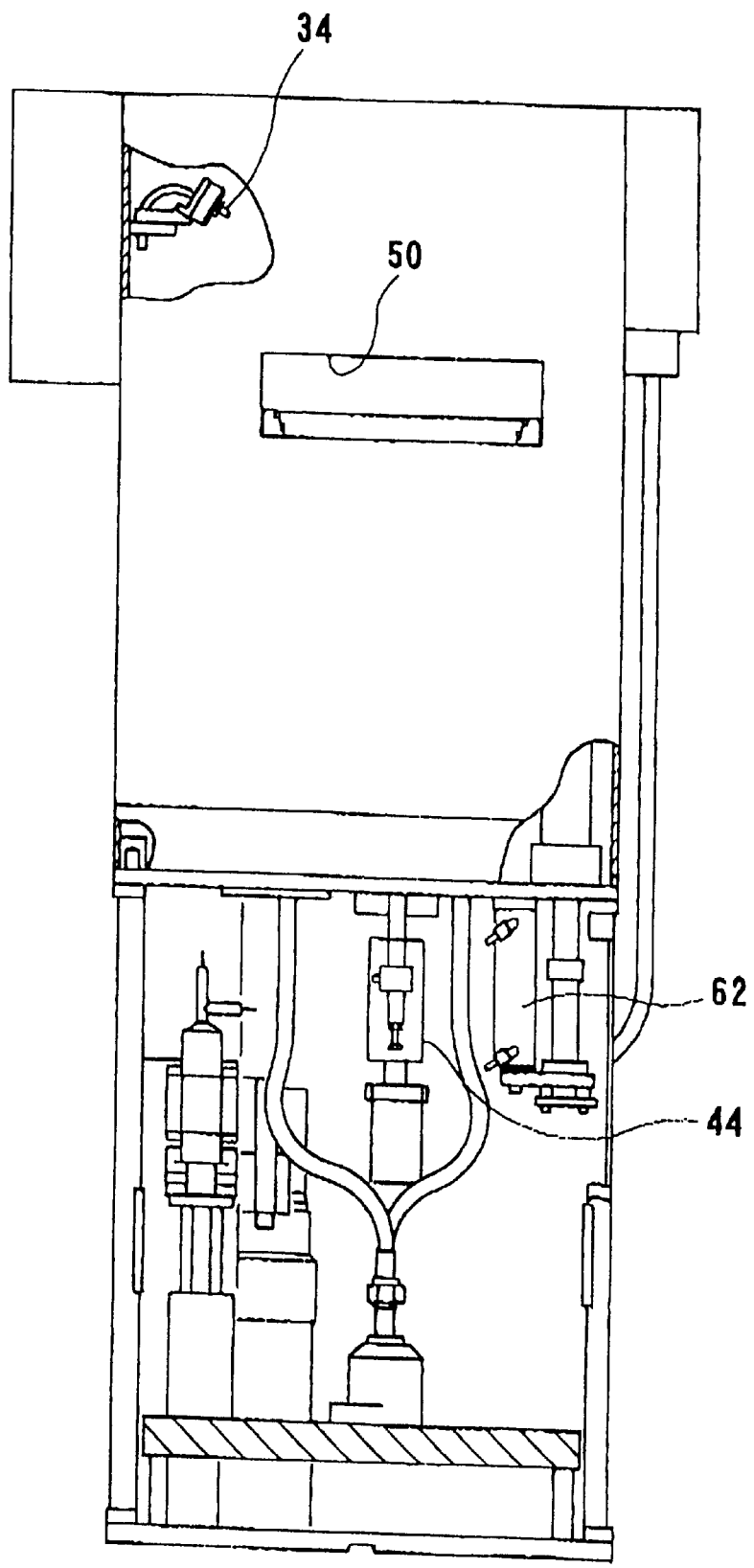
FIG. 15 is a right-hand side elevational view of the plating unit shown in FIG. 11.

As shown in FIG. 15, a side panel of the plating units 12 facing the transfer robot 14 has a substrate loading and unloading port 50 confronting the substrate transfer position A. When the substrate holder 36 is elevated to the plating position B, seal members 90 and cathode electrodes 88, to be described below, of the cathode assembly 38 are brought into abutment against a peripheral region of the substrate W that is held by the substrate holder 36. The cup 40 has an upper end positioned beneath the substrate loading and unloading port 50. When the cup 40 is lifted, it closes the substrate loading and unloading port 50 and its upper end reaches a position above the cathode assembly 38, as indicated by the imaginary lines in FIG. 13.

The plating liquid tray 22 serves to wet a plating liquid impregnated member 100 and an anode 102, to be described below, of the electrode head 28, and to perform conditioning of the anode 102 for liquid replacement and preplating treatment, etc., when no plating process is carried out. As shown in FIG. 14, the plating liquid tray 22 is large enough to house the plating liquid impregnated member 100 therein.

Figure 16:
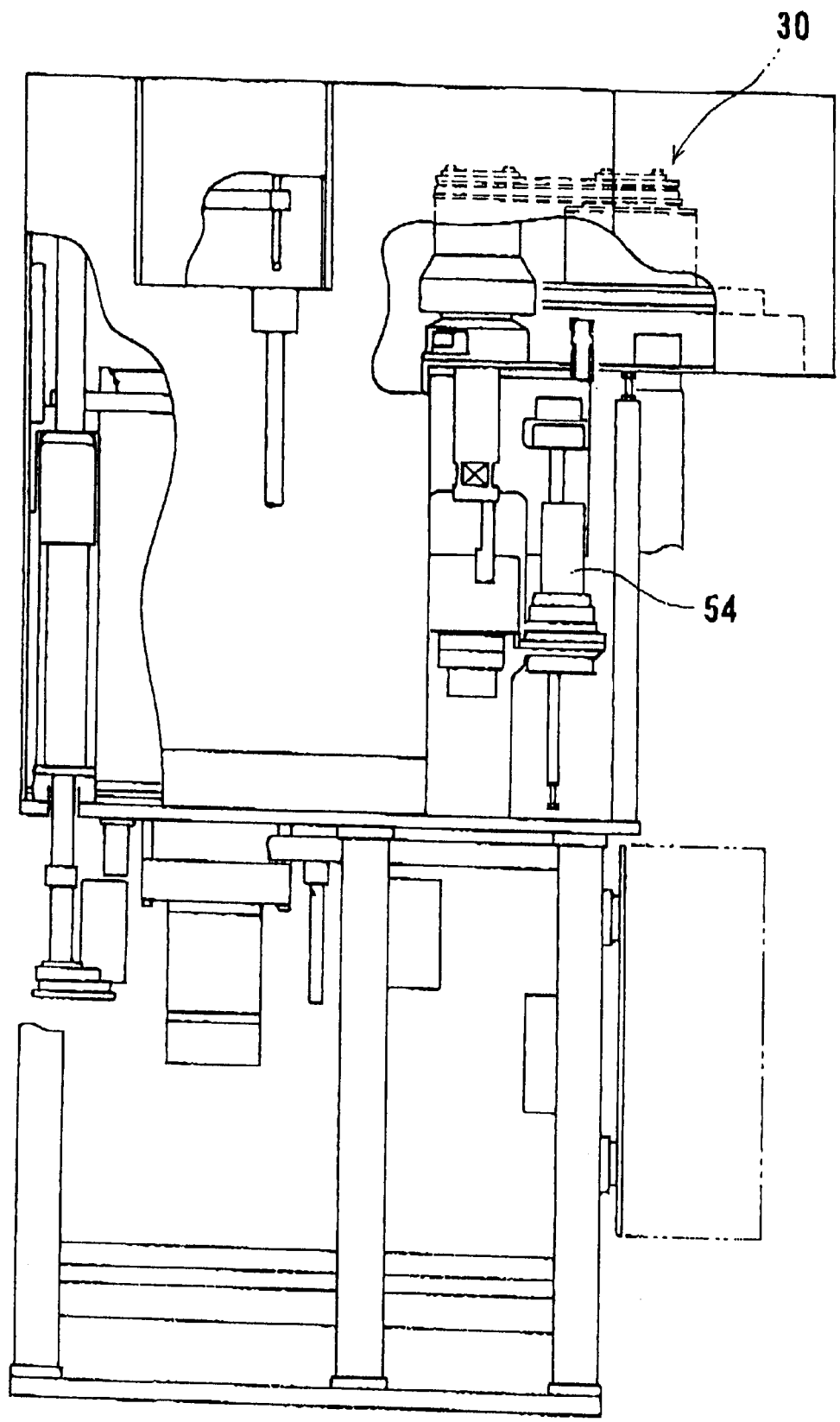
FIG. 16 is a rear elevational view of the plating unit shown in FIG. 11.

As shown in FIGS. 16 and 17, the electrode arm assembly.30 is vertically movable by a motor 54 and a ball screw, not shown, and swingable between the plating liquid tray 22 and the substrate treating device 20 by a motor 56.

Figure 18:
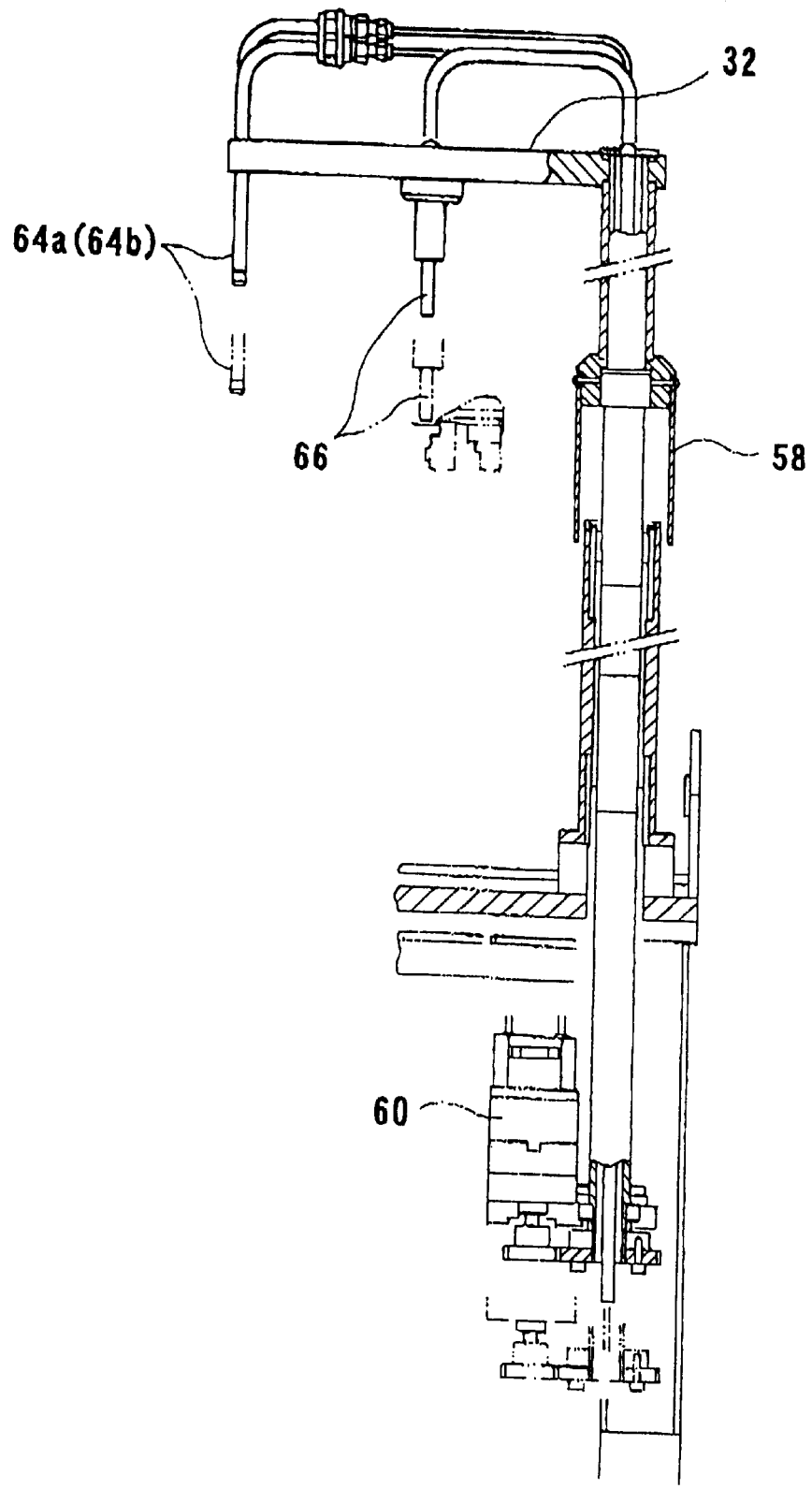
FIG. 18 is a front elevational view of a precoating/retrieving arm.
Figure 19:
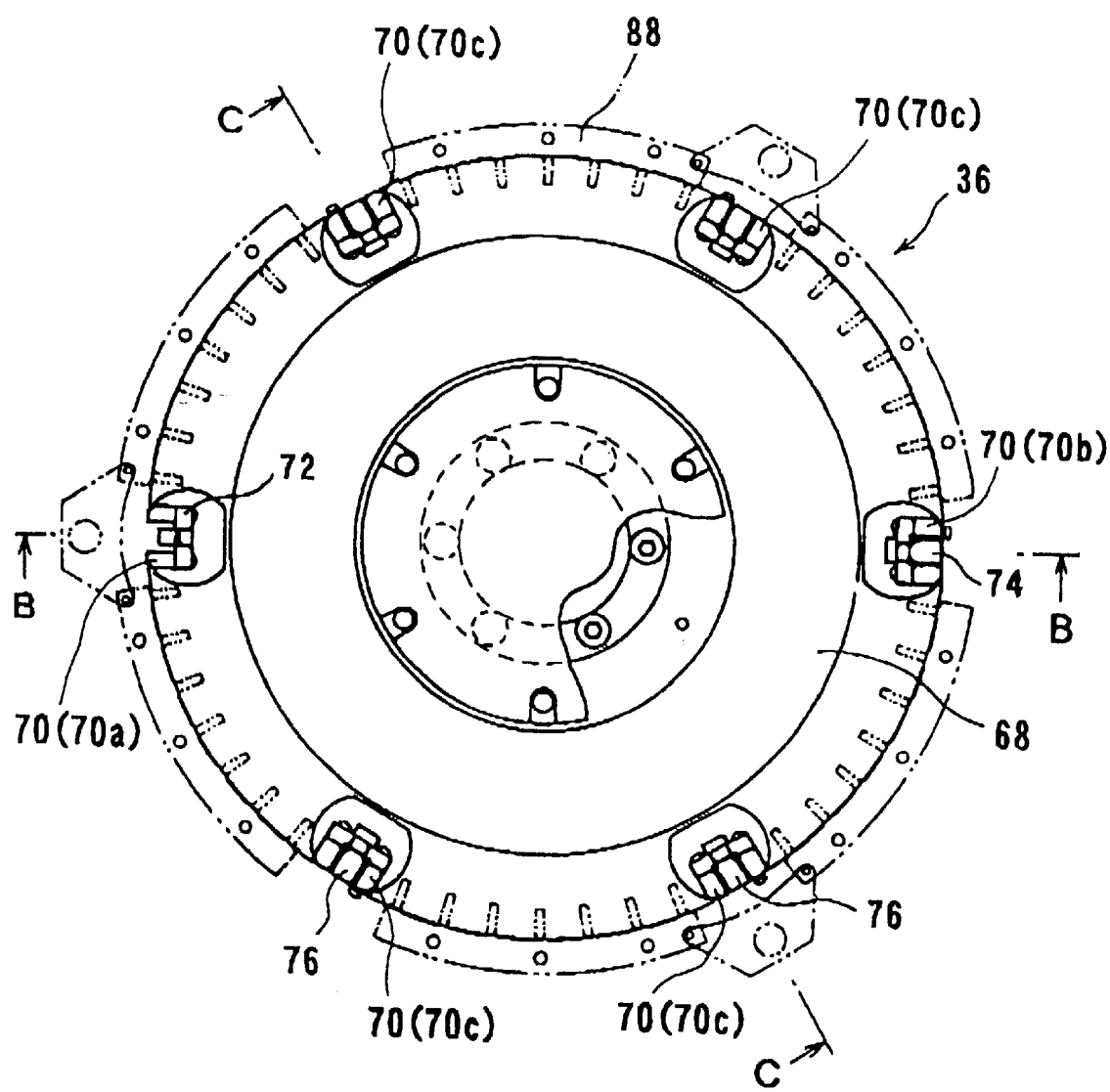
FIG. 19 is a plan view of the substrate holder.
Figure 20:
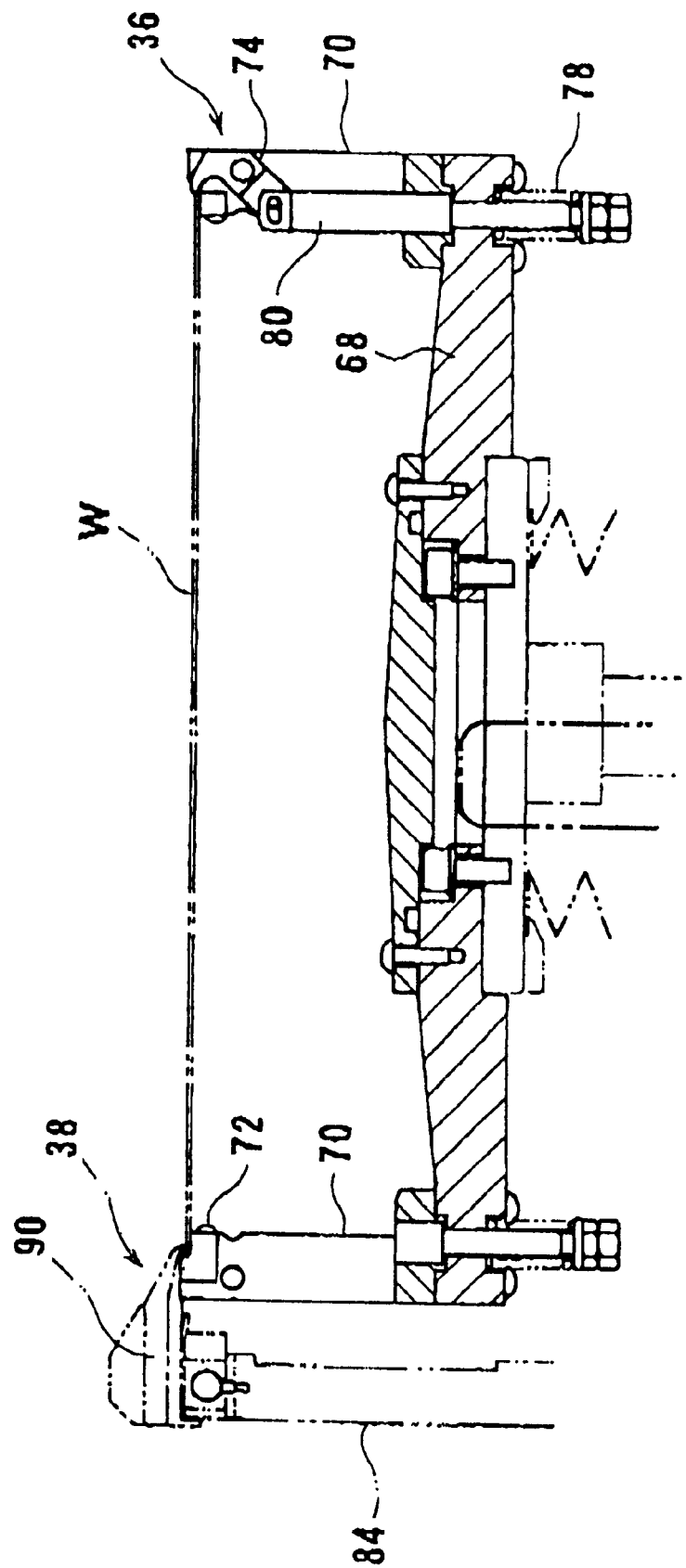
FIG. 20 is a cross-sectional view taken along line B—B of FIG. 19.

As shown in FIG. 18, the precoating/retrieving arm 32 is coupled to an upper end of a vertical support shaft 58. The precoating/retrieving arm 32 is swingable by a rotary actuator 60 between an operative position to apply a precoat or a carrier coat to a substrate W and to retrieve the plating liquid and a retracted position, and is also vertically movable by an air cylinder 62 (see FIG. 15).

The precoating/retrieving arm 32 supports, on its free end, a precoating nozzle 64a for discharging a precoating liquid and a carrier coating nozzle 64b for discharging a carrier coating liquid, the precoating nozzle 64a and the carrier coating nozzle 64b being disposed parallel to each other. The precoating/retrieving arm 32 also supports, on a portion closer to its proximal end, a plating liquid retrieving nozzle 66 for retrieving the plating liquid. The precoating nozzle 64a is connected to a syringe that is actuatable by an air cylinder, for example, for intermittently discharging a precoating liquid from the precoating nozzle 64a. Similarly, a carrier coating liquid can also be intermittently discharged from the carrier coating nozzle 64b that is connected to a syringe. The plating liquid retrieving nozzle 66 is connected to a cylinder pump or an aspirator to draw the plating liquid on the substrate W from the lower end of the plating liquid retrieving nozzle 66.

As shown in FIGS. 19 through 24A, 24B, the substrate holder 36 has a disk-shaped substrate stage 68 and six vertical support arms 70 disposed at spaced intervals on the circumferential edge of the substrate stage 68 for holding a substrate W in a horizontal plane on respective upper surfaces of the support arms 70. Seats 72 for placing a substrate W thereon are fixed to the lower surfaces of steps of the support arms 70.

No finger is mounted on one 70*a* of the support arms 70, and a pressing finger 74 is rotatably mounted on an upper end of the support arm 70*b* which is positioned diametrically opposite to the support arm 70*a*, for abutting against an end face of the substrate W and pressing the substrate W inwardly when inwardly rotated. Fixing fingers 76 are rotatably mounted on upper ends of the remaining four support arms 70*c* for pressing the substrate W downwardly and gripping the circumferential edge of the substrate W between themselves and the seats 72 when inwardly rotated.

The pressing finger 74 and the fixing fingers 76 have respective lower ends coupled to upper ends of opening pins 80 that are normally urged to move downwardly by coil springs 78. When the opening pins 80 are moved downwardly, the pressing finger 74 and the fixing fingers 76 are rotated radially inwardly into a closed position. A support plate 82 serving as an opening member is disposed below the substrate stage 68 for engaging lower ends of the opening pins 80 and pushing them upwardly.

When the substrate holder 36 is located in the substrate transfer position A shown in FIG. 13, the opening pins 80 are engaged and pushed upwardly by the support plate 82, so that the pressing finger 74 and the fixing fingers 76 rotate outwardly and open. When the substrate stage 68 is elevated, the opening pins 80 are lowered under the resiliency of the coil springs 78, so that the pressing finger 74 and the fixing fingers 76 rotate inwardly and close.

Figure 22:
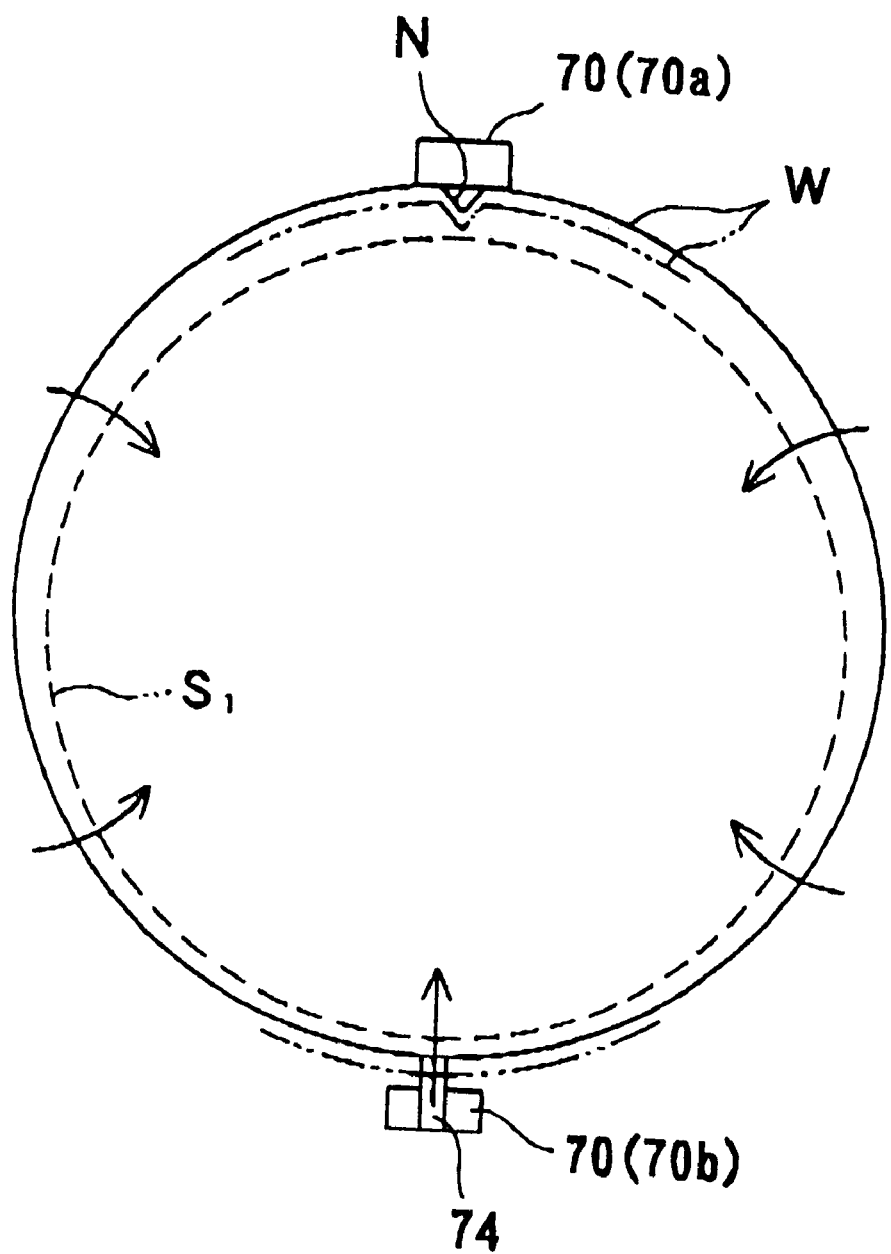
FIG. 22 is a view showing how a substrate is moved to an off-center position on the substrate holder.

As shown in FIG. 22, the substrate W is placed on the seats 72 with a notch N thereof being positioned to face the support arm 70*a*. As the substrate stage 68 ascends, the pressing finger 74 of the support arm 70*b* is first rotated in the closing direction to press the portion of the substrate W where the notch N is defined against the support arm 70*a*. Thereafter, the fixing fingers 76 of the support arms 70*c* are rotated in the closing direction to grip and hold the circumferential edge of the substrate W. Therefore, the fixing fingers 76 do not rub against the substrate W.

In the present embodiment, as shown in FIGS. 23A, 23B and 24A, 24B, each of the opening pins 80 has an externally threaded lower end with two nuts 81 threaded thereover, and the support plate 82 has recesses 82*a* defined therein at positions aligned with the respective opening pins 80. The recesses 82*a* have a diameter greater than the diameter of the opening pins 80 and smaller than the diameter of the nuts 81. The nuts 81 on the opening pin 80 for opening and closing the pressing finger 74 are positioned upwardly of the nuts 81 on the opening pins 80 for opening and closing the fixing fingers 76.

Figure 24A:
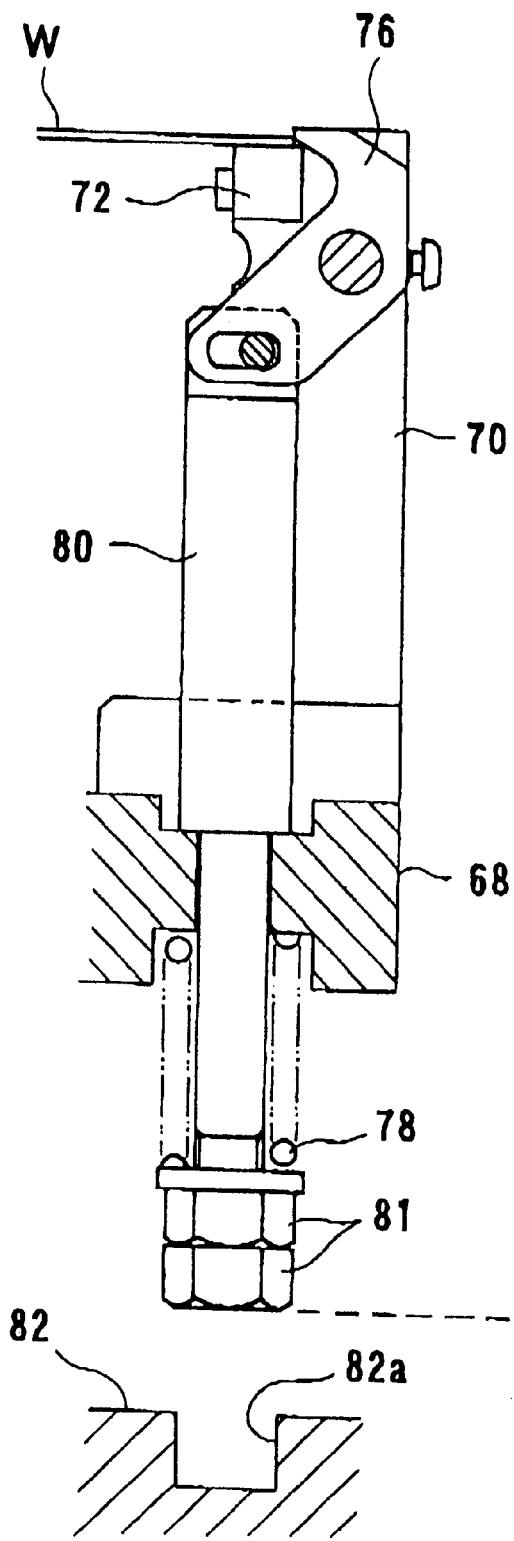
FIG. 24A is a view of the support arm with the fixing finger after the support arm holds the substrate.
Figure 24B:
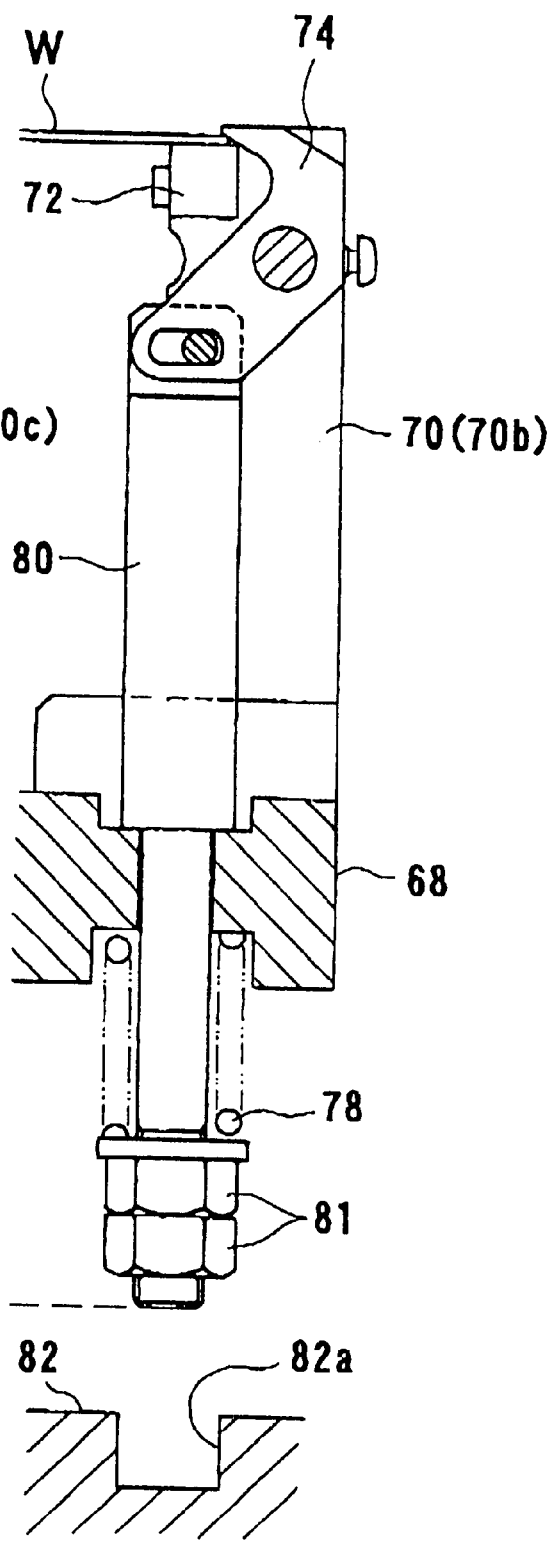
FIG. 24B is a view of the support arm with the pressing finger after the support arm holds the substrate.

When the substrate stage 68 is to be lifted from the position shown in FIGS. 23A, 23B to the position shown in FIGS. 24A, 24B to hold the substrate W, since the range of rotation of the pressing finger 74 is smaller and closer to the substrate W than the range of rotation of the fixing fingers 6, the pressing finger 74 is closed more quickly in a shorter time than the fixing fingers 76. When the substrate W is to be released, conversely, the pressing finger 74 is closed more slowly in a shorter time than the fixing fingers 76.

With the substrate W being gripped and held by the fixing fingers 76 while the portion of the substrate W where the notch N is defined is being pressed against the support arm 70*a*, the substrate W is shifted from the center of the substrate holder 36 to an off-center position toward the notch N in the substrate W by a distance corresponding to the clearance (normally about 0.4 mm with respect to the outside diameter of the substrate W) between the substrate W and the substrate holder 36. Therefore, a circular sealing boundary $S_1$ shown in FIG. 22 is positioned opposite to the notch N in the substrate W. Thus, the plating area (effective area) of the substrate W that can be plated can be increased without the need for complex sealing shapes and mechanisms.

Specifically, as shown in FIG. 25A, if a circular sealing boundary $S_2$ were positioned radially inwardly of the notch N in the substrate W in concentric relation to the substrate W, then the plating area of the substrate W that extends within the circular sealing boundary $S_2$ would be reduced by an amount commensurate with the depth of the notch N. If, as shown in FIG. 25B, a substantially circular sealing boundary $S_3$ were shaped to include a chordal edge extending inwardly of the notch N, then the sealing shape would be complex. However, the arrangement according to the present embodiment is free of the above problems.

By adjusting the tightened position of the nuts 81 threaded over the lower ends of the opening pins 80, it is possible to adjust the timing of operation of the pressing finger 74 and the fixing fingers 76. When the two nuts 81 on each of the opening pins 80 are tightened against each other, they are prevented from becoming positionally shifted on the opening pins 80.

Figure 21:
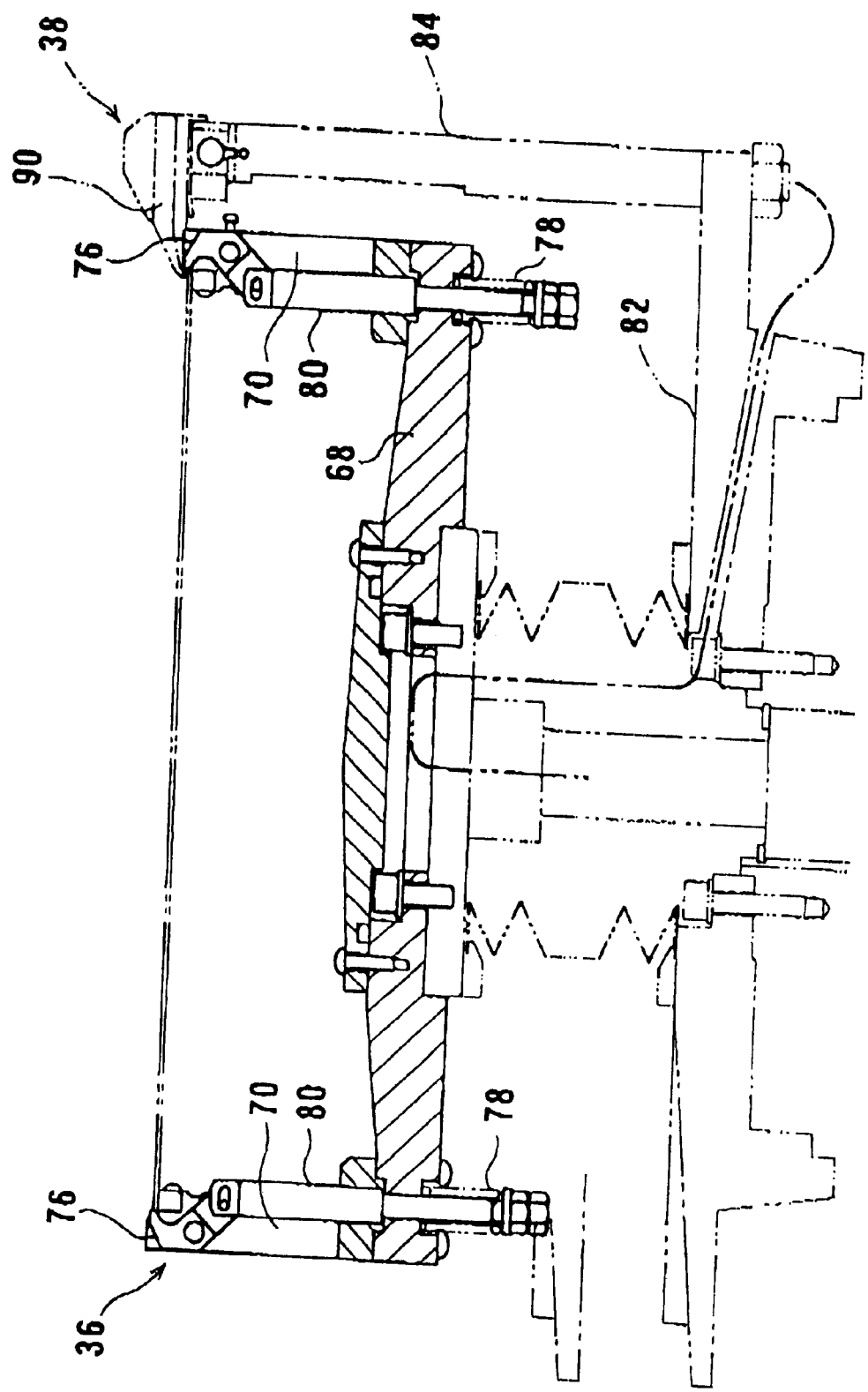
FIG. 21 is a cross-sectional view taken along line C—C of FIG. 19.

As shown in FIGS. 26 through 30A, 30B, the cathode assembly 38 comprises an annular frame 86 fixed to upper ends of vertical support columns 84 mounted on the peripheral edge of the support plate 82 (see FIGS. 13 and 21). A plurality of (six in this embodiment) cathode electrodes 88 are attached to a lower surface of the annular frame 86 and project radially inwardly, and an annular sealing member 90 is mounted on an upper surface of the annular frame 86 so as to cover upper surfaces of the cathode electrodes 88.

The sealing member 90 has a ring shape and includes an inward extension 90*a* extending radially inwardly, and has a thickness decreasing gradually and inclined downwardly in the radially inward direction. A downwardly depending member 90*b* is contiguous to the inward extension 90*a* and bent downwardly therefrom, and the downwardly depending member 90*b* is gradually thinner toward its lower end. The lower end of the downwardly depending member 90*b* has a width $W_1$ of 0.5 mm, for example.

The sealing member 90 may be capable of withstanding a head pressure of several mm $H_2O$. Therefore, the sealing member 90 has a thickness gradually reduced radially inwardly and bent downwardly into its lower end of reduced thickness of about 0.5 mm for contact with the substrate W. The sealing member 90 thus shaped allows the substrate W to have an increased plating area (effective area) without impairing its sealing capability.

Figure 29:
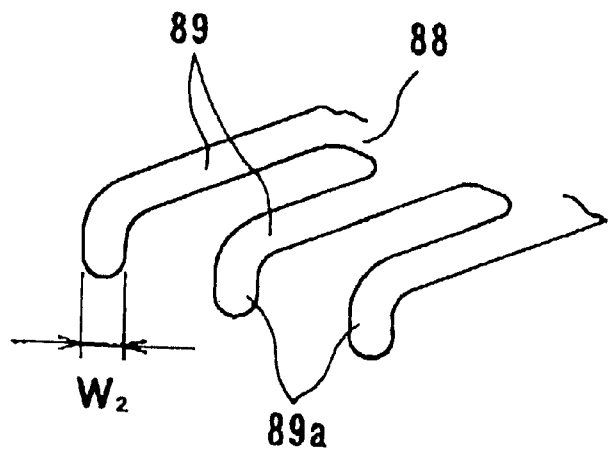
FIG. 29 is an enlarged perspective view showing a portion of a cathode electrode.

Each of the cathode electrodes 88 has a thickness of 0.2 mm and has a plurality of teeth 89 spaced at equal intervals in the circumferential direction, and each tooth 89 has a width $W_2$ of about 2 mm, as shown in FIG. 29. Each of the teeth 89 has a depending portion 89*a* positioned radially outwardly of the downwardly depending member 90*b* of the sealing member 90, and the depending portion 89*a* is bent downwardly substantially at a right angle along the downwardly depending member 90*b*. The depending portion 89*a* has a lower end which is arcuately round.

Figure 32:
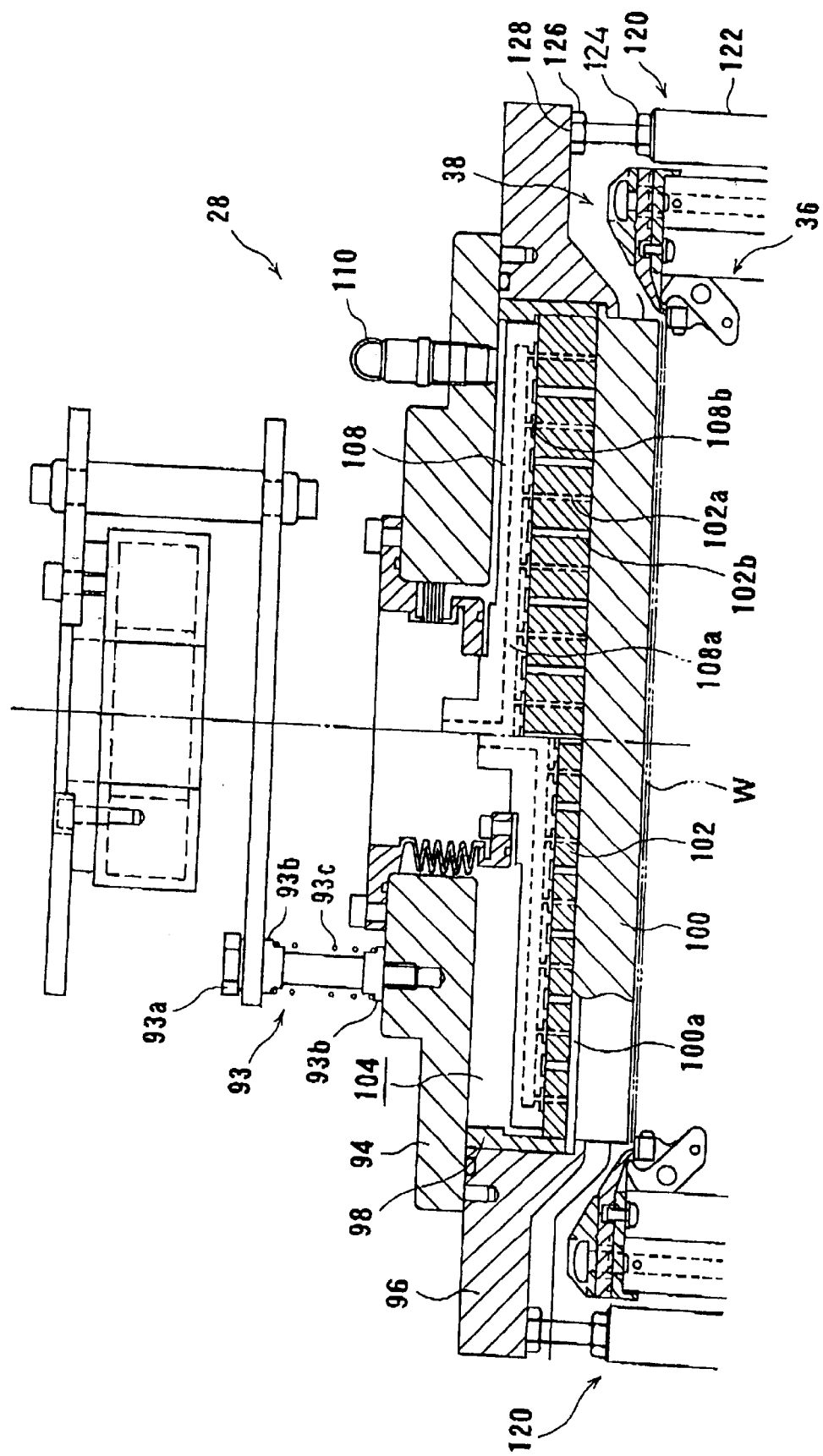
FIG. 32 is a cross-sectional view taken along line E—E of FIG. 31, the parts being in a position when a substrate is plated.

As shown in FIGS. 13 and 32, when the substrate holder 36 is lifted to the plating position B, the lower ends of the teeth 89 of the cathode electrodes 88 are pressed against the peripheral edge of the substrate W held by the substrate holder 36 to supply an electric current thereto. At the same time, the lower end of the downwardly depending member 90*b* of the sealing member 90 is pressed against the upper surface of the peripheral edge of the substrate W to seal the peripheral edge of the substrate W in a water-tight fashion, thereby preventing the plating liquid supplied to the upper surface (to be plated) of the substrate W from seeping out of the end of the substrate W and from contaminating the cathode electrodes 88.

Figure 30A:
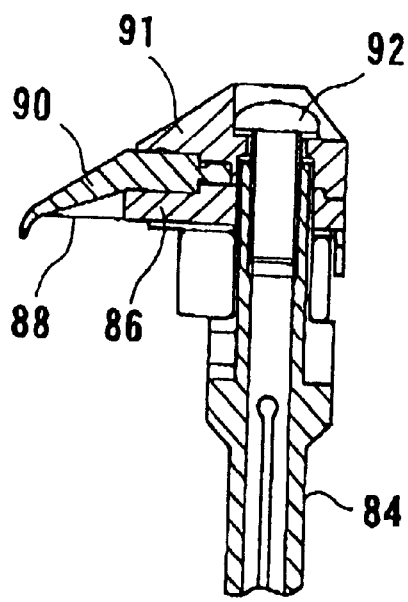
FIGS. 30A and 30B are views showing the cathode electrode and a seal member before and after they are attached together to a support post.
Figure 30B:
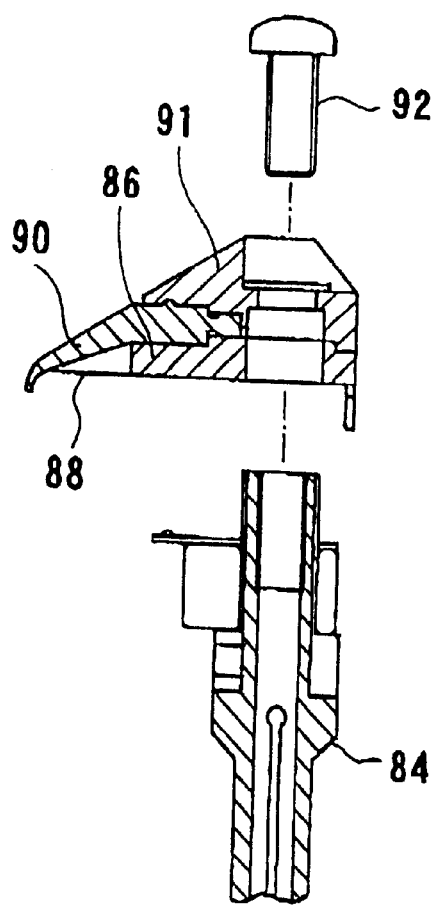

As shown in FIGS. 30A and 30B, the frame 86, the cathode electrodes 88, the sealing member 90, and a ring-shaped cover 91 covering an upper surface of the sealing member 90 are integrally combined and detachably fastened to the upper ends of the support columns 89 by bolts 92. Therefore, when these members are deteriorated, they can be replaced easily.

Since the lower ends of the teeth 89 of the cathode electrodes 88 are vertically pressed against the surface of the substrate W held by the substrate holder 36 and deformed elastically, particles are prevented from being produced due to frictional engagement of the cathode electrodes 88 with the substrate W. Because the lower ends of the teeth 89 are round, the contact resistance between the teeth 89 and the substrate w is relatively small. Furthermore, inasmuch as the positions for supplying electric energy from the cathode electrodes 88 to the substrate W are in an endmost area on the substrate W, e.g., at a distance E=0.5 mm from the substrate edge, and the thickness of the sealing member 90 is reduced as much as possible, the sealing position from the substrate edge can be reduced to about 1.5 mm, for example.

In the present embodiment, the cathode assembly 38 is vertically immovable, but is rotatable in unison with the substrate holder 36. However, the cathode assembly 38 may be arranged such that it is vertically movable and such that the sealing member 90 is pressed against the surface (to be plated) of the substrate W when the 20 cathode assembly 38 is lowered.

Figure 31:
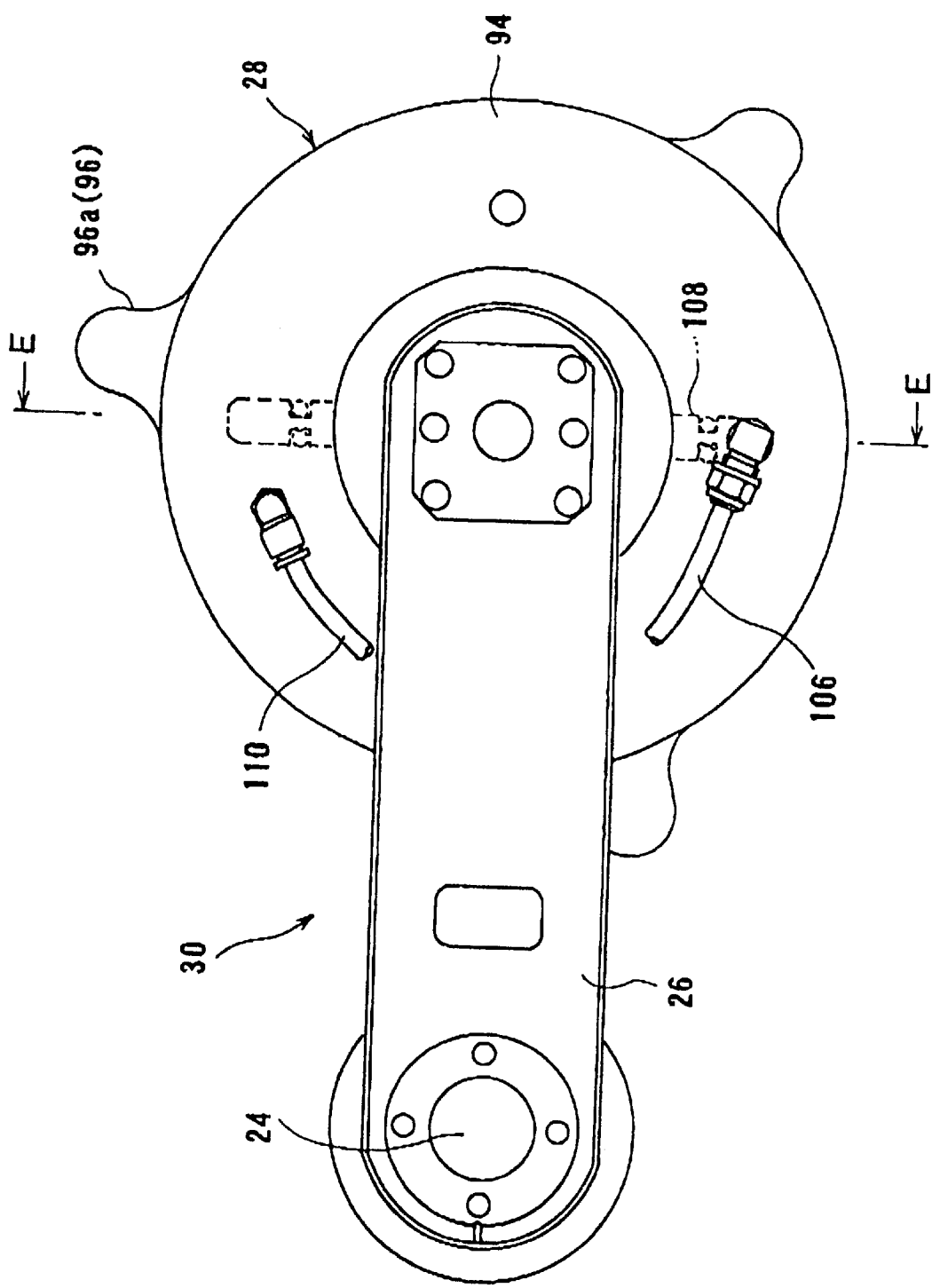
FIG. 31 is a plan view of an electrode arm.
Figure 33:
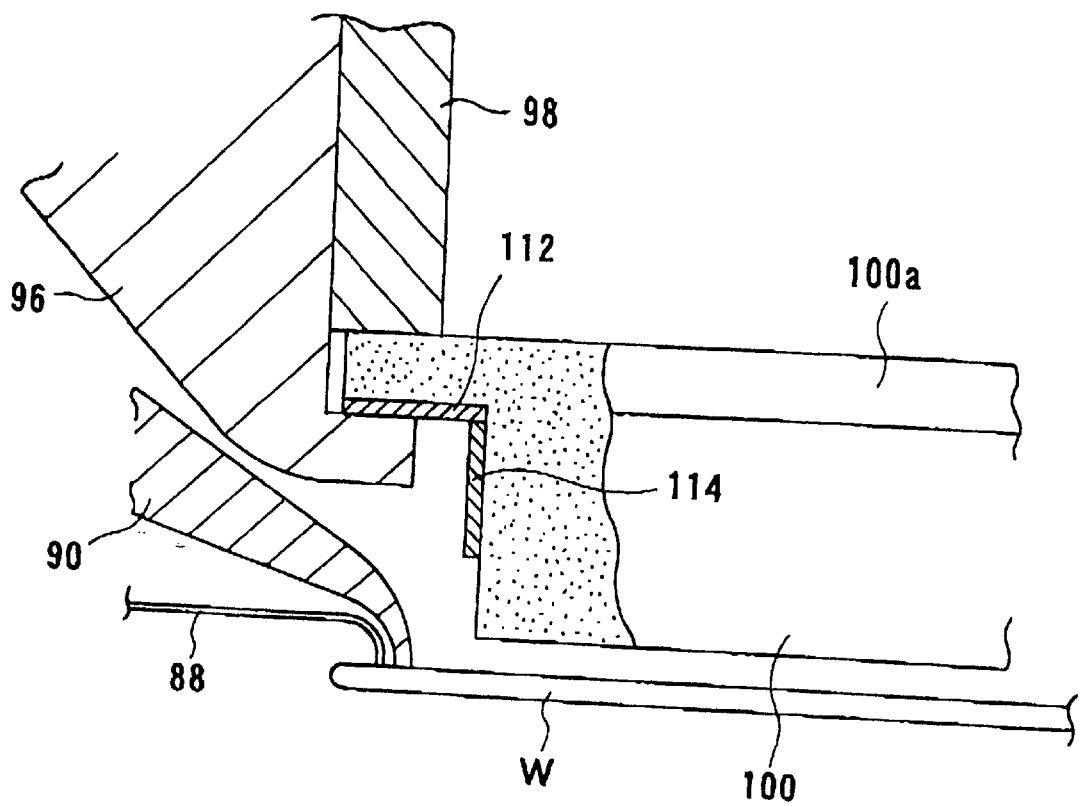
FIG. 33 is an enlarged fragmentary view of a portion shown in FIG. 32.

As shown in FIGS. 31 through 33, the electrode head 28 of the electrode arm assembly 30 comprises a disk-shaped lid 94 coupled to a free end of the swing arm 26 by play mechanisms 93, each of which comprises a shoulder bolt 93a, two sleeves 93b, and a spring 93c interposed between the sleeves 93b. A cylindrical housing 96 surrounds the lid 94, a plating liquid impregnated member 100 has an upper flange 100a gripped and fixed by the housing 96 and a hollow cylindrical support frame 98 disposed in the housing 96, and an anode 102 is placed and held on an upper surface of the plating liquid impregnated member 100. The plating liquid impregnated member 100 covers an opening in the housing 96, which has a suction chamber 104 defined therein. In the suction chamber 104, there is disposed a diametrically extending plating liquid inlet pipe 108 connected to a plating liquid supply pipe 106 which extends from the plating liquid supply unit 18 (see FIG. 10), and held in abutment against an upper surface of the anode 102. A plating liquid discharge pipe 110 communicating with the suction 10 chamber 104 is connected to the housing 96.

The plating liquid impregnated member 100 is made of a porous material, for example porous ceramics such as alumina, SiC, mullite, zirconia, titania, cordierite, or a sintered body of polypropylene, polyethylene, or the like. For example, a plating liquid impregnated member 100 made of alumina ceramics having a pore diameter ranging from 10 to 300 μm, a porosity ranging from 20 to 60%, and a thickness ranging from 5 to 20 mm, preferably ranging from 8 to 15 mm, may be used.

When the plating liquid impregnated member 100 is made of a hard material such as porous ceramics, it is important to fully seal a gap to prevent a current leakage in gripping and securing the flange 100a with the housing 96 and the hollow support frame 98 for the purpose of obtaining a uniformly plated surface. A sealing material that is used to seal the gap should preferably be a rubber material or a fluorine material that is resistant to chemicals. In the present embodiment, as shown in FIG. 33, a seal member 112 in the form of a gasket, for example, is interposed between the housing 96 and the lower surface of the flange 100a of the plating liquid impregnated member 100.

By controlling a current leakage from a side surface of an exposed portion of the plating liquid impregnated member 100, i.e., covering the side surface of the exposed portion of the plating liquid impregnated member 100 with a seal, and by changing the area of the seal, it is possible to control the thickness of a plated layer on the peripheral region of the substrate. In this embodiment, a given region on the side surface of the plating liquid impregnated member 100 is sealed by an annular seal (rubber band) 114. The annular seal 114 may be integrally combined with the seal member 112.

The plating liquid inlet pipe 108 is effective to supply the plating liquid uniformly to the surface to be plated if the plating liquid inlet pipe 108 has a manifold structure. Specifically, the plating liquid inlet pipe 108 has a plating liquid inlet passage 108a extending continuously in its longitudinal direction, and a plurality of plating liquid inlet ports 108b spaced at a given pitch along the plating liquid inlet passage 108a and extending downwardly therefrom in communication therewith. The anode 102 has a plurality of plating liquid supply ports 102a defined therein at positions corresponding to the plating liquid inlet ports 108b. The anode 102 also has a number of vertically extending-through holes 102b defined therein over its entire region. The plating liquid that is introduced from the plating liquid supply pipe 106 into the plating liquid inlet pipe 108 flows through the plating liquid inlet ports 108b and the plating liquid supply ports 102a to a position below the anode 102, and then flows through the plating liquid impregnated member 100 onto the surface of the substrate W to be plated. With the plating liquid being supplied to the plating liquid impregnated member 100 and the surface of the substrate W to be plated, the plating liquid discharge pipe 110 is evacuated to discharge the plating liquid in the plating liquid impregnated member 100 and the surface to be plated of the substrate W via the through holes 102b and the suction chamber 104 from the plating liquid discharge pipe 110.

In order to suppress the generation of slime, the anode 102 is made of copper containing 0.03 to 0.05% of phosphorus (phosphorus copper). When the anode 102 is made of phosphorus copper, a black film is formed on the surface of the anode 102 as the plating process progresses. The black film is made of a $Cu^+$ complex containing phosphorus and Cl, and comprises $Cu_2Cl_2.Cu_2O.Cu_3P$, etc. Since the black film suppresses a copper disproportionating reaction, it is important to stably form the black film on the surface of the anode 102 for the purpose of stabilizing the plating process. However, if the black film is dried and oxidized, and peeled off the anode 102, then it tends to produce particles.

In the present embodiment, the plating liquid impregnated member 100 made of a porous material with its side surface sealed is attached to the opening in the lower end of the housing 96, and the anode 102 is placed and held on the upper surface of the plating liquid impregnated member 100. The plating liquid impregnated member 100 is impregnated with the plating liquid to wet the surface of the anode 102, thereby preventing the black film from being peeled off onto the surface to be plated of the substrate W.

Because the plating liquid impregnated member 100 is made of a porous material, the plating liquid flows into the plating liquid impregnated member 100 to increase the electric resistance in the plating liquid impregnated member 100 to thereby make the thickness of the plated film uniform and to prevent particles from being produced.

Figure 34:
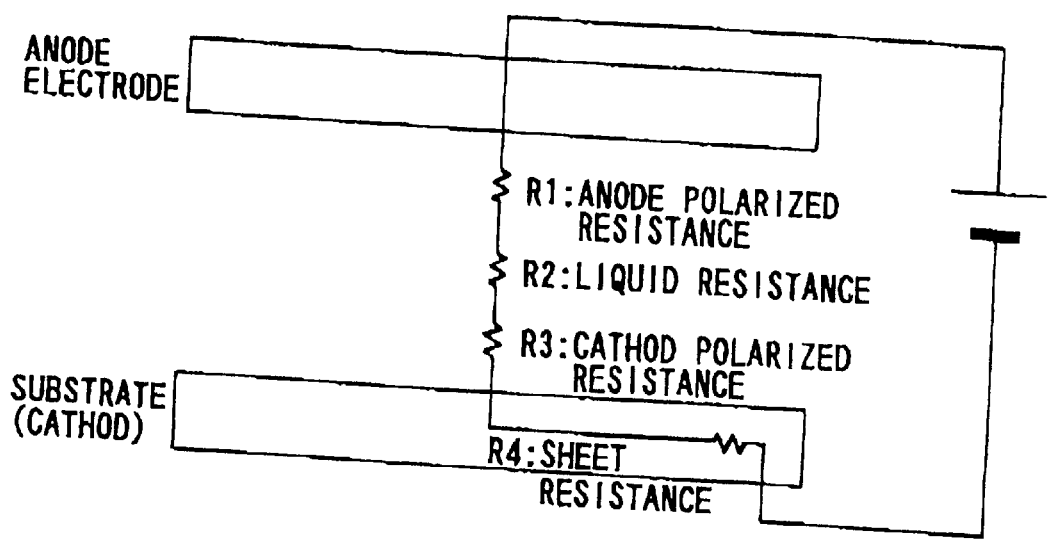
FIG. 34 is a circuit diagram of a circuit created when a substrate is plated.

Specifically, as schematically shown in FIG. 34, resistive elements which affect the distribution of the plane film thicknesses include (1) a liquid resistance R2, (2) polarized resistances R1, R3, and (3) a sheet resistance R4. If an interpolar distance is small, the liquid resistance R2 is reduced with the sheet resistance R4 becoming dominant. If the plating liquid impregnated member 100 is made of a porous material having a bent internal structure such as porous ceramics, then the electric resistance in the plating liquid impregnated member 100 is increased, giving the plating liquid impregnated member 100 an electric resistance greater than the liquid resistance corresponding to the interpolar distance. While it is also effective to increase the liquid resistance R2 and the polarized resistances R1, R3, an unduly large increase in the polarized resistances R1, R3 would be liable to impair the metal embedding characteristics of the interconnections.

With the anode 102 placed and held on the plating liquid impregnated member 100, even when the lower side of the anode 102 which is held in contact, with the plating liquid impregnated member 100 is dissolved as the plating process progresses, i.e., even when the anode 102 is dissolved until its thickness shown on a right side in FIG. 32 is reduced to a thickness shown on a left side in FIG. 32, it is not necessary to use a jig to fix the anode 102. However, the distance between the lower surface of the anode 102 and the substrate W is kept constant by the weight of the anode 102 itself, and air is prevented from entering and being trapped between the lower surface of the anode 102 and the substrate W.

When the substrate holder 36 is in the plating position H (see FIG. 13), the electrode head 28 is lowered until the gap between the substrate W held by the substrate holder 36 and the plating liquid impregnated member 100 becomes about 0.5 to 3 mm, for example. Then, the plating liquid is supplied from the plating liquid supply pipe 106 to fill the gap between the upper surface, to be plated, of the substrate W and the anode 102 while impregnating the plating liquid impregnated member 100 with the plating liquid, thus plating the upper surface of the substrate W.

Figure 26:
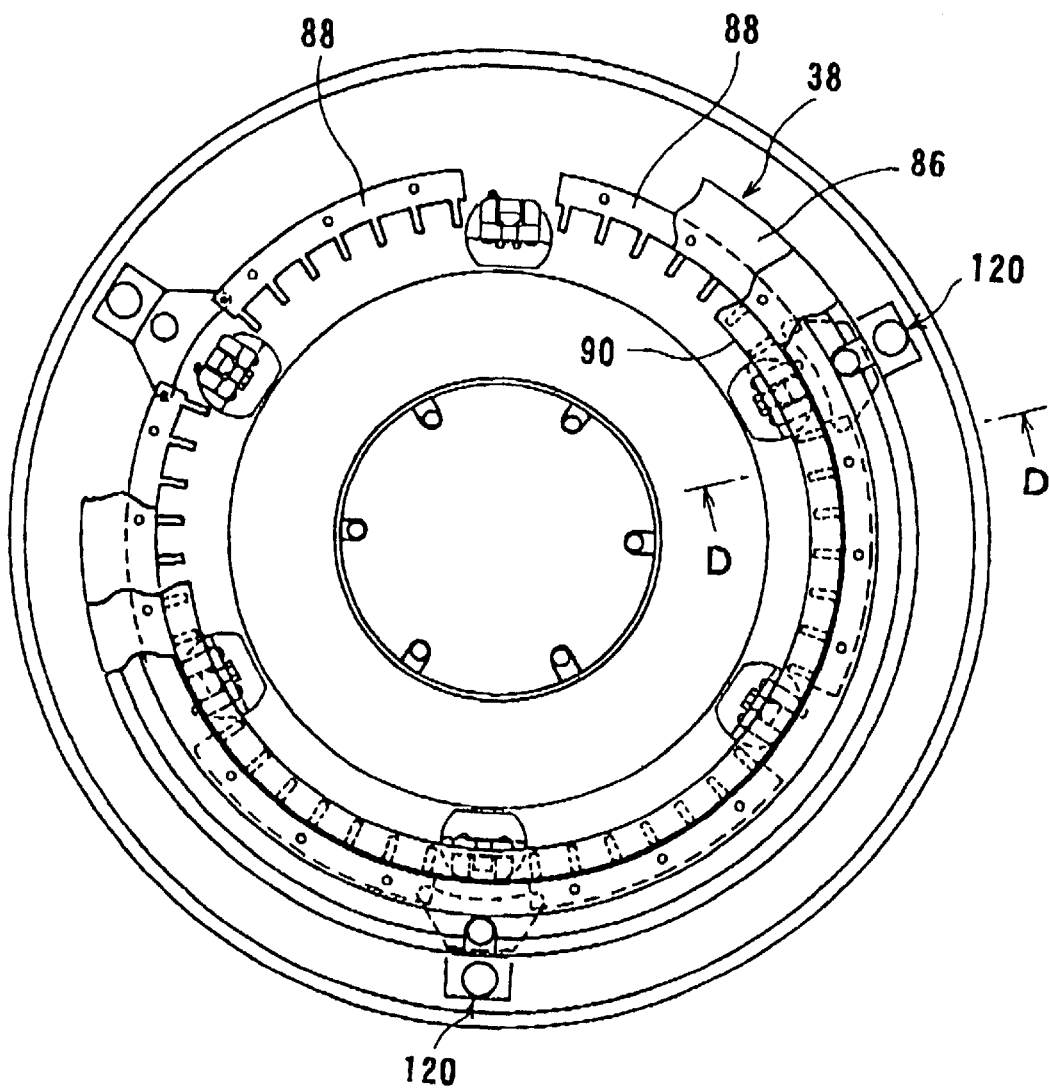
FIG. 26 is a plan view of a cathode assembly.
Figure 27:
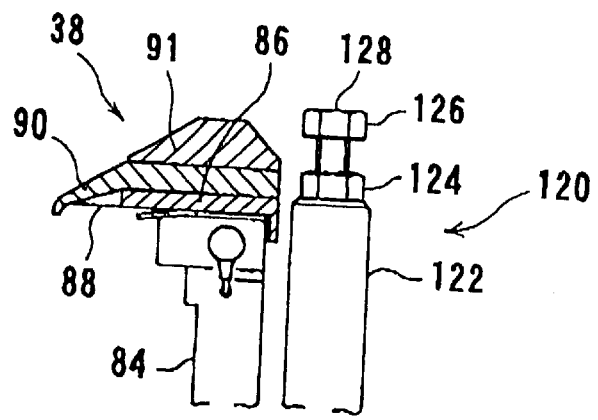
FIG. 27 is a cross-sectional view taken along line D—D of FIG. 26.
Figure 28:
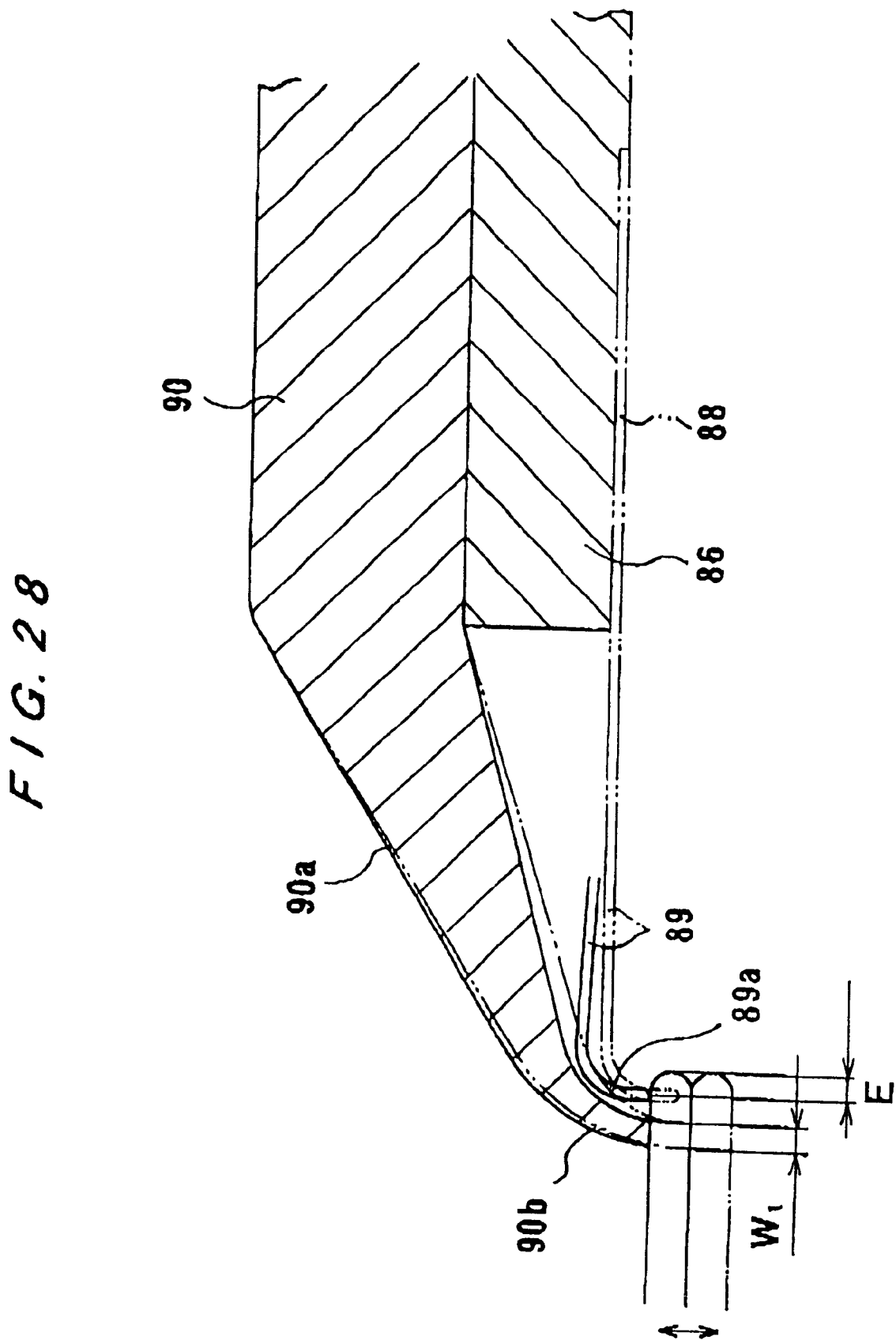
FIG. 28 is an enlarged fragmentary view of a portion shown in FIG. 27.

As shown in FIGS. 26, 27, and 32, the three fixing stoppers 120 are disposed at equal intervals spaced in the circumferential direction outwardly of the support columns 84 which support the cathode assembly 38, for making the anode 102 parallel to the substrate W, i.e., the cathode electrodes 88. Each of the fixing stoppers 120 comprises a stopper rod 122, a nut 124 fixed to an upper end of the stopper rod 122, and a bolt 126 threaded in the nut 124. The bolt 126 has a head whose upper surface serves as a stopper surface 128. When the electrode head 28 is lowered to a plating position by a motor for plating the substrate W, lobes 96a (see FIG. 31) of the housing 96 of the electrode head 28 abut against the stopper surfaces 128, thereby making the anode 102 parallel to the cathode electrodes 88.

When teaching the substrate plating apparatus, for example, the fixing stoppers 120 are vertically adjusted by adjusting the tightening of the nuts 124 in order to make the anode 102 parallel to the cathode electrodes 88 when the electrode head 28 abuts against the stopper surfaces 128 of the fixing stoppers 120. In this manner, positional repeatability of the electrode head 28 is increased, and a different electrode head 28 used to replace the old electrode head 28 can quickly be adjusted in position for making the current density on the substrate W uniform.

The play mechanisms 93 allow the electrode head 28 to have a vertical margin or play for making fine adjustments thereof when the electrode head 28 abuts against the stopper surfaces 128.

Figure 35:
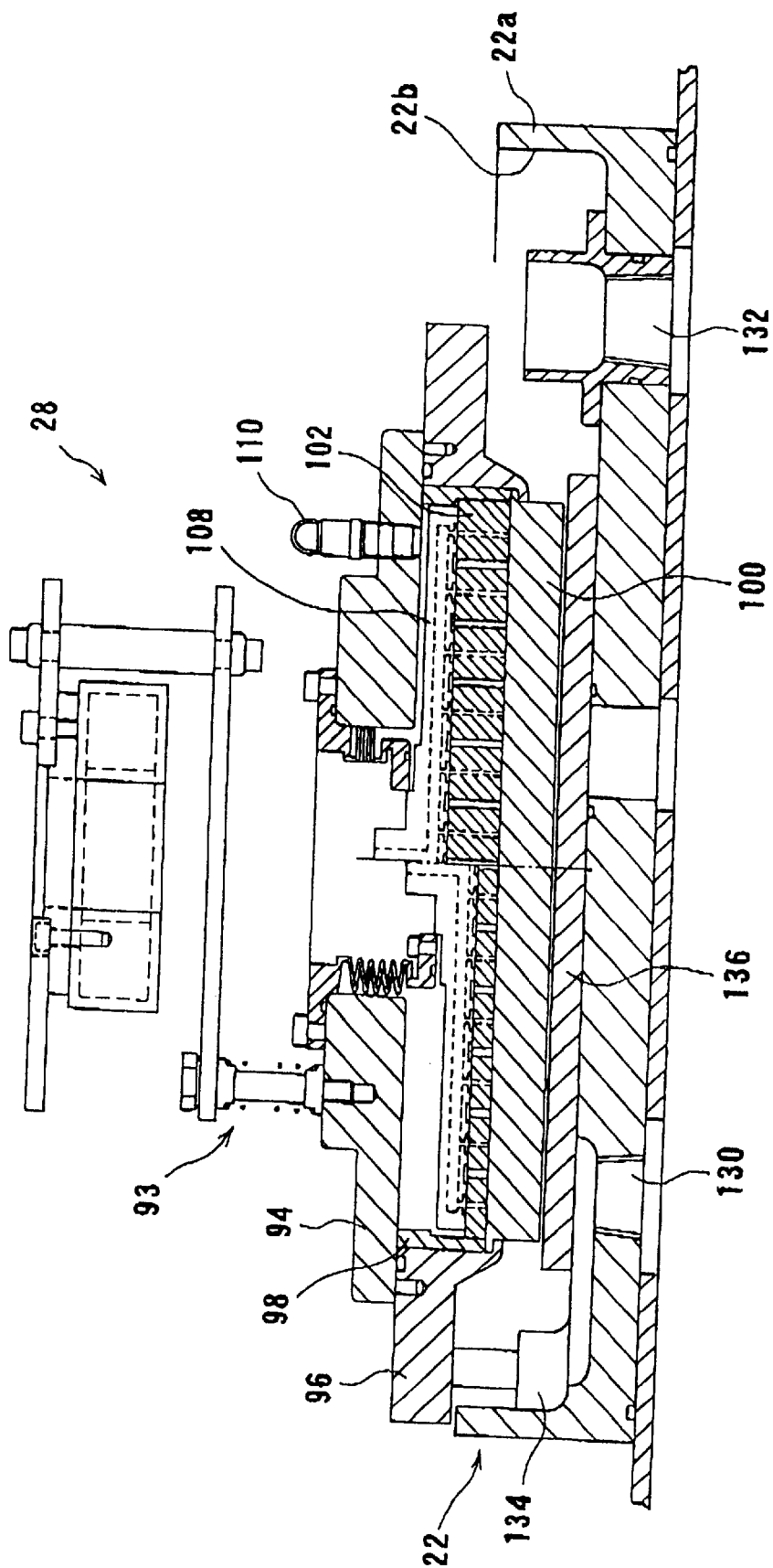
FIG. 35 is a cross-sectional view of a plating liquid tray and an electrode head.

As shown in FIG. 35, the plating liquid tray 22 has a plating liquid supply port 130, a plating liquid discharge port (not shown), and an overflow port 132. Stoppers 134 are disposed on a peripheral edge of the inner surface of the plating liquid tray 22 for abutting against the electrode head 28 to make the anode 102 parallel to the bottom surface of the plating liquid tray 22. A photosensor is attached to detect an overflow of the plating liquid from the plating liquid tray 22 and a discharge of the plating liquid from the plating liquid tray 22. Local air discharge ports are disposed around the plating liquid tray 22.

A dummy cathode 136 in the form of a disk of oxygen-free copper having a thickness of about 8 mm, for example, is attached to a bottom plate of the plating liquid tray 22. The dummy cathode 136 can be installed and removed by attaching and detaching the bottom plate of the plating liquid tray 22. With the dummy cathode 136 being mounted on the bottom plate of the plating liquid tray 22, the electrode head 28 is positioned in the plating liquid tray 22, the plating liquid is introduced into the plating liquid tray 22, and an electric current is supplied to perform conditioning of the anode 102 by way of dummy plating. A copper layer having a thickness of about 1 mm is grown on the surface of the dummy cathode 136 by dummy plating for a total time of 40 hours, for example. The dummy cathode 136 is replaced at a suitable time after a certain number of hours of dummy plating has been performed.

The plating liquid tray 22 is made of a material of poor wettability such as fluoroplatics, e.g., PTFE, or polyethylene, and has a continuous side wall 22a whose inner surface 22b extends vertically all around the plating liquid tray 22. The vertical inner side surface 22b having poor wettability prevents sulfate copper, etc. contained in the plating liquid in the plating liquid tray 22 from being precipitated on the vertical inner side surface 22b.

The plating liquid is mainly composed of $CuSO_4$ that is of a substantially saturated concentration. Therefore, the plating liquid in the plating liquid tray 22 which has a large area of contact with the atmosphere and a varying surface level would tend to precipitate crystals by evaporation, for example, on the inner side surface 22b, which would serve as nuclei and grow into larger solid crystals. If such crystals dropped into the plating liquid, then the plating liquid would fail to produce a good plated layer on the substrate W. However, since the plating liquid tray 22 is made of a material of poor wettability and its inner side surface 22b extends vertically, it is difficult for crystals to be precipitated on the inner side surface 22b.

Figure 36:
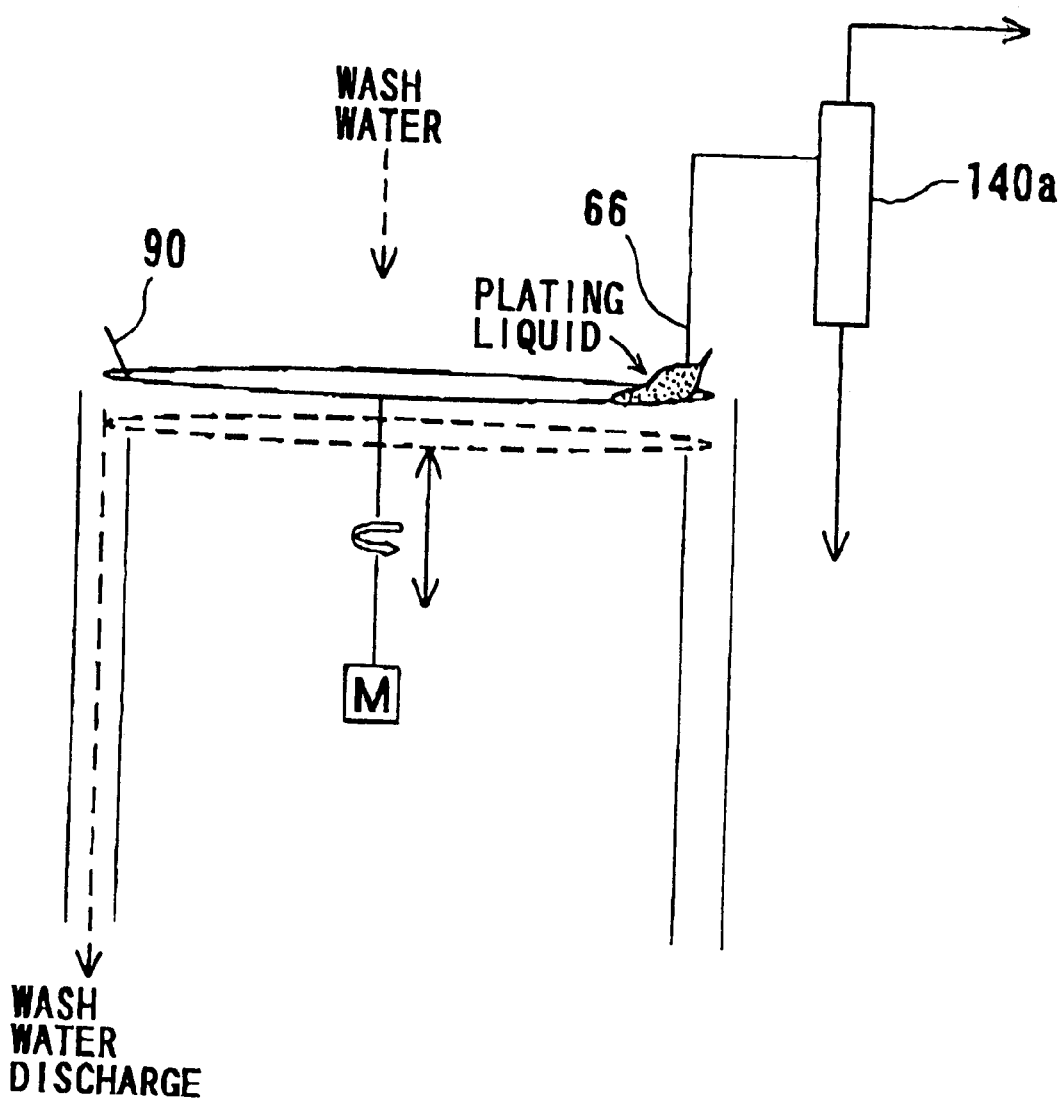
FIG. 36 is a view illustrative of the retrieval of a plating liquid left on an upper surface of a substrate.
Figure 37:
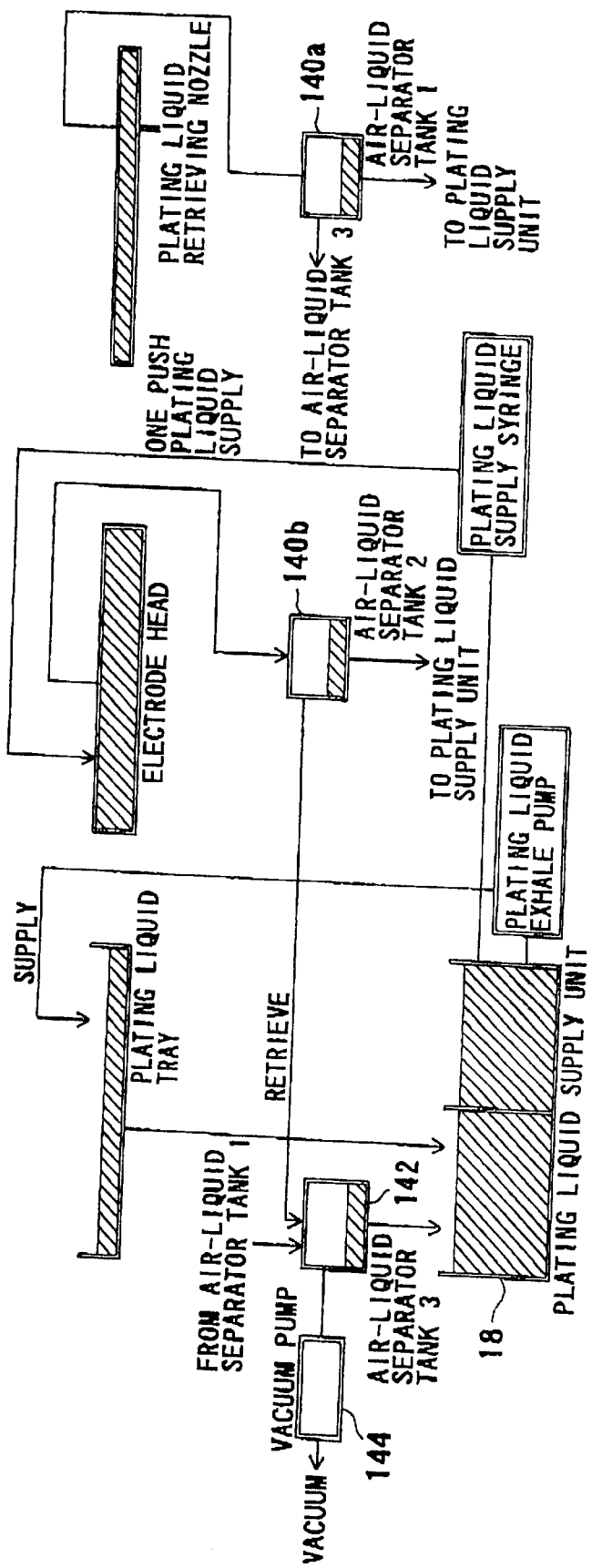
FIG. 37 is a flowchart of the supply and retrieval of a plating liquid.

A process of retrieving the plating liquid in the substrate plating apparatus will be described below with reference to FIGS. 36 and 37.

First, the plating liquid left on the substrate W is drawn and retrieved under a reduced air pressure by the plating liquid retrieving nozzle 66. At this time, the substrate W is rotated at a rotational speed of 100 $min^{-1}$ or less while its circumferential area is being sealed by the sealing member 90. The plating liquid that has been left on the upper surface of the substrate W after it was plated is forced to the sealing member 90 on the circumferential area of the substrate W under centrifugal forces generated upon rotation of the substrate W. The remaining plating liquid can thus be retrieved efficiently at a high retrieval rate. Accordingly, the plating liquid which is expensive can be replenished in a reduced quantity, and hence the load of drainage of the plating liquid can be reduced.

The plating liquid that is retrieved by the plating 20 liquid retrieving nozzle 66 contains a large amount of air. Therefore, the plating liquid is led to an air-liquid separator tank 140a, which separates the air and the plating liquid from each other. The separated plating liquid is returned to the drain side of the plating liquid supply unit 18, and the separated air is led to a second air-liquid separator tank 142.

The plating liquid is supplied from the supply side of the plating liquid supply unit 18 to the electrode head 28, and the plating liquid discharged from the electrode head 28 is led to an air-liquid separator tank 140b, which separates the air and the plating liquid from each other. The separated plating liquid is returned to the drain side of the plating liquid supply unit 18, and the separated air is led to a second air-liquid separator tank 142.

The plating liquid is supplied from the supply side of the plating liquid supply unit 18 to the plating liquid tray 22. The discharged plating liquid from the plating liquid tray 22 (including any overflow) is returned to the drain side of the plating liquid supply unit 18.

The second air-liquid separator tank 142 separates the air and the plating liquid again from each other. The separated plating liquid is returned to the drain side of the plating liquid supply unit 18, and the separated air is discharged from a vacuum pump 144.

As shown in FIG. 38, the substrate plating apparatus carries out a total of 18 steps for plating substrates W. Specifically, those 18 steps include 1. a precoating step, 2. a precoat drying step, 3. a plating liquid supplying step, 4. a plating step, 5. a plating liquid retrieving step in which a plating liquid is retrieved from the electrode head 28, 6. a rinsing step, 7. a water cleaning step, 8. a drying step, 9. a carrier coating step, 10. a carriercoat drying step, 11. a precoating step, 12. a precoat drying step, 13. a plating liquid supplying step, 14. a plating step, 15. a plating liquid retreiving step, 16. a rinsing step, 17. a water cleaning step, and 18. a drying step. Each of the plating steps comprises 9 more steps. Each of the above steps can be set to be used or not used as desired.

If only the 7. water cleaning step and the 8. drying step are set to be used and the other steps are set to not be used, then the substrate plating apparatus functions as a cleaning machine.

A plating process carried out by the substrate plating 5 apparatus according to the above embodiment will be described below.

First, a substrate W to be plated is removed from one of the loading/unloading units 10 by the transfer robot 14, and delivered, with the surface to be plated oriented upwardly, through the substrate loading and unloading port 50 defined in the side panel, and into one of the plating units 12. At this time, the substrate holder 36 is in the lower substrate transfer position A, and the electrode arm assembly 30 and the precoating/retrieving arm 32 are not positioned above the substrate holder 36, but located in a retracted position. After the hand of the transfer robot 14 has reached a position directly above the substrate stage 68, the hand of the transfer robot 14 is lowered to place the substrate W on the support arm 70. The hand of the transfer robot 14 is then retracted through the substrate loading and unloading port 50.

After the hand of the transfer robot 14 is retracted, the cup 40 is elevated. Then, the substrate holder 36 is lifted from the substrate transfer position A to the pretreating/cleaning position C. As the substrate holder 36 ascends, the substrate W placed on the support arms 70 is pressed toward the support arm 70a by the pressing finger 74 and then reliably gripped by the fixing fingers 76.

At this time, the electrode head 28 of the electrode arm assembly 30 is in a normal position over the plating liquid tray 22, and the plating liquid impregnated member 100 or the anode 102 is positioned in the plating liquid tray 22. At the same time that the cup 40 ascends, the plating liquid starts being supplied to the plating liquid tray 22 and the electrode head 28. Until the step of plating the substrate W is initiated, the new plating liquid is supplied, and the plating liquid discharge pipe 110 is evacuated to replace the plating liquid in the plating liquid impregnated member 100 and remove air bubbles from the plating liquid in the plating liquid impregnated member 100. When the ascending movement of the cup 40 is completed, the substrate loading and unloading port 50 in the side panel is closed by the cup 40, isolating the atmosphere in the side panel and the atmosphere outside of the side panel from each other.

When the cup 40 is elevated, the precoating step is initiated. Specifically, the substrate holder 36 that has received the substrate W is rotated, and the precoating/retrieving arm 32 is moved from the retracted position to a position confronting the substrate W. When the rotational speed of the substrate holder 36 reaches a preset value, the precoating nozzle 64a mounted on the tip end of the precoating/retrieving arm 32 intermittently discharges a precoating liquid which comprises a surface active agent, for example, toward the surface to be plated of the substrate W. At this time, since the substrate holder 36 is rotating, the precoating liquid spreads all over the surface to be plated of the substrate W. Then, the precoating/retrieving arm 32 is returned to the retracted position, and the rotational speed of the substrate holder 36 is increased to spin the precoating liquid off and dry the surface of the substrate W to be plated.

In the plating liquid tray 22, the plating liquid in the electrode head 28 is replaced, and air bubbles are removed from the plating liquid in the electrode head 28. Specifically, while the plating liquid is being supplied to the plating liquid tray 22, the vacuum pump is actuated to reach a pressure capable of drawing the plating liquid under suction. Then, a valve for retrieving the plating liquid is opened to draw the plating liquid in the plating liquid tray 22 through the electrode head 28. At this time, the plating liquid is drawn for a suction time of 0.5 second, for example. Thereafter, the valve is closed. The plating liquid may be drawn as many times as desired. After the plating liquid is drawn as many times as desired, the supply of the plating liquid to the plating liquid tray 22 is stopped, and the vacuum pump is shut off.

After the completion of the precoating step, the liquid supplying step is initiated. First, the rotation of the substrate holder 36 is stopped, or the rotational speed thereof is reduced to a preset rotational speed for plating. Thereafter, the substrate holder 36 is lifted to the plating position B. Then, the peripheral edge of the substrate W is brought into contact with the cathode electrodes 88, when it is possible to pass an electric current. At the same time, the sealing member 90 is pressed against the upper surface of the peripheral edge of the substrate W, thus sealing the peripheral edge of the substrate W in a water-tight fashion.

If the plating liquid impregnated member 100 is made of a spongy material, for example, other than a porous material such as porous ceramics or the like, then the electrode head 28 is lowered from the normal position in the plating liquid tray 22 to a pushed position to press the plating liquid impregnated member 100 against the bottom of the plating liquid tray 22 to squeeze the plating liquid out of the plating liquid impregnated member 100. In this manner, the plating liquid is prevented from dropping from the plating liquid impregnated member 100 when the electrode arm assembly 30 is lifted.

Based on a signal indicating that the precoating step for the loaded substrate W is completed, the electrode arm assembly 30 is swinged in a horizontal plane to displace the electrode head 28 from a position over the plating liquid tray 22 to a position over the plating position. After the electrode head 28 reaches the position over the plating position, the electrode head 28 is lowered toward the cathode assembly 38. When the descent of the electrode head 28 is completed, a plating current is supplied, and the plating liquid is supplied from the plating liquid supply pipe 106 into the electrode head 28, and then from the plating liquid supply ports 102a through the anode 102 to the plating liquid impregnated member 100. At this time, the plating liquid impregnated member 100 does not contact the surface of the substrate W to be plated, but is held closely to the surface to be plated of the substrate W at a distance ranging from 0.5 mm to 3 mm. The substrate holder 36 may be rotated at a desired rotational speed. Then, a current is passed under a constant voltage that has been set in the liquid supplying step, the plating liquid is forced out and drawn in, and the plating stop is carried out.

In the next plating step, the substrate W is plated with different control parameters stepwise. During the plating step, the plating liquid containing copper ions seeping out of the plating liquid impregnated member 100 is filled in the gap between the plating liquid impregnated member 100 and the surface to be plated of the substrate W, plating the surface of the substrate W with copper. The substrate holder 36 may be rotated in order to supply the plating liquid uniformly to the surface to be plated of the substrate W.

When the plating step is completed, the electrode arm assembly 30 is lifted and swinged back over the plating liquid tray 22, and lowered to the normal position. Then, the precoating/retrieving arm 32 is displaced from the retracted position to the position confronting the substrate W and then lowered, and the plating liquid retrieving nozzle 66 retrieves the plating liquid left on the substrate W. Specifically, the tip end of the plating liquid retrieving nozzle 66 is positioned near the seal members 90 on the peripheral region of the substrate W, and the plating liquid is drawn in through the plating liquid retrieving nozzle 66 while the substrate holder 36 is rotating at a preset rotational speed. At this time, since the substrate W is rotating, the plating liquid is forced into the peripheral region of the substrate W under centrifugal forces, and efficiently drawn in from the tip end of the plating liquid retrieving nozzle 25 66.

The plating liquid contained in the electrode head 28 can also simultaneously be retrieved. When the electrode head 28 starts ascending after the completion of the plating step, the valve for retrieving the plating liquid in the electrode head 28 is opened to draw the plating liquid for a period of time which may be set to a desired value. The vacuum pump operates to retrieve the plating liquid in the same manner as when it operates to retrieve the plating liquid for liquid replacement.

Then, the precoating/retrieving arm 32 is lifted back to the retracted position. In order to rinse the plated surface of the substrate W, one of the fixed nozzles 34 ejects pure water to the central region of the substrate W, and the substrate holder 36 is simultaneously rotated at an increased speed to replace a small amount of plating liquid left on the surface of the substrate W with pure water and also to clean the sealing member 90. By thus rinsing the substrate W, when the substrate W is disengaged from the cathode assembly 38 which has sealed the peripheral region of the substrate W following descent of the substrate holder 36 from the plating position H, the plating liquid is prevented from flowing around to contaminate the reverse side of the substrate W and the cathode electrodes 88 of the cathode assembly 38.

After the rinsing step, the water cleaning step is started. Specifically, the substrate holder 36 is lowered from the plating position H to the pretreating/cleaning position C, and while pure water is being supplied from the fixed nozzle 34 and the substrate holder 36 and the cathode assembly 38 are being rotated, the substrate W is cleaned by the pure water. At this time, pure water directly supplied to the cathode assembly 38 or pure water scattered from the surface of the substrate W cleans the sealing member 90 and the cathode electrodes 88 at the same time that the substrate W is cleaned.

After the water cleaning step, the drying step is initiated. Specifically, the supply of pure water from the fixed nozzle 34 is stopped, and the substrate holder 36 and the cathode assembly 38 are rotated at an increased speed to spin off the pure water from the surface of the substrate W under centrifugal forces, thus drying the substrate W. Since the cathode assembly 38 is also rotated, the sealing member 90 and the cathode electrodes 88 are 10 also dried.

The consecutive steps of pretreating, plating, cleaning, and drying are now completed. If necessary, these steps are carried out again in a second cycle. When these steps are carried out again, the carrier coating step is performed first. Specifically, the precoating/retrieving arm 32 with the carrier coating nozzle 64b is moved from the retracted position to the position confronting the substrate W. When the rotational speed of the substrate holder 36 reaches a preset value, the carrier coating nozzle 64b on the tip end of the precoating/retrieving arm 32 ejects a carrier coating liquid, such as a sulfur compound or the like, to the plated surface of the substrate W. Because the substrate holder 36 is in rotation, the carrier coating liquid is spread all over the surface of the substrate W. Then, the precoating/retrieving arm 32 is returned to the retracted position, and the rotational speed of the substrate holder 36 is increased to spin off the carrier coating liquid from the upper surface of the substrate W under centrifugal forces, thus drying the substrate W. A subsequent process is the same as the above steps carried out in the first cycle. In the second cycle, however, the precoating step may be selectively carried out or not, and the details of the liquid supplying step and the plating step may be set differently from those in the first cycle.

When the drying step is completed, the rotation of the substrate holder 36 and the cathode assembly 38 is stopped, and the substrate holder 36 is lowered to the substrate transfer position A. The fixing fingers 76 release the substrate W, which is then placed on the upper surface of the support arms 70. Then, the cup 40 is lowered.

All the steps including the plating step, the pretreating step, the cleaning step, and the drying step are now finished. The transfer robot 14 inserts its hand through the substrate loading and unloading port 50 into the position beneath the substrate W, and raises the hand to receive the processed substrate W from the substrate holder 36. Then, the transfer robot 14 returns the processed substrate W received from the substrate holder 36 to one of the loading/unloading units 10.

A process of conditioning of the anode 102 will be described below. The substrate plating apparatus has a function to perform conditioning of the anode 102 mounted on the electrode head 28 within the plating liquid tray 22. The conditioning is carried out by way of (1) dummy plating, (2) anode drying prevention, and (3) liquid replacement. The electrode head 28 is movable between the position above the substrate holder 36 for plating the substrate W and the retracted position over the plating liquid tray 22. When conditioning of the anode 102 is carried out, the electrode head 28 is controlled for its height between the pushed position and the normal position over the plating liquid tray 22.

(1) Dummy Plating:

The dummy plating is performed to condition the anode 102 for the purpose of stabilizing the quality and rate of plating before a main plating process is carried out. The dummy cathode 136 in the form of a disk of oxygen-free copper having a thickness of about 8 mm, for example, is attached to the bottom plate of the plating liquid tray 22. After the electrode head 28 is moved into the plating liquid tray 22, the plating liquid is supplied to the plating liquid tray 22, and a current is passed between the anode 102 and the dummy cathode 136 to perform dummy plating. Since a copper layer having a thickness of about 1 mm is grown on the surface of the dummy cathode 136 by dummy plating for a total time of 40 hours, the dummy cathode 136 is replaced at a suitable time after a number of hours of dummy plating has been performed. The dummy plating process is controlled as described below.

The dummy plating process can be set to either a fixed count mode of operation or a fixed time mode of operation as a dummy plating operation. If the dummy plating process is set to the fixed count mode of operation, the dummy plating process is carried out when triggered by operating a dummy plating switch on a control image displayed on a display unit. If the dummy plating process is set to the fixed time mode of operation, then the dummy plating process is carried out when triggered by the elapse of a period of time which has been set as a dummy plating interval in a timer.

The dummy plating process is carried out successively through a liquid replacing step, a discharging step, and a constant current supplying step. In the liquid replacing step and the discharging step, while the plating liquid is being supplied to the plating liquid tray 22, the electrode head 28 is positioned in the plating liquid in the plating liquid tray 22, and the plating liquid is repeatedly retrieved from the electrode head 28 and supplied to the electrode head 28 to replace, and remove, air bubbles from the plating liquid in the electrode head 28 and the plating liquid impregnated in the plating liquid impregnated member 100. In each of the liquid replacing step and the discharging step, the number of times that the plating liquid is repeatedly retrieved and supplied can be set as an operating parameter to a value in a range from 0 to 5. For example, if the operating parameter is set to "2" in the liquid replacing step and set to "3" in the discharging step, then the plating liquid is retrieved twice from the electrode head 28, and thereafter the plating liquid is supplied three times to the electrode head 28. Finally, in the constant current supplying step, a constant current is supplied from the anode 102 to the dummy cathode 136. Parameters used in the constant current supplying step include a time ranging from 0 to 9999 minutes and a current ranging from 0.0 to 10.0 A. Another parameter that is available in the constant current supplying step represents whether the plating liquid is to be supplied to the plating liquid tray 22 or not specifically, this parameter indicates whether the plating liquid is to be newly supplied to the plating liquid tray 22 or not while the constant current is flowing.

The above three steps make up one sequence of the dummy plating process. In the fixed count mode of operation, it possible to set the number of times that the above sequence of the dummy plating process is to be carried out to a value in a range from 0 to 10. For example, if the number of times that the above sequence of the dummy plating process is to be carried out is set to 2, then the above three steps are carried out twice, and the dummy plating process is put to an end in the fixed time mode of operation, the above sequence is carried out once, but intervals for the sequence can be set to a value ranging from 0 to 9999 minutes. Usually, the fixed count mode of operation is selected, and the dummy plating process is triggered by operating the dummy plating switch on the displayed control image. However, if the anode is retracted in the plating liquid tray 22 for a long period of time, then the fixed count mode of operation is changed to the fixed time mode of operation to perform the dummy plating process, unattended, at periodic intervals. If the dummy plating process is performed in this manner, then since a copper layer having a thickness of about 1 mm is grown on the surface of the dummy cathode 136 by dummy plating for a total time of 40 hours, the dummy cathode 136 is replaced at a suitable time after a certain number of hours of dummy plating has been performed.

(2) Anode Drying Prevention:

The anode 102 needs to be kept wet with the plating liquid at all times. If the anode 102 were dried, a black film formed on the surface of the anode 102 would be oxidized and modified to lower the plating capability of the anode 102. The anode 102 can be maintained in a best condition at all times by being retracted in the plating liquid tray 22 when no plating process is performed.

(3) Liquid Replacement:

The liquid replacement is performed to replace, and remove, air bubbles from the plating liquid in the electrode head 28 or the plating liquid contained in the plating liquid impregnated member 100 with new plating liquid, and is performed at the dummy plating process and any desired time in the plating process.

In this embodiment, while the substrate W is being held with its face up by the substrate holder 36, the plating step and other steps including the pretreatment and cleaning and drying steps associated with the plating step can be carried out before and after the plating step. Therefore, all the steps of the plating process can be carried out by the single plating apparatus, which is simplified and takes up a small installation area. The plating apparatus can be reduced in size and increased in controllability as a single unit, and has excellent maintainability. Since the plating apparatus can be installed as a plating unit on another semiconductor fabrication apparatus, it provides advantages in clustering a series of interconnection forming steps including plating, annealing, and CMP steps.

Dual-Stage Electrolytic Plating Apparatus

FIG. 39 shows a plan view of a substrate processing apparatus according to still another embodiment of the present invention, which is applied to a dual-stage plating apparatus. As shown in FIG. 39, the dual-stage plating apparatus (substrate processing apparatus) has a facility which houses therein two loading/unloading units 310, 310 for placing therein a plurality of substrates W, two plating units 312, 312 for plating and performing a supplementary process, and a transfer robot 314 for transferring substrates W between the loading/unloading units 310, 310 and the plating units 312, 312.

Each of the plating units 312 comprises a substrate treating device 320 for plating and performing a supplementary process, and two retracting portions 322 disposed adjacent to the substrate treating device 320 for retracting first and second anode heads (i.e., substrate treating heads with respective treatment-head electrodes) 330-1, 3302, respectively. The first and second anode heads 330-1, 330-2 are supported respectively on distal ends of two swing arms 326 that are swingable about a shaft 324. The first and second anode heads 330-1, 330-2 are swingable between the substrate treating device 320 and one of the retracting portions 322, and are also vertically movable. Alongside the substrate treating device 320, there are disposed a precoating/retrieving arm 332 and a plurality of fixed nozzles 334 for ejecting pure water or a chemical liquid such as ion water or the like onto a substrate W. One of the fixed nozzles 334 is used to supply pure water.

Figure 40:
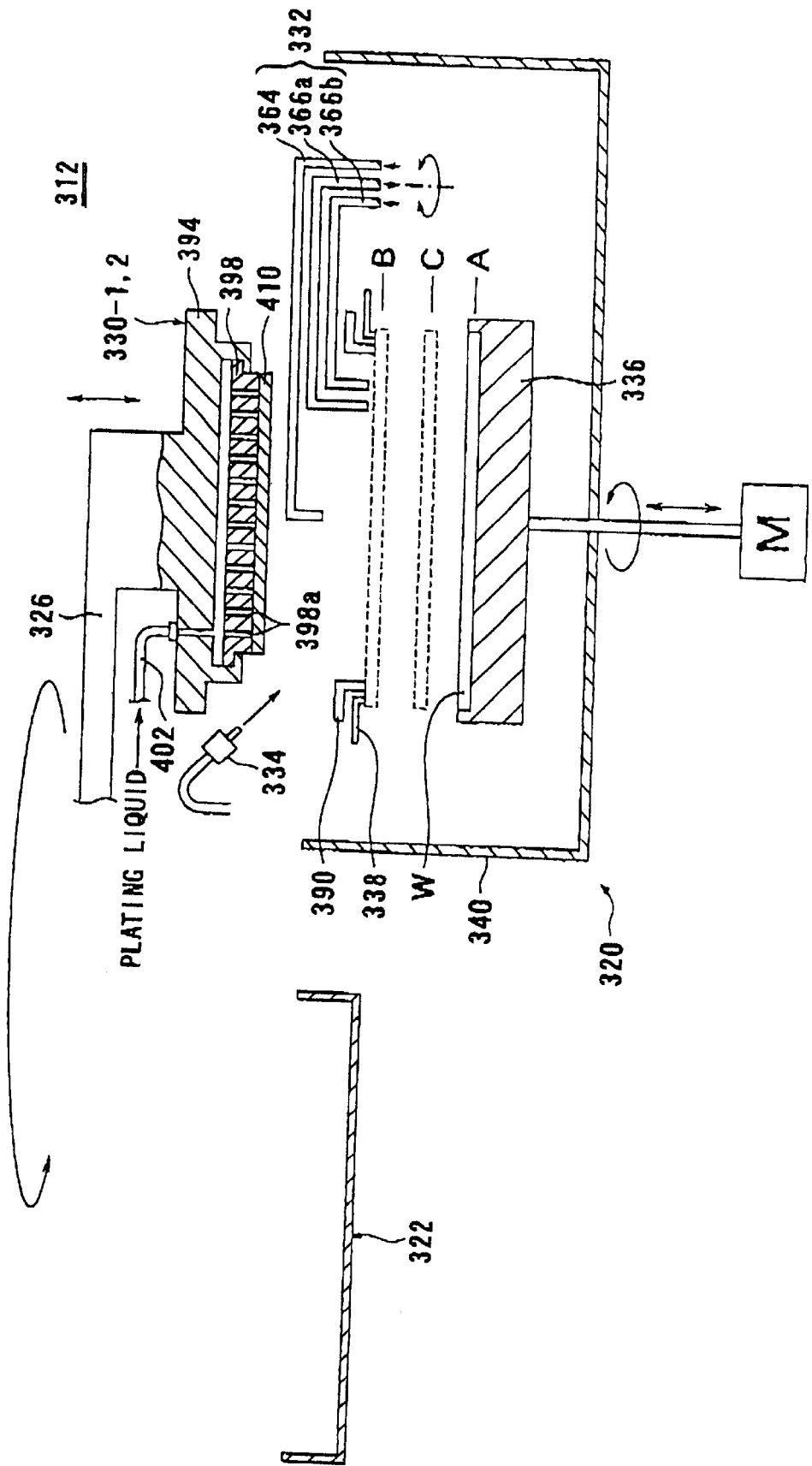
FIG. 40 is a schematic cross-sectional view of a plating unit.

FIG. 40 shows a portion of each of the plating units 312 in fragmentary cross section. As shown in FIG. 40, the substrate treating device 320 comprises a substrate holder 336 for holding a substrate W with its surface to be plated (i.e., treatment surface) oriented upwardly, cathodes (i.e., treatment-surface-contacting electrodes) 338 disposed above the substrate holder 336 so as to surround the periphery of the substrate holder 336, and an annular sealing member 390 disposed above cathodes 338 in covering relation thereto. A bottomed cup 340 is disposed around the substrate holder 336 for preventing various chemical liquids used for substrate treatment from being scattered around. The substrate W may be fixed to the substrate holder 336 by fingers, not shown, or by being attracted under vacuum.

The cathodes 338 and the sealing member 390 are vertically immovable and are rotatable in unison with the substrate holder 336. When the substrate holder 336 ascends to a plating position B, the tip ends of the cathodes 338 are pressed against the peripheral edge of the substrate W held by the substrate holder 336 to supply an electric current thereto. At the same time, the tip end of the sealing member 390 is pressed against the upper surface of the peripheral edge of the substrate W to seal the peripheral edge of the substrate W in a water-tight fashion, thereby preventing the plating liquid supplied to the upper treatment surface of the substrate W from seeping out of the end of the substrate W and from contaminating the cathode 338.

The substrate holder 336 is vertically movable between a lower substrate transfer position A, an upper plating position B, and an pretreating/cleaning position C between the lower substrate transfer position A and the upper plating position B. The substrate holder 336 can be rotated in unison with the cathode 338 at a desired rotational speed by a motor M. When the substrate holder 336 is elevated to the plating position B, the tip ends of the cathodes 338 and the tip end of the sealing member 390 are brought into abutment against a peripheral region of the substrate W that is held by the substrate holder 336.

The retracting portions 322 serve to keep a plating liquid impregnated member 410 and an anode 398 (to be described later) of the anode heads 330-1, 330-2, wet with the plating liquid when not in the plating process. The retracting portions 322 are of such a size as to be able to accommodate a plating liquid impregnated member 410.

The precoating/retrieving arm 332 has three nozzles, i.e., a precoating nozzle 364 for ejecting a precoating liquid, and nozzles 336a, 336b for retrieving the plating liquid. The precoating/retrieving arm 332 is swingable about a support shaft 358 and is also vertically movable. In FIG. 40, the nozzles 364, 336a, 336b are shown as being separate from each other for illustrative purpose. Actually, as shown in FIG. 39, the nozzles 364, 336a, 336b are integrally mounted on a turn arm 332a.

Each of the first and second anode heads 330-1, 330-2 has a housing 394 with an anode 398 mounted on a lower surface thereof, a plating liquid impregnated member 410 made of a water retaining material which is mounted on a lower surface of the anode 398 so as to cover the anode 398 in its entirety, and a plating liquid supply pipe 402 connected to an upper portion of the housing 394. The anode 398 has a number of plating liquid supply ports 398a for supplying the plating liquid (electrolytic treating liquid) from the plating liquid supply pipe 402 therethrough to the plating liquid impregnated member 410. The plating liquid impregnated member 410 serves to keep the surface of the anode 398 wet at all times to prevent a black film, which is formed on the surface of the anode 398 by the action of the plating liquid, from being dried and oxidized, and peeling off the anode 398 as particles. The plating liquid supply pipe 402, the plating liquid supply ports 398a, and the plating liquid impregnated member 410 for supplying the plating liquid jointly make up a substrate treating liquid supply mechanism.

Each of the first and second anode heads 330-1, 330-2 is lowered until the gap between the substrate W held by the substrate holder 336 and the plating liquid impregnated member 410 when the substrate holder 336 is in the plating position B is in the range from 0.5 to 3.0 mm. Then, the plating liquid supply pipe 402 supplies the plating liquid to impregnate the plating liquid impregnated member 410, and also supplies the plating liquid between the surface to be plated of the substrate W and the anode 398 to plate the surface of the substrate W.

The first and second anode heads 330-1, 330-2 are identical in construction to each other, but use different plating liquids. The first and second anode heads 330-1, 330-2 used in combination with one plating stage allow a plurality of types of plating liquids to be used with respect to a single cell.

A specific example of the operation of the multi-stage plating apparatus shown in FIGS. 39 and 40 will be described below. A plating liquid for use in a first-stage plating process and a plating liquid for use in a second-stage plating process are as follows:

First-stage plating process: Copper Pyrophosphate plating
  Bath composition: $Cu_2P_2O_7$: 65 g/L, $K_2P_2O_7$: 240 g/L, $NH_4OH$: 2 mL/L, P ratio (molar ratio of copper and total pyrophosphoric acid): 7.5, pH: 8.5
  Bath temperature: 55° C.
  Anode: Oxygen-free copper
  Current density: 25 mA/$cm_2$
Second-stage plating process: Copper sulfate plating
  Bath composition: $CuSO_4.5H_2O$: 225 g/L, $H_2SO_4$: 55 g/L, Cl: 60 mg/L Additive: Ebatronfill (manufactured by Ebara-Udylite Co., Ltd.)
  Bath temperature: 25° C.
  Anode: Copper containing phosphorus
  Current density: 25 mA/$cm_2$ The substrate W that is used comprises an 8-inch silicon wafer having an interconnection pattern with a width of 0.13 Nm 10 and an aspect ratio of 6.0, and a barrier metal of TaN and a seed layer of Cu are deposited to respective thicknesses of 10 nm and 20 nm on the SiO$_2$ base by sputtering.

First, the substrate W to be plated is removed from one of the loading/unloading units 310 shown in FIG. 39 by the transfer robot 314, and then placed, with its surface to be plated (i.e., treatment surface) oriented upwardly, on the substrate holder 336 of one of the substrate treating portions 320. At this time, the substrate holder 336 is in the substrate transfer position A (see FIG. 40).

Then, the substrate holder 336 is elevated to the pretreating/cleaning position C. The precoating/retrieving arm 332 which has been in the retracted position as shown in FIG. 39 is lowered, while being turned, toward the upper treatment surface of the substrate W, as shown in FIG. 40. While the substrate holder 336 is in rotation, the precoating nozzle 364 discharges a precoating liquid which comprises a surface active agent, for example, toward the surface of the substrate W to be plated, so that the precoating liquid spreads all over the surface to be plated. Then, the precoating/retrieving arm 332 is returned to the retracted position, and the rotational speed of the substrate holder 336 is increased to spin the precoating liquid off and dry the surface of the substrate W to be plated.

The rotation of the substrate holder 336 is then stopped or its rotational speed is reduced, and the substrate holder 336 is lifted to the plating position H. The tip ends of the cathodes 338 and the sealing member 390 are brought into abutment against the peripheral edge of the substrate W, allowing an electric current to be supplied, and sealing the peripheral edge of the substrate W in a water-tight manner.

The first anode head 330-1 (which has been in the retracting portion 322) is rotated and moved to a position above the substrate W, and then lowered to the position described above over the substrate W. When the descent of the anode head 330-1 is completed, the plating liquid supply pipe 402 supplies 50 mL of the plating liquid (pyrophosphoric acid plating liquid) in the first-stage plating process via the anode 398 to the plating liquid impregnated member 410, filling the plating liquid in the gap between the plating liquid impregnated member 410 and the surface of the substrate W to be plated. A plating current is then supplied to plate the substrate W for 2.5 seconds, precipitating Cu to a thickness of 20 nm on the substrate W.

The pyrophosphoric acid plating process has a high uniform electrodeposition capability due to its bath characteristics of high overvoltage, allowing copper to be grown to a uniform thickness on interconnection side walls and bottom walls where the seed layer is fragile. Since the pyrophosphoric acid plating process needs a high bath temperature of 55° C., the plating liquid is heated for use in this manner, a uniform seed layer for the second-stage plating process is formed by the first-stage plating process.

After the first-stage plating process is completed, the first anode head 330-1 is lifted and turned back to the retracting portion 322. Then, the precoating/retrieving arm 332 is moved from the retracted position to a position above the substrate W and then lowered, after which one of the nozzles 336a retrieves the remaining plating liquid on the substrate W. After the retrieval of the plating liquid, the precoating/retrieving arm 332 is returned to the retracted position. For rinsing the plated surface of the substrate W, the fixed nozzle 334 discharges pure water to the central region of the substrate W, and the substrate holder 336 is rotated to replace the plating liquid on the plated surface with the pure water.

After the substrate W is rinsed, the substrate holder 336 is lowered from the plating position B to the pretreating/cleaning position C. While pure water is being supplied from the fixed nozzle 334, the substrate holder 336 and the cathode 338 are rotated to clean the substrate W with the pure water. Then, the supply of pure water from the fixed nozzle 334 is stopped, and the rotational speed of the substrate holder 336 is increased to spin-dry the substrate W.

Then, the second anode head 330-2 which has been in the retracting portion 322 is turned and moved to a position above the substrate W, after which it plates the plated treatment surface of the substrate W in the same manner as the first anode head 330-1. At this time, the above copper sulfate plating liquid is employed. Specifically, 50 mL of the copper sulfate plating liquid is supplied to plate the substrate W for 15 seconds to precipitate Cu to a thickness of 125 nm. The copper sulfate bath has a lower uniform electrodeposition capability than the pyrophosphoric acid path because of a lower overvoltage. However, the additive added to promote copper precipitation allows current to concentrate in interconnections, causing copper to be precipitated from the bottom of the interconnections. As a result, plated interconnections are free of voids.

After the completion of the second-stage plating process, the second anode head 330-2 is moved back to the retracting portion 322. Then, the precoating/retrieving arm 332 is moved from the retracted position to a position above the substrate W and then lowered, after which the other nozzle 336b retrieves the remaining plating liquid on the substrate W. Thereafter, the precoating/retrieving arm 332 is returned to the retracted position. Subsequently, the plated surface of the substrate W is rinsed, cleaned, and spin-dried in the same manner as with the first anode head 330-1.

Then, the substrate holder 336 is stopped and lowered to the substrate transfer position A. The transfer robot 314 removes the substrate W from the plating unit 312, and returns the substrate W to the loading/unloading unit 310.

In the present embodiment, as described above, the plural anode heads 330-1, 330-2 combined with the single substrate treating device 320 allow a substrate W to be plated according to a series of plating processes having different characteristics. This arrangement makes it possible to embed fine interconnections which have heretofore been difficult to embed according to the conventional single-stage plating process.

In the above specific example of operation of the multistage plating apparatus, after the substrate is plated according to the first-stage plating process, the substrate is cleaned and dried, and then plated according to the second-stage plating process. However, the cleaning and drying steps after the first-stage plating process may be omitted. If the cleaning and drying steps after the first-stage plating process are omitted, then since the substrate which is wet is processed by the second-stage plating process, the plated layer formed by the first-stage plating process is less liable to be oxidized, and hence can stably be processed by the second-stage plating process.

Because the multi-stage plating apparatus processes the substrate W with its surface to be plated oriented upwardly at all times, the multi-stage plating apparatus does not need to have a substrate inverting device, and hence can be reduced in size.

In order to supply a plurality of types of plating liquids to the surface to be plated of the substrate W, it is preferable to provide a single substrate treating device 320 (single plating cell) with a plurality of plating liquid supplying means and plating liquid retrieving means. Since it is not preferable for plating liquids of different compositions to be mixed with each other, a plurality of anodes 398 and plating liquid impregnated members 410 should be provided per single substrate treating device 320 (single plating cell).

Figure 41:
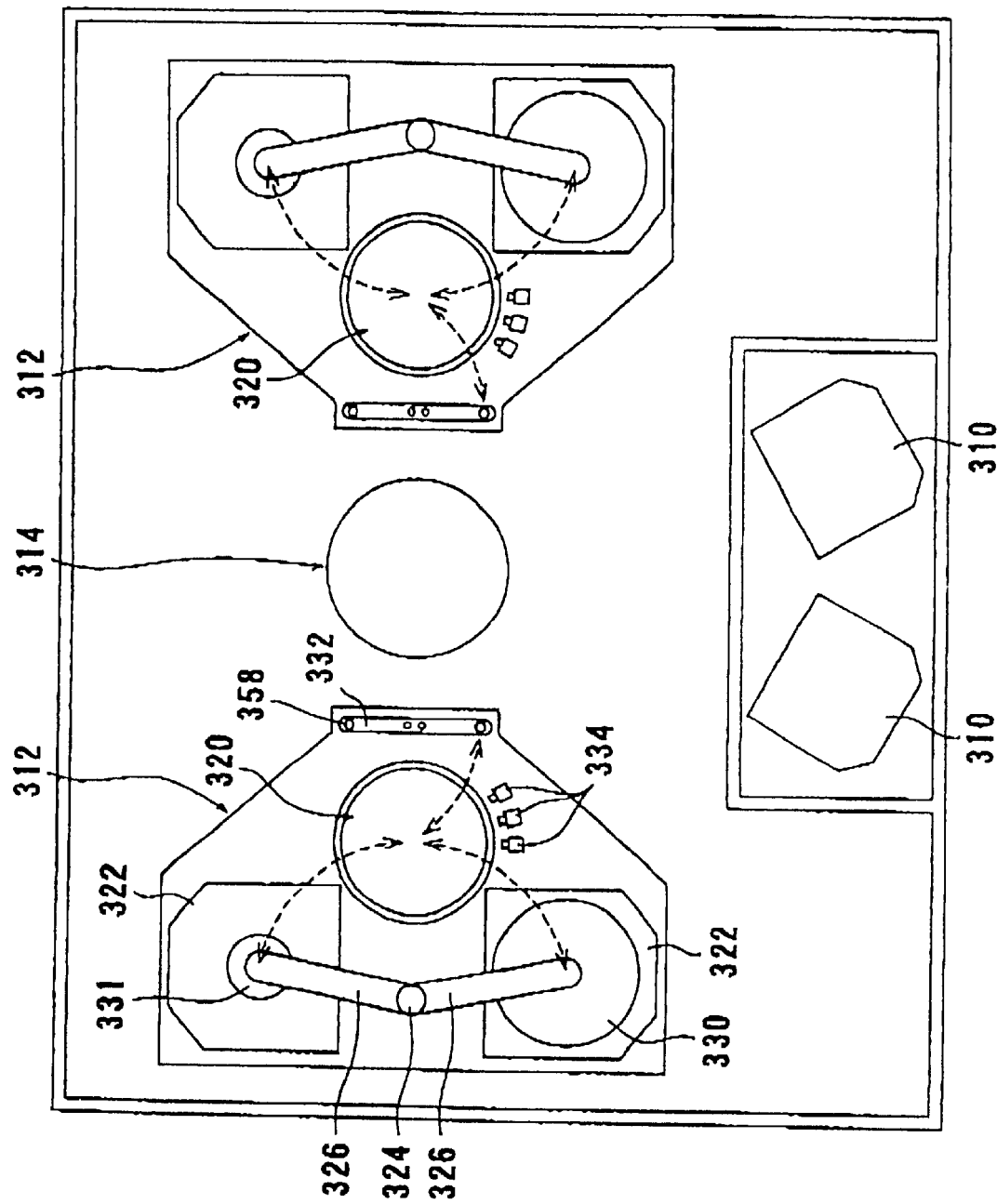
FIG. 41 is a plan view of a substrate processing apparatus according to yet another embodiment of the present invention.

Multi-Stage Plating Apparatus for Electroless and Electrolytic Plating Processes FIG. 41 shows a plan view of a dual-stage substrate plating apparatus (substrate processing apparatus) according to yet another embodiment of the present invention. Those parts of the dual-stage substrate plating apparatus shown in FIG. 41 which are identical to those of the dual-stage substrate plating apparatus shown in FIGS. 39 and 40 are denoted by identical reference characters and will not be described in detail below. The dual-stage substrate plating apparatus shown in FIG. 41 is different from the dual-stage substrate plating apparatus shown in FIGS. 39 and 40 in that one of the anode heads 330 of the plating units 312 is replaced with a plating liquid supply head (substrate treating head or substrate treating liquid (chemically treating liquid) supply mechanism) 331, and a back heater 337 is disposed in the substrate holder 336.

Figure 42:
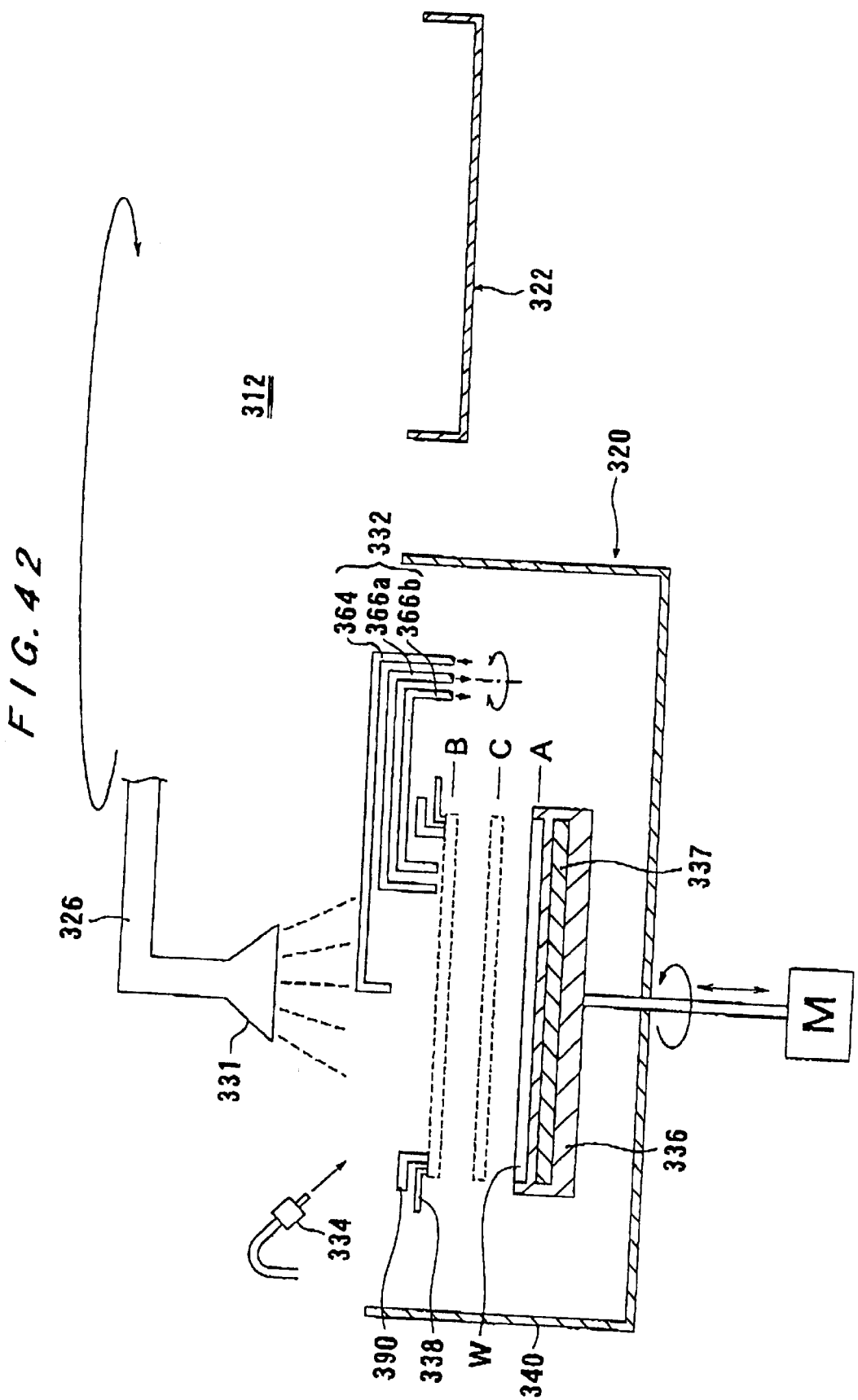
FIG. 42 is a schematic cross-sectional view of a plating unit.

FIG. 42 shows a cross-sectional view of a portion of each of the plating units 312. In FIG. 42, the plating liquid supply head 331 is shown as being positioned above the substrate holder 336. As shown in FIG. 42, the back heater 337 is disposed in the substrate holder 336 for heating the substrate W held therein on its reverse side, and for keeping the substrate W heated. The plating liquid supply head 331 serves as a shower head for ejecting a shower of electroless plating liquid (chemically treating liquid) for an electroless plating process, and is mounted on the tip end of a swing arm 326. As with the anode head 330, the plating liquid supply head 331 can turn and move between the substrate treating device 320 and the retracting portion 322, and can move vertically.

A specific example of the operation of the multi-stage plating apparatus shown in FIGS. 41 and 42 will be described below. A plating liquid for use in the first-stage plating process (electroless plating process) contains 5 g/L of $CuSO_4.5H_2O$ for supplying divalent copper ions, 14 g/L of EDTA.4H as a complexing agent, 18 g/L of glyoxylic acid as a reducing agent of aldehyde acid, and TMAH as organic alkali for adjusting the pH to 12.5. The plating liquid also contains a mixture of polyoxyethylene alkylether phosphoric acid and polyoxyethylene alkylether in order to reduce the plating rate. A plating liquid for use in the second-stage plating process is the same as the copper sulfate plating liquid used in the preceding embodiment. The substrate W which is used has a seed layer formed by sputtering in the same manner as in the preceding embodiment.

First, the substrate W to be plated is removed from one of the loading/unloading units 310 shown in FIG. 41 by the transfer robot 314, and placed, with its surface to be plated (treatment surface) oriented upwardly, on the substrate holder 336 of one of the substrate treating portions 320. At this time, the substrate holder 336 is in the substrate transfer position A.

Then, the substrate holder 336 is elevated to the pretreatinq/cleaning position C. The precoating/retrieving arm 332 is lowered toward the upper surface of the substrate W, and the precoating nozzle 364 discharges a precoating liquid, e.g., an aqueous solution of $H_2SO4$, toward the surface to be plated of the substrate W, so that the precoating liquid spreads all over the surface to be plated of the substrate W. Then, the precoating/retrieving arm 332 is returned to the retracted position, and the fixed nozzle 334 supplies pure water to clean the substrate W, after which the rotational speed of the substrate holder 336 is increased to spin-dry the substrate W.

The rotation of the substrate holder 336 is then stopped, and the substrate holder 336 is lifted to the plating position B. The tip ends of the cathodes 338 and the sealing member 390 are brought into abutment against the peripheral edge of the substrate W, sealing the peripheral edge of the substrate W in a water-tight manner. No electric current is passed by the cathode 10 338 because the first-stage plating process is an electroless plating process.

The plating liquid supply head 331 which has been in the retracting portion 322 is turned and moved to a position above the substrate W, and then ejects a shower of the electroless plating liquid uniformly over the surface to be plated of the substrate W. Since the surface to be plated of the substrate W is surrounded by the sealing member 390, the supplied plating liquid is all retained on the surface to be plated of the substrate W. The plating liquid on the substrate W may be in such a small amount as to form a film having a thickness of 1 mm (about 30 mL) on the surface of the substrate W. The supplied plating liquid has already been heated to a temperature of 60° C., for example, suitable for the reaction. The supplied plating liquid is also kept heated on the substrate W by heating the substrate W with the back heater 337. Since the plated status carried out by the electroless plating process varies depending on the temperature, the substrate W can well be plated by keeping itself at a suitable temperature with the back heater 337, as in this embodiment. The substrate W can be kept heated by the back heater 337 because the amount of the plating liquid held on the substrate W is small.

In order to wet the surface of the substrate W uniformly with plating liquid, the substrate W is instantaneously rotated by the motor M immediately after it is supplied with the plating liquid. Thereafter, the substrate W is kept at rest so as to be plated uniformly on its entire surface. Specifically, the substrate W is rotated at a speed equal to or less than 100 rpm for 1 second to wet its surface uniformly with the plating liquid, and then stopped and plated for 1 minute in the electroless plating process.

According to the above process, an auxiliary seed layer is formed on the seed layer which has been formed by sputtering or the like, to reinforce the seed layer. The seed layer including the auxiliary seed layer can thus be formed well.

After the above plating process, the plating liquid supply head 331 is returned to the retracting portion 322, and then the precoating/retrieving arm 332 is moved from the retracted position to a position above the substrate W and then lowered, after which one of the nozzles 336a retrieves the remaining plating liquid on the substrate W. After the retrieval of the plating liquid, the precoating/retrieving arm 332 is returned to the retracted position. The substrate holder 336 is lowered from the plating position B to the pretreating/cleaning position C, the substrate W starts rotating, and the fixed nozzle 334 supplies pure water to cool the plated surface and simultaneously dilutes and cleans the plating liquid, whereupon the electroless plating process is put to an end. At the same time, the seal member 390 and the cathode 338 are cleaned with the pure water. Then, the supply of pure water from the fixed nozzle 334 is stopped, and the rotational speed of the substrate holder 336 is increased to spin-dry the substrate W.

Then, the anode head 330 which has been in the retracting portion 322 is turned and moved to a position above the substrate W, after which it plates the plated surface of the substrate W in the same manner as with the first anode head 330-1 as described above in the preceding embodiment. At this time, the above copper sulfate plating liquid is employed.

Since the auxiliary seed layer has been formed by the first-stage electroless plating process, the overall seed layer has uniformly been formed for the second-stage electrolytic plating process. In the second-stage electrolytic plating process, therefore, fine interconnections are reliably embedded in interconnection trenches in the substrate W.

In the present embodiment, as described above, the plating liquid supply head 331 and the anode head 330 combined with the single substrate treating device 320 allow a substrate W to be plated according to a series of plating processes having different characteristics. This arrangement makes it possible to embed fine interconnections which have heretofore been difficult to embed according to the conventional single-stage plating process.

In the above specific example of the operation of the multi-stage plating apparatus, after the substrate is plated and cleaned according to the first-stage plating process, the substrate may not be dried, and then may be plated according to the second-stage plating process. Inasmuch as the multi-stage plating apparatus processes the substrate W with its surface to be plated (treatment surface) oriented upwardly at all times, the multi-stage plating apparatus does not need to have a substrate inverting device, and hence can be reduced in size.

Figure 43:
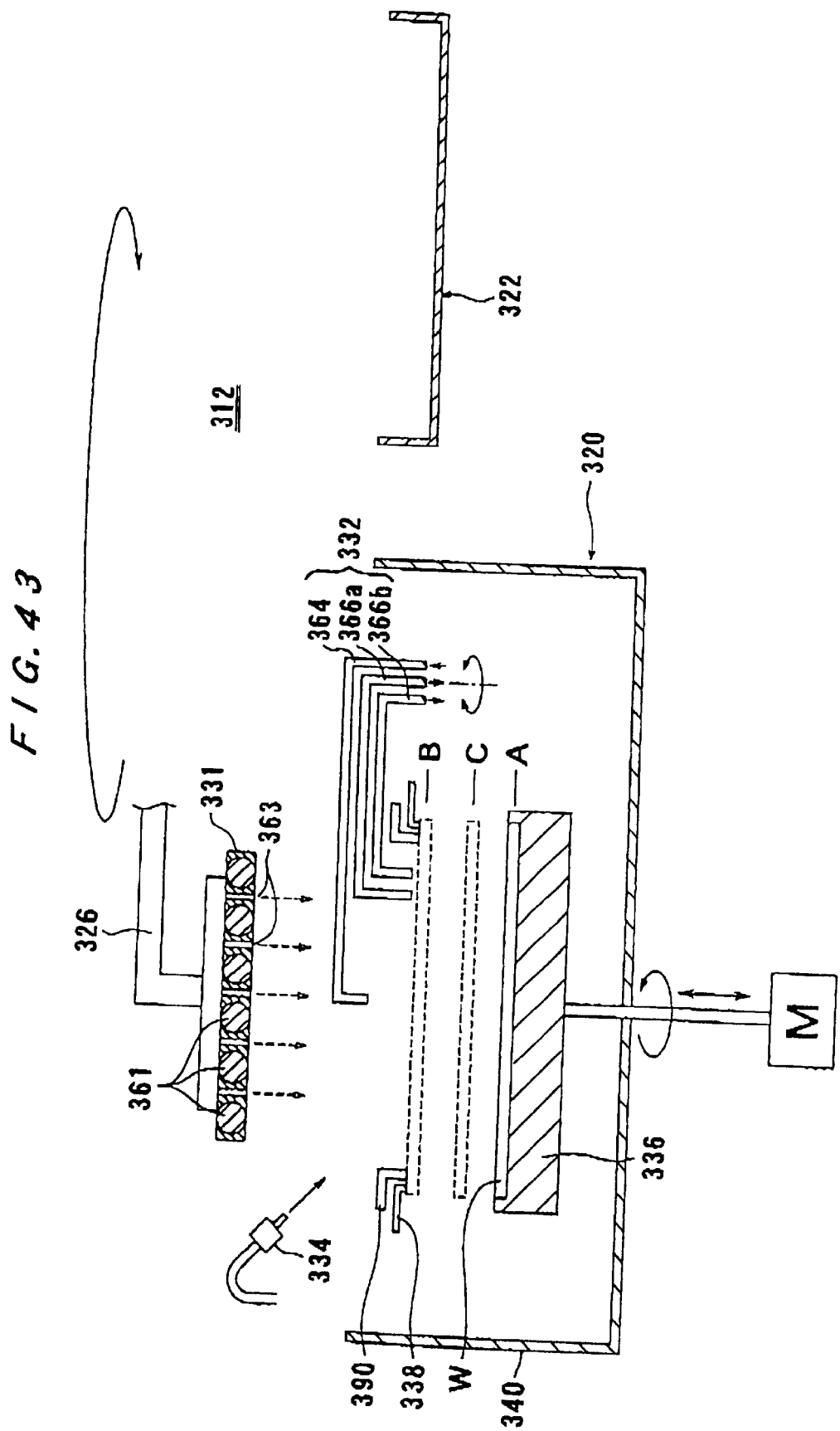
FIG. 43 is a schematic cross-sectional view of another plating unit.

FIG. 43 shows a cross-sectional view of a plating unit 312 having another plating liquid supply head. The plating unit 312 includes a lamp heater 361 disposed in a plating liquid supply head (substrate treating head or substrate treating liquid supply mechanism) 331' disposed above the substrate holder 336, instead of the back heater 337 disposed in the substrate holder 336. For example, the lamp heater 361 comprises a plurality of ring-shaped lamp heaters of different radius which are disposed concentrically in the plating liquid supply head 331', which has a plurality of ring-shaped nozzles 363 positioned in respective gaps between the lamp heaters 361. Alternatively, the lamp heater 361 may comprise a single spiral lamp heater, or any of various other lamp heaters having different structures and layouts.

The plating liquid can be supplied as a shower from the nozzles 363 substantially uniformly onto the surface to be plated of the substrate W. The lamp heater 361 can easily heat and keep the substrate W quickly and uniformly heated.

Figure 44:
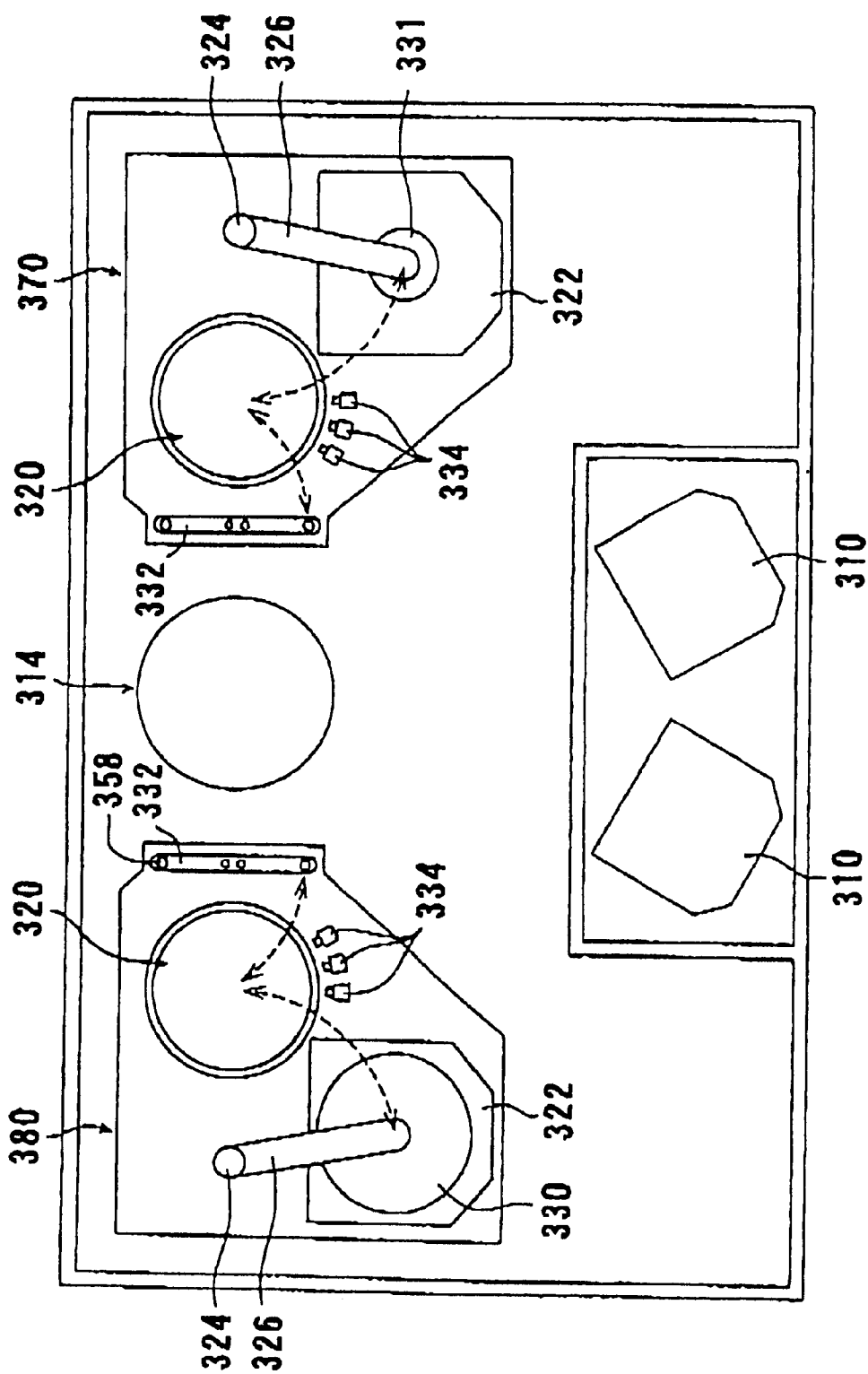
FIG. 44 is a plan view of a substrate processing apparatus according to yet still another embodiment of the present invention.

Multi-Stage Plating Apparatus for Electroless and Electrolytic Plating Processes FIG. 44 shows a plan view of a dual-stage substrate plating apparatus (substrate processing apparatus) according to yet still another embodiment of the present invention. As shown in FIG. 44, the dual-stage substrate plating apparatus has a facility which houses therein two loading/unloading units 310, 310 a transfer robot 314, an electroless plating unit (substrate processing apparatus) 370, and an electrolytic plating unit (substrate processing apparatus) 380. The loading/unloading units 310, 310 and the transfer robot 314 are identical to those in the above embodiments.

The electroless plating unit 370 is different from the plating unit 312 shown in FIG. 41 in that it dispenses with the anode head 330 and its retracting portion 322 for performing a single-stage electroless plating process. The electrolytic plating unit 380 is different from the plating unit 312 shown in FIG. 41 in that it dispenses with the plating liquid supply head 331 and its retracting portion 322 for performing a single-stage electrolytic plating process. In the electrolytic plating unit 380, the back heater 337 in the substrate holder 336 shown in FIG. 42 is not required. In the electroless plating apparatus 370, the plating liquid supply head 331 may not necessarily be moved (i.e., rotated), but may be positioned at all times above the substrate holder 336. In such a modification, the retracting portion 322 is not needed.

A specific example of operation of the multi-stage plating apparatus shown in FIG. 44 will be described below. A plating liquid for use in the first-stage plating process (electroless plating process) is the same as the plating liquid used in the above electroless plating process. A plating liquid for use in the second-stage plating process (electrolytic plating process) is the same as the copper sulfate plating liquid used in the above electrolytic plating process. The substrate W which is used has a seed layer formed by sputtering in the same manner as with the preceding embodiment.

First, the substrate W to be plated is removed from one of the loading/unloading units 310 shown in FIG. 44 by the transfer robot 314, and delivered, with its surface to be plated oriented upwardly, into the electroless plating unit 370. In the electroless plating unit 370, the surface to be plated of the substrate w is plated according to the same electroless plating process as the above electroless plating process, cleaned, and dried. According to this process, an auxiliary seed layer is formed on the seed layer which has been formed by sputtering or the like, to reinforce the seed layer. The seed layer including the auxiliary seed layer can thus be formed well.

Then, the transfer robot 314 removes the plated substrate W from the electroless plating apparatus 370 with the plated surface facing upwardly, and then inserts the substrate W into the electrolytic plating unit 380. In the electrolytic plating apparatus 380, the surface to be plated of the substrate W is plated according to the same electrolytic plating process as the above electroless plating process, cleaned, and dried. According to this process, since the auxiliary seed layer has been formed by the first-stage electroless plating process, the overall seed layer has uniformly been formed for the second-stage electrolytic plating process. In the second-stage electrolytic plating process, therefore, fine interconnections are reliably embedded in interconnection trenches in the substrate W.

In the present embodiment, the electroless plating unit 370 for electrolessly plating and performing a supplementary process (pretreating, cleaning, and drying) and the electrolytic plating unit 38 for electrolytically plating and performing a supplementary process are clustered into a single multi-stage plating apparatus. Thus, the plating apparatus for performing a series of plating processes having different characteristics can be constructed in a compact size.

In the above specific example of operation of the multi-stage plating apparatus, the substrate W may not be dried in a final step in the first-stage electroless plating unit 370, but may be delivered, in a wet state, into the electrolytic plating unit 380 for electrolytically plating. Inasmuch as the multi-stage plating apparatus processes the substrate W with its surface to be plated oriented upwardly at all times, the multi-stage plating apparatus does not need to have a substrate inverting device, and hence can be reduced in size.

The dual-stage plating apparatus described above offers the following advantages:

(1) With the plural substrate treating heads combined with the single substrate treating portion, it is possible to perform substrate treating processes having different characteristics in series on the single substrate treating unit. The substrate plating apparatus or substrate treating apparatus may be compact in size, and a clean room where the plating apparatus is installed may also be compact in size and hence reduced in cost. With the substrate treating apparatus being compact in size, it can be clustered in combination with a CUT (chemical mechanical polishing) apparatus.

(2) Since different substrate treating processes can successively be performed in one apparatus, a transition from one substrate treating process to another can smoothly be performed in a short period of time. It is not necessary to use a substrate cassette to transfer substrates between the different substrate treating processes, and the different substrate treating processes can stably be carried out without the occurrence of a substrate treatment failure.

(3) Even if a plurality of substrate treating apparatuses for treating substrates with substrate treating heads are installed in one apparatus, the apparatus may be compact in size, and hence a clean room where the apparatus is installed may also be compact in size and hence reduced in cost. The compact apparatus can be clustered in combination with a CMP apparatus.

Although certain preferred embodiments of the present invention have been shown and described in detail, it should be understood that various changes and modifications may be made therein without departing from the scope of the appended claims. Any configurations, materials, and processes which are not specifically described and shown fall within the scope of the appended claims insofar as they provide functions and advantages of the present invention. For example, the principles of the present invention are also applicable to other plating processes such as bump plating and any of various substrate treating processes other than plating processes.

What is claimed is:

1. An apparatus for processing a substrate, comprising:
a substrate holder for holding the substrate such that a treatment surface of the substrate faces upward;
a first treatment head for performing a first-stage treating process on the treatment surface of the substrate while the substrate is held by said substrate holder;
a second treatment head for performing a second-stage treating process on the treatment surface of the substrate while the substrate is held by said substrate holder;
a vertical shaft;
a first swing arm connecting said first treatment head to said vertical shaft so that said first treatment head is operable to swing about said vertical shaft; and
a second swing arm connecting said second treatment head to said vertical shaft so that said second treatment head is operable to swing about said vertical shaft.

2. The apparatus of claim 1, further comprising:
a first retracting portion, wherein said first treatment head is operable to swing about said vertical shaft between said first retracting portion and said substrate holder; and
a second retracting portion, wherein said second treatment head is operable to swing about said vertical shaft between said second retracting portion and said substrate holder.

3. An apparatus for processing a substrate, comprising:
a substrate holder for holding the substrate such that a treatment surface of the substrate faces upward;
a first treatment head for performing a first-stage treating process on the treatment surface of the substrate while the substrate is held by said substrate holder;
a second treatment head for performing a second-stage treating process on the treatment surface of the substrate while the substrate is held by said substrate holder;
a precoating/retrieving arm operable to precoat the treatment surface of the substrate held by said substrate holder with a precoating liquid, and operable to remove excess liquid from the treatment surface of the substrate after said first treatment head performs the first-stage treating process and after said second treatment head performs the second-stage treating process.

4. An apparatus for processing a substrate, comprising:
a facility;
an electroless plating unit arranged in said facility, said electroless plating unit including:
a first substrate holder for holding the substrate such that a treatment surface of the substrate faces upward;
a plating liquid supply head for supplying a plating liquid onto the treatment surface of the substrate while the substrate is held by said first substrate holder;
a first vertical shaft; and
a first swing arm connecting said plating liquid supply head to said first vertical shaft so that said plating liquid supply head is operable to swing about said first vertical shaft; and
an electrolytic plating unit arranged in said facility said electrolytic plating unit including:
a second substrate holder for holding the substrate such that the treatment surface of the substrate faces upward; and
an anode head for holding an anode above the treatment surface of the substrate held by said second substrate holder.

5. The apparatus of claim 4, wherein said electroless plating unit further includes:
a first retracting portion, wherein said plating liquid supply head is operable to swing about said first vertical shaft between said first retracting portion and said first substrate holder.

6. An apparatus for processing a substrate, comprising:
a facility;
an electroless plating unit arranged in said facility, said electroless plating unit including:
a first substrate holder for holding the substrate such that a treatment surface of the substrate faces upward; and
a plating liquid supply head for supplying a plating liquid onto the treatment surface of the substrate while the substrate is held by said first substrate holder; and
an electrolytic plating unit arranged in said facility, said electrolytic plating unit including:
a second substrate holder for holding the substrate such that the treatment surface of the substrate faces upward;
an anode head for holding an anode above the treatment surface of the substrate held by said second substrate holder;
a second vertical shaft; and
a second swing arm connecting said anode head to said second vertical shaft so that said anode head is operable to swing about said second vertical shaft.

7. The apparatus of claim 6, wherein said electrolytic plating unit further includes:
  a second retracting portion, wherein said anode head is operable to swing about said second vertical shaft between said second retracting portion and said second substrate holder.

8. An apparatus for processing a substrate, comprising:
  a substrate holder for holding the substrate such that a treatment surface of the substrate faces upward;
  a first treatment head for performing a first-stage treating process on the treatment surface of the substrate while the substrate is held by said substrate holder;
  a second treatment head for performing a second-stage treating process on the treatment surface of the substrate while the substrate is held by said substrate holder;
  a first arm connected to said first treatment head so that said first treatment head is operable to move horizontally; and
  a second arm connected to said second treatment head so that said second treatment head is operable to move horizontally;
  wherein said first treatment head and said second treatment head are designed and arranged such that when one of said first treatment head and said second treatment head is above said substrate holder for performing a corresponding one of the first-stage treating process and the second-stage treating process, the other of said first treatment head and said second treatment head is not above said substrate holder.

9. An apparatus for processing a substrate, comprising:
  an electroless plating unit including:
    a first substrate holder for holding the substrate such that a treatment surface of the substrate faces upward; and
    a plating liquid supply head for supplying a plating liquid onto the treatment surface of the substrate while the substrate is held by said first substrate holder;
  an electrolytic plating unit including:
    a second substrate holder for holding the substrate such that the treatment surface of the substrate faces upward; and
    an anode head for holding an anode above the treatment surface of the substrate held by said second substrate holder; and
  a first arm connected to said plating liquid supply head so that said plating liquid supply head is operable to move horizontally.

10. An apparatus for processing a treatment surface of a substrate, comprising:
  a substrate holder for holding and rotating the substrate such that the treatment surface of the substrate faces upward;
  a first treatment head having a first-treatment-head electrode for performing a first process on the treatment surface of the substrate held by said substrate holder;
  a second treatment head for performing a second process on the treatment surface of the substrate held by said substrate holder;
  a first arm connected to said first treatment head so that said first treatment head is operable to move horizontally between said substrate holder and a first retracting portion;
  a second arm connected to said second treatment head so that said second treatment head is operable to move horizontally between said substrate holder and a second retracting portion;
  a treatment-surface-contacting electrode arranged to electrically contact the treatment surface of the substrate held by said substrate holder;
  a first supply pipe for supplying a plating liquid from said first treatment head to the treatment surface of the substrate held by said substrate holder so that said first-treatment-head electrode and said treatment-surface-contacting electrode are electrically connected to each other; and
  a second supply pipe for supplying a second liquid from said second treatment head to the treatment surface of the substrate held by said substrate holder;
  wherein said first treatment head and said second treatment head are designed and arranged such that when one of said first treatment head and said second treatment head is above said substrate holder, the other of said first treatment head and said second treatment head is at a corresponding one of said first retracting portion and said second retracting portion.

11. The apparatus of claim 10, wherein said second treatment head has a second-treatment-head electrode, said second supply pipe being arranged to supply the second liquid from said second treatment head to the treatment surface of the substrate held by said substrate holder so that said second-treatment-head electrode and said treatment-surface-contacting electrode are electrically connected to each other.

12. An apparatus for processing a treatment surface of a substrate, comprising:
  a first substrate holder for holding and rotating the substrate such that the treatment surface of the substrate faces upward;
  a first treatment head having a first electrode for performing a first process on the treatment surface of the substrate held by said first substrate holder;
  a second substrate holder for holding and rotating the substrate such that the treatment surface of the substrate faces upward;
  a second treatment head having a second electrode for performing a second process on the treatment surface of the substrate held by said second substrate holder;
  a first arm connected to said first treatment head so that said first treatment head is operable to move horizontally between said first substrate holder and a first retracting portion;
  a second arm connected to said second treatment head so that said second treatment head is operable to move horizontally between said second substrate holder and a second retracting portion;
  a third electrode arranged to electrically contact the treatment surface of the surface of the substrate held by said, first substrate holder;
  a first supply pipe for supplying a plating liquid from said first treatment head to the treatment surface of the substrate held by said first substrate holder so that said first electrode and said third electrode are electrically connected to each other;
  a second supply pipe for supplying a second liquid from said second treatment head to the treatment surface of the substrate held by said second substrate holder.

* * * * *

UNITED STATES PATENT AND TRADEMARK OFFICE
CERTIFICATE OF CORRECTION

PATENT NO. : 6,689,257 B2
DATED : February 10, 2004
INVENTOR(S) : Koji Mishima et al.

It is certified that error appears in the above-identified patent and that said Letters Patent is hereby corrected as shown below:

<u>Column 38,</u>
Line 57, replace "said, first substrate holder;" with -- said first substrate holder; --.

Signed and Sealed this

Fourth Day of May, 2004

JON W. DUDAS
*Acting Director of the United States Patent and Trademark Office*